United States Patent
Hata

(10) Patent No.: US 8,686,472 B2
(45) Date of Patent: Apr. 1, 2014

(54) SEMICONDUCTOR SUBSTRATE, ELECTRONIC DEVICE AND METHOD FOR MANUFACTURING SEMICONDUCTOR SUBSTRATE

(75) Inventor: Masahiko Hata, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 427 days.

(21) Appl. No.: 13/122,124

(22) PCT Filed: Oct. 1, 2009

(86) PCT No.: PCT/JP2009/005068
§ 371 (c)(1),
(2), (4) Date: Mar. 31, 2011

(87) PCT Pub. No.: WO2010/038461
PCT Pub. Date: Apr. 8, 2010

(65) Prior Publication Data
US 2011/0266595 A1  Nov. 3, 2011

(30) Foreign Application Priority Data

Oct. 2, 2008 (JP) ................................ 2008-257856
Dec. 26, 2008 (JP) ................................ 2008-334830
Feb. 27, 2009 (JP) ................................ 2009-046587

(51) Int. Cl.
*H01L 21/02* (2006.01)

(52) U.S. Cl.
USPC ............... 257/190; 257/183; 257/E21.133; 257/E21.566; 438/481

(58) Field of Classification Search
USPC ............... 257/190, 183, E21.133, E21.566; 438/481
See application file for complete search history.

(56) References Cited

U.S. PATENT DOCUMENTS 4,614,564 A   9/1986  Sheldon et al.
5,158,907 A  10/1992  Fitzgerald, Jr.
(Continued)

FOREIGN PATENT DOCUMENTS

FR  2783254 A1  3/2000
JP  61-64119 A   4/1968
(Continued)

OTHER PUBLICATIONS

Office Action issued Oct. 24, 2012 in Chinese Patent Application No. 200980138963.5 to Sumitomo Chemical Co., Ltd., with English translation.

(Continued)

*Primary Examiner* — Tu-Tu Ho
(74) *Attorney, Agent, or Firm* — Sughrue Mion, PLLC

(57) ABSTRACT

There is provided a semiconductor wafer including a base wafer, an insulating layer, and a Si crystal layer in the stated order. The semiconductor wafer further includes an inhibition layer that is provided on the Si crystal layer and has an opening penetrating therethrough to reach the Si crystal layer. The inhibition layer inhibiting crystal growth of a compound semiconductor. Furthermore, a seed crystal is provided within the opening, and a compound semiconductor has a lattice match or a pseudo lattice match with the seed crystal. There is also provided an electronic device includes a substrate, an insulating layer that is provided on the substrate, a Si crystal layer that is provided on the insulating layer, an inhibition layer that is provided on the Si crystal layer and has an opening penetrating therethrough to reach the Si crystal layer, where the inhibition layer inhibits crystal growth of a compound semiconductor, a seed crystal that is provided within the opening, a compound semiconductor that has a lattice match or a pseudo lattice match with the seed crystal, and a semiconductor device that is formed using the compound semiconductor.

6 Claims, 72 Drawing Sheets

(56) References Cited

U.S. PATENT DOCUMENTS

| | | |
|---|---|---|
| 6,500,257 B1 | 12/2002 | Wang et al. |
| 6,537,370 B1 | 3/2003 | Hernandez et al. |
| 2004/0121507 A1 | 6/2004 | Bude et al. |
| 2004/0157412 A1 | 8/2004 | Seifert |
| 2006/0131606 A1 | 6/2006 | Cheng |
| 2008/0070355 A1 | 3/2008 | Lochtefeld et al. |
| 2008/0257409 A1* | 10/2008 | Li et al. .......... 136/259 |
| 2010/0078680 A1* | 4/2010 | Cheng et al. .......... 257/184 |

FOREIGN PATENT DOCUMENTS

| | | |
|---|---|---|
| JP | 59-171115 A | 9/1984 |
| JP | 60-66811 A | 4/1985 |
| JP | 60-66812 A | 4/1985 |
| JP | 60-210831 A | 10/1985 |
| JP | 61-94318 A | 5/1986 |
| JP | 61-135115 A | 6/1986 |
| JP | 61-141116 A | 6/1986 |
| JP | 61-188927 A | 8/1986 |
| JP | 61-189619 A | 8/1986 |
| JP | 61-189620 A | 8/1986 |
| JP | 61-189621 A | 8/1986 |
| JP | 62-158314 A | 7/1987 |
| JP | 63-248121 A | 10/1988 |
| JP | 1-77923 U | 5/1989 |
| JP | 1-227424 A | 9/1989 |
| JP | 4-84418 A | 3/1992 |
| JP | 4-162614 A | 6/1992 |
| JP | 4-88627 U | 7/1992 |
| JP | 4-233720 A | 8/1992 |
| JP | 7-176485 A | 7/1995 |
| JP | 8-316149 A | 11/1996 |
| JP | 8-316152 A | 11/1996 |
| JP | 2000-012467 A | 1/2000 |
| JP | 2000-21771 A | 1/2000 |
| JP | 2000-243946 A | 9/2000 |
| JP | 2002-525255 A | 8/2002 |
| JP | 2004-531889 A | 10/2004 |
| JP | 2006-513584 A | 4/2006 |
| JP | 2008-166766 A | 7/2008 |
| JP | 2009-177165 A | 8/2009 |
| JP | 2009-177167 A | 8/2009 |
| JP | 2009-177168 A | 8/2009 |
| JP | 2009-177169 A | 8/2009 |
| JP | 2009-177170 A | 8/2009 |
| JP | 2009-239268 A | 10/2009 |
| WO | 2006/125040 A2 | 11/2006 |

OTHER PUBLICATIONS

Hoon Jung Oh, et al., Integration of GaAs epitaxial layer to Si-based substrate using Ge condensation and low-temperature migration enhanced epitaxy techniques, Journal of Applied Physics, 2007, pp. 054306-1 to 054306-6, 102, American Institute of Physics, Singapore.

Hsin-Chiao Luan, et al., High-quality Ge epilayers on Si with low threading-dislocation densities, Applied Physics Letters, Nov. 8, 1999, pp. 2909-2911, vol. 75, No. 19, American Institute of Physics, Massachusetts.

W.E. McMahon, et al., An STM and LEED study of MOCVD-prepared P/Ge (100) to (111) surfaces, Surface Science, 2004, pp. 146-156, 157, CO.

T. Tezuka, et al., Dislocation-free formation of relaxed SiGe-on-insulator layers, Applied Physics Letters, May 13, 2002, pp. 3560-3562, vol. 80, No. 19, American Institute of Physics, Japan.

B-Y. Tsaur, et al., Low-dislocation-density GaAs epilayers grown on Ge-coated Si substrates by means of lateral epitaxial overgrowth, Appl. Phys. Lett., Aug. 15, 1982, pp. 347-349, 41(4), American Institute of Physics, Massachusetts.

Chinese Office Action dated Aug. 14, 2012, issued in Chinese Patent Application No. 200980138926.4.

Notice of Reasons for Rejection issued Dec. 3, 2013 in Japanese Patent Application No. 2009-229216 with English translation.

Notice of Reasons for Rejection issued Dec. 3, 2013 in Japanese Patent Application No. 2009-229217 with English translation.

Notice of Reasons for Rejection issued Dec. 17, 2013 in Japanese Patent Application No. 2009-229934 with English translation.

Notice of Reasons for Rejection issued Dec. 17, 2013 in Japanese Patent Application No. 2009-229959 with English translation.

\* cited by examiner

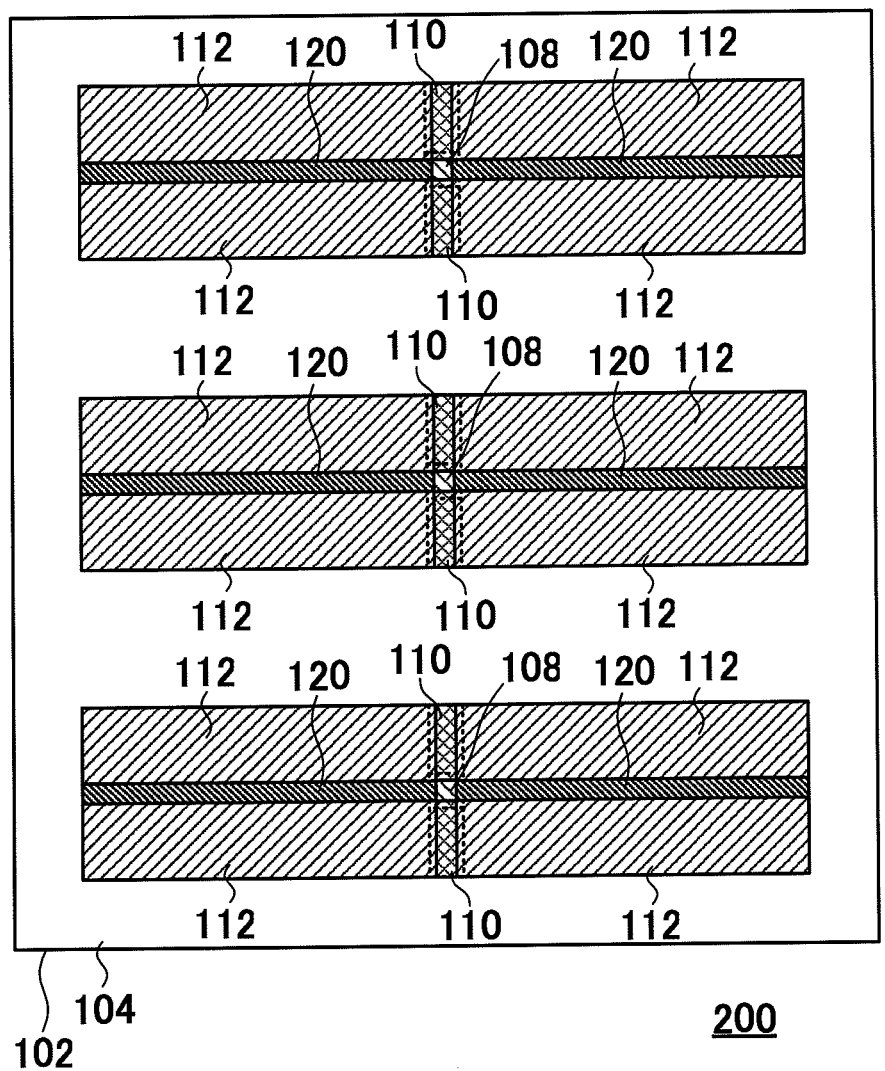
F I G . 13

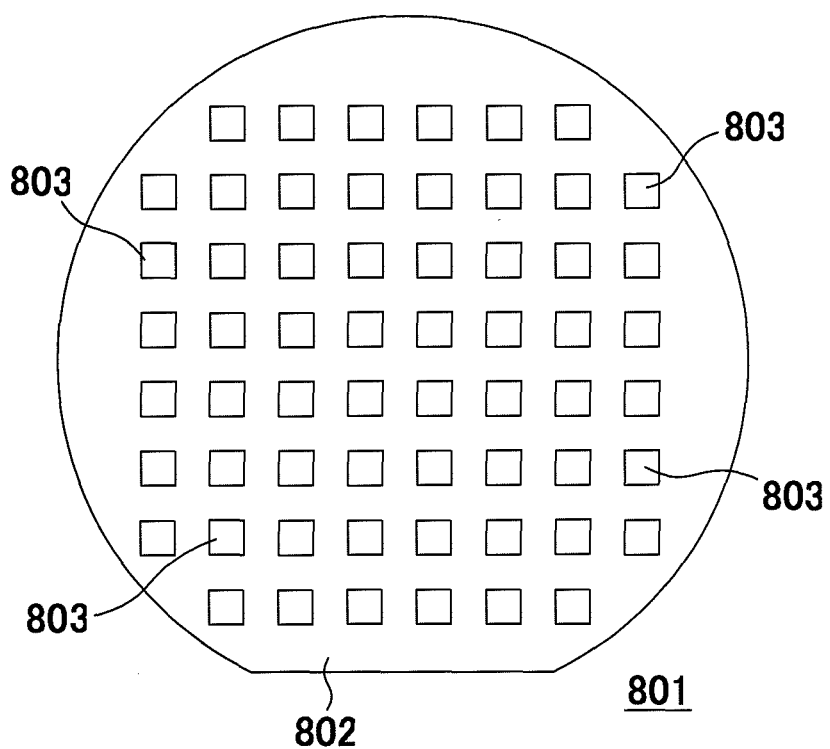
F I G . 19

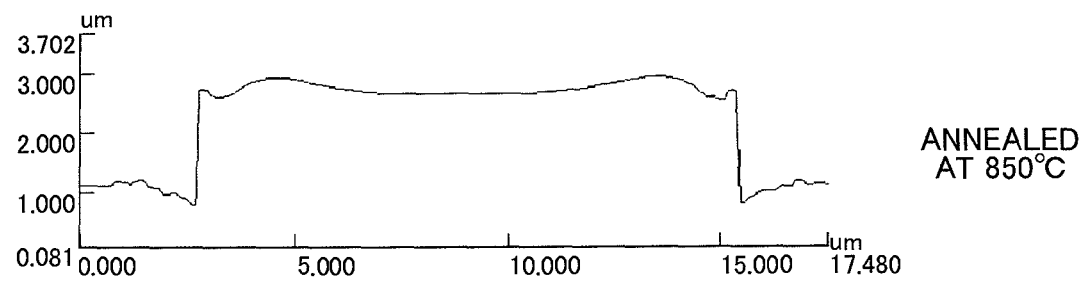
F I G . 26

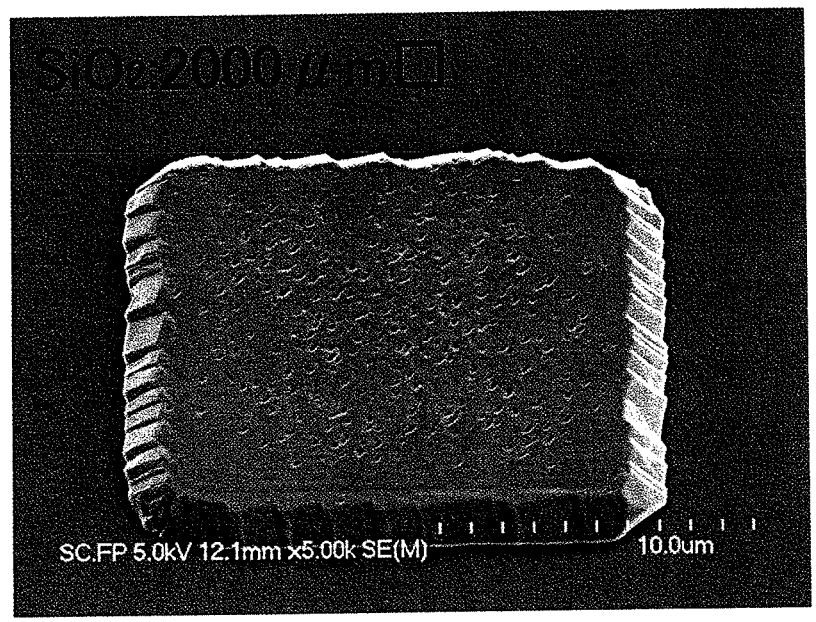
F I G . 32

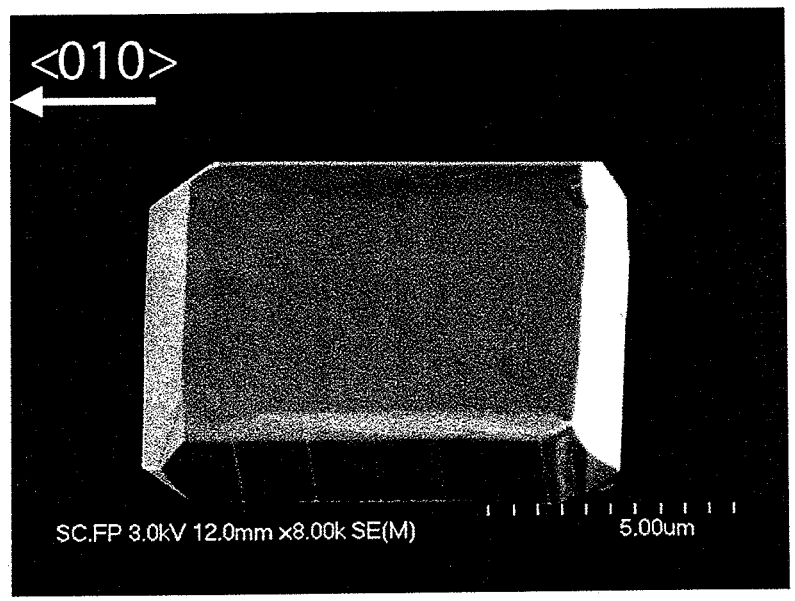
F I G . 42

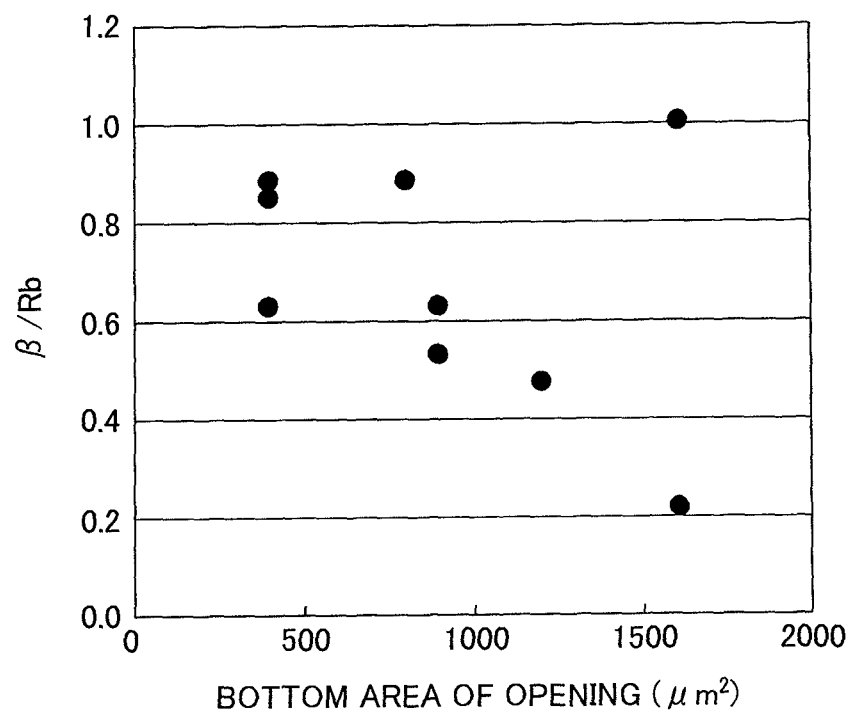
F I G . 47

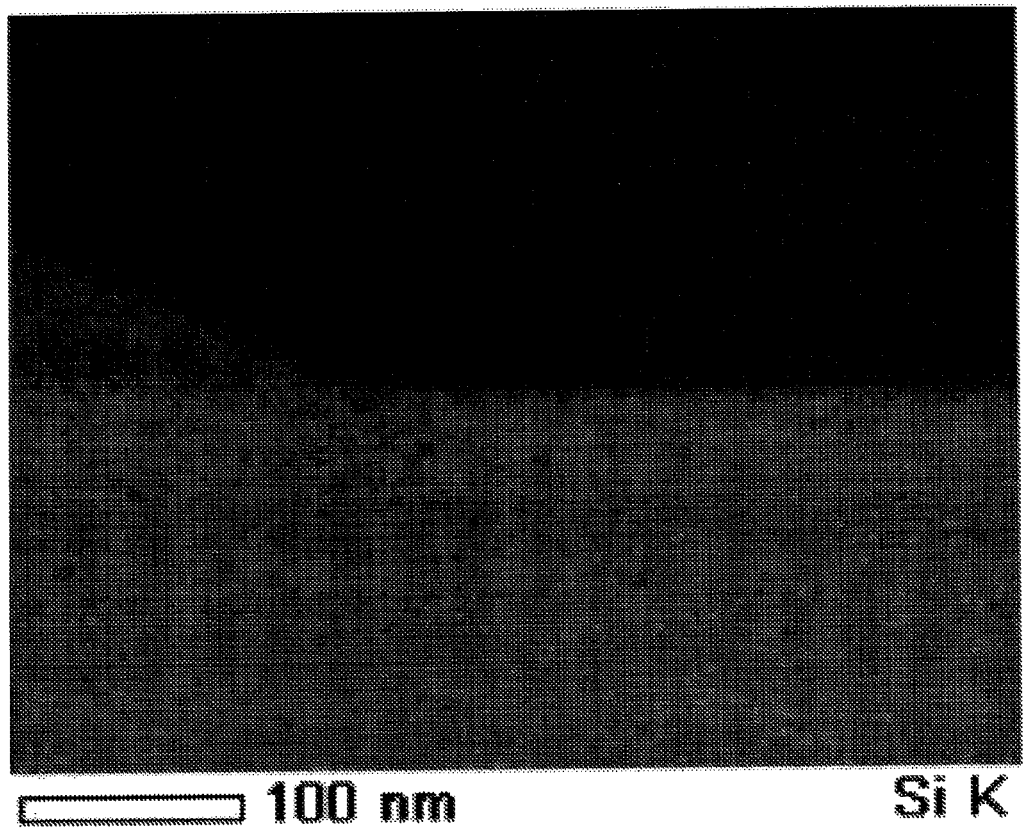
F I G . 54

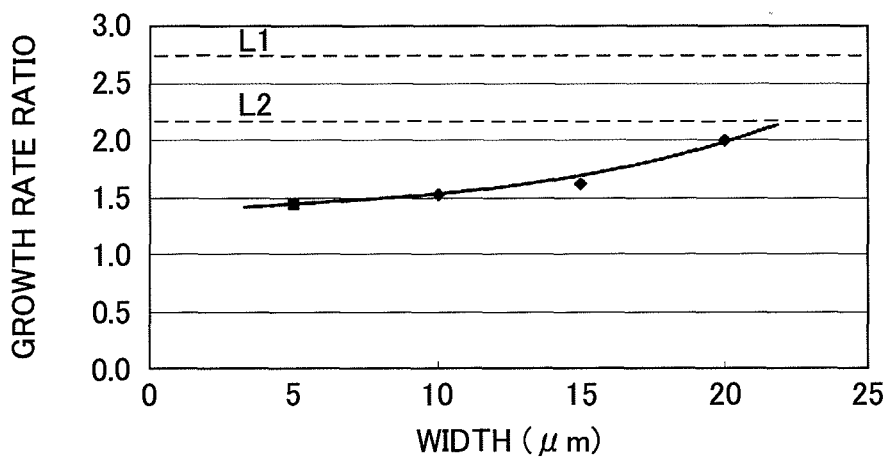
F I G. 62
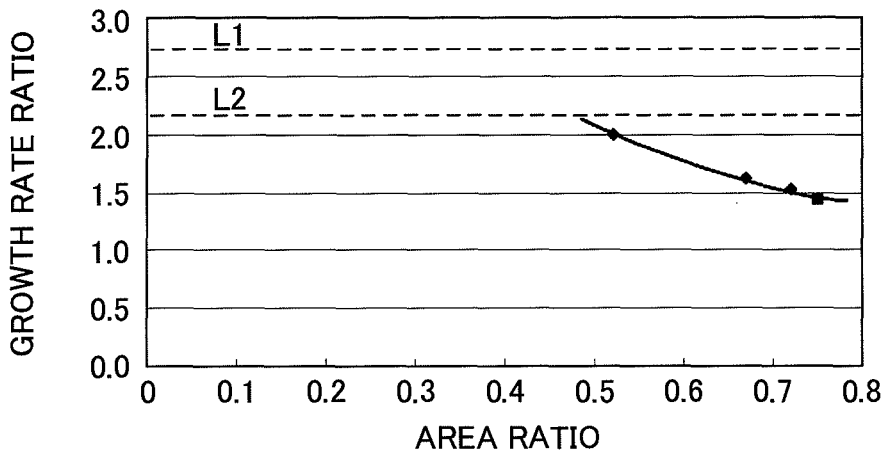
F I G. 63
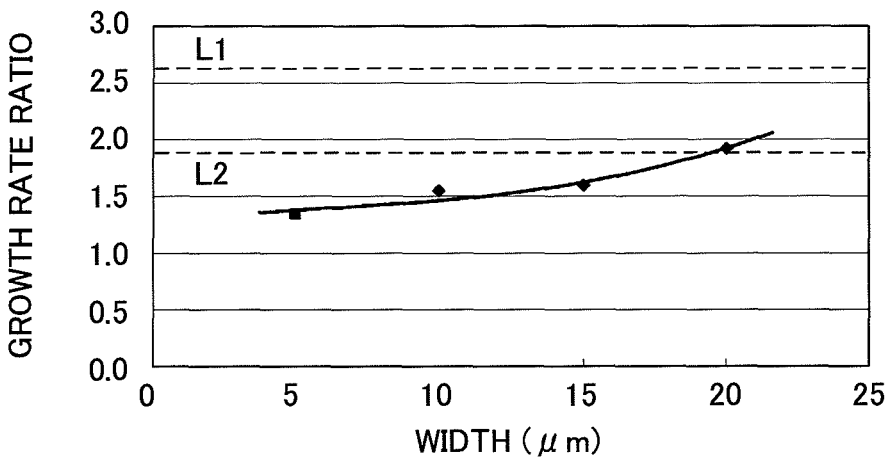
F I G. 64

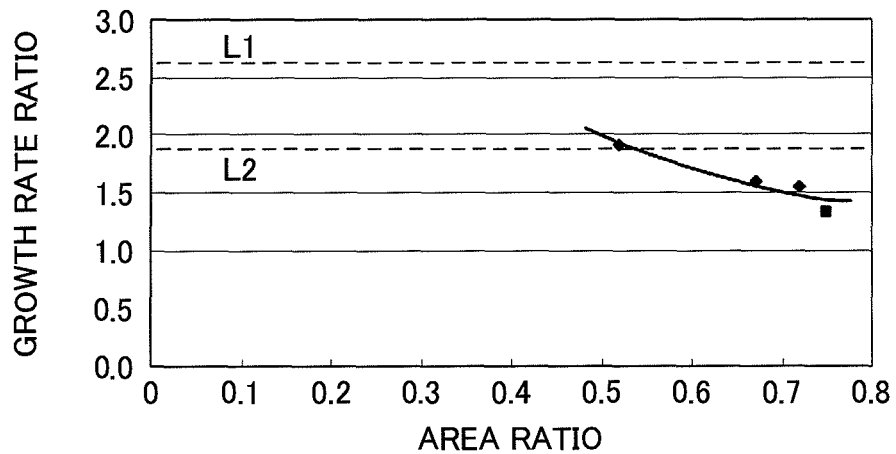
F I G. 65
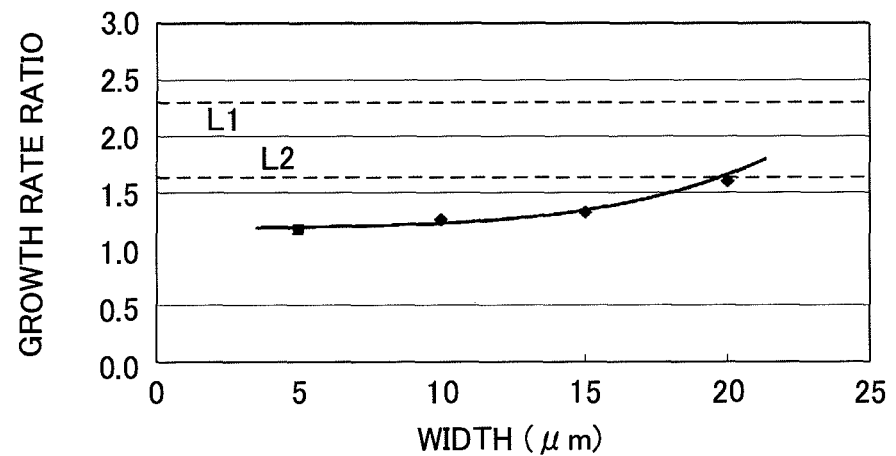
F I G. 66
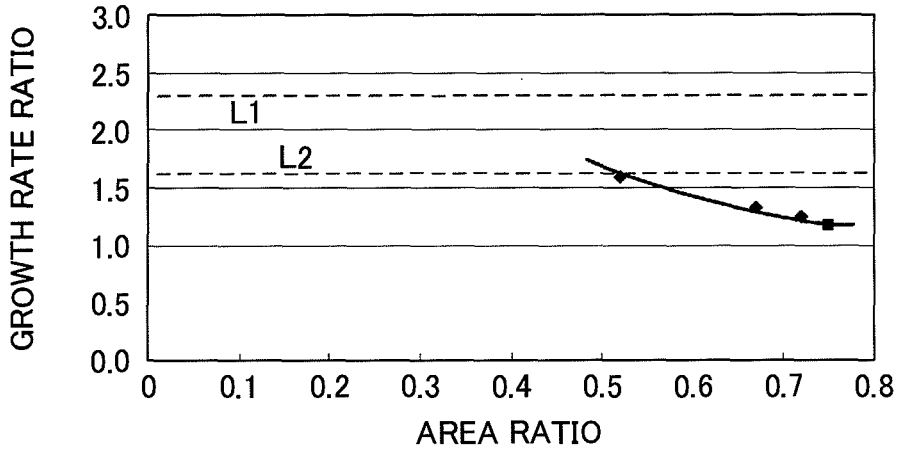
F I G. 67

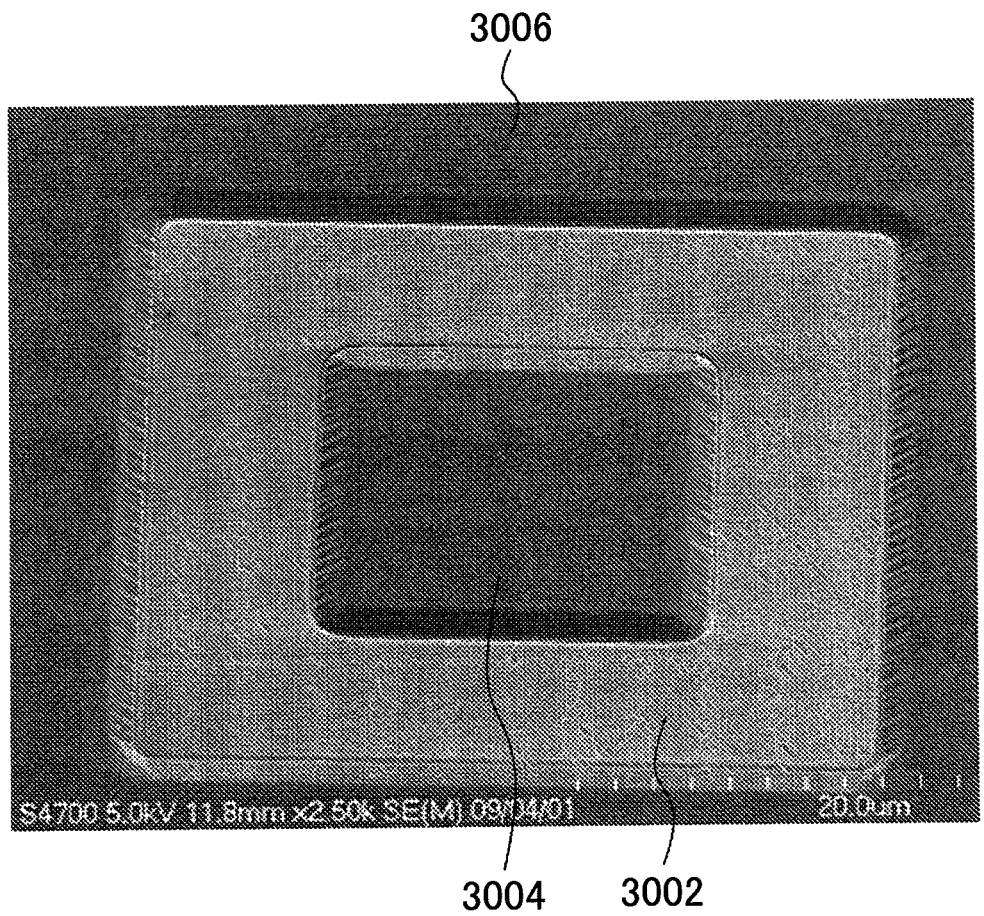
F I G . 68

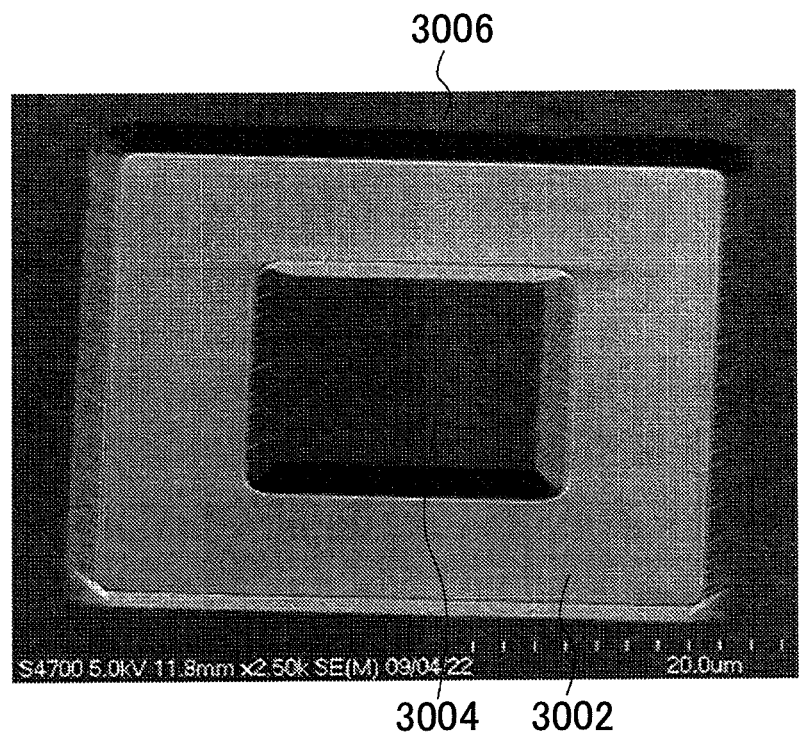
F I G. 70
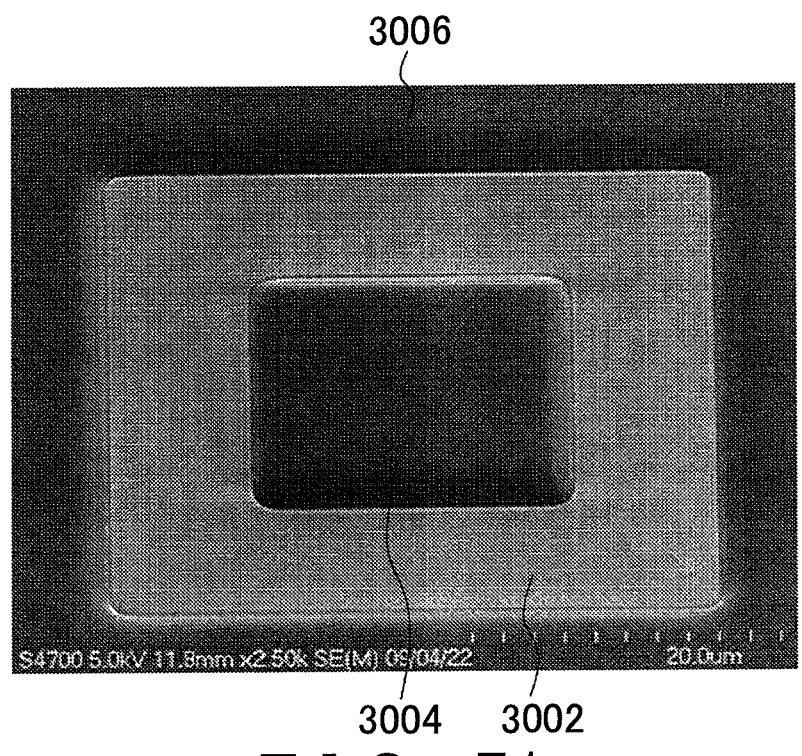
F I G. 71

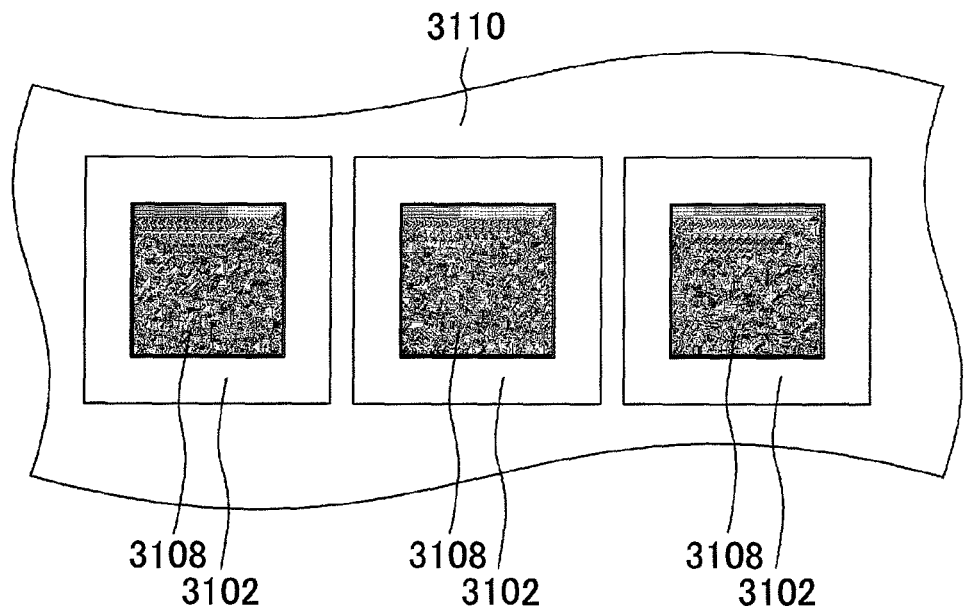
F I G. 77
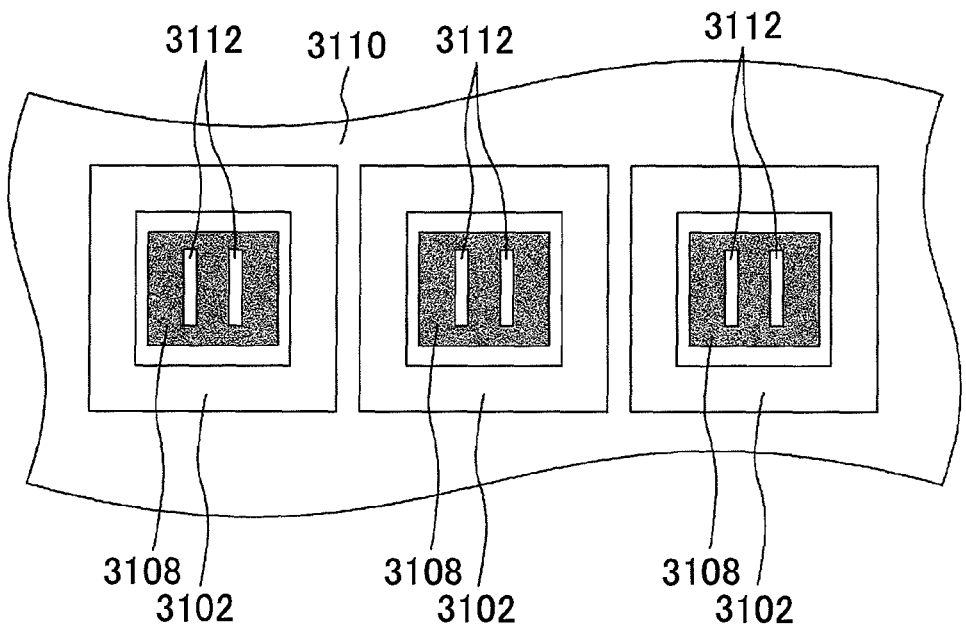
F I G. 78

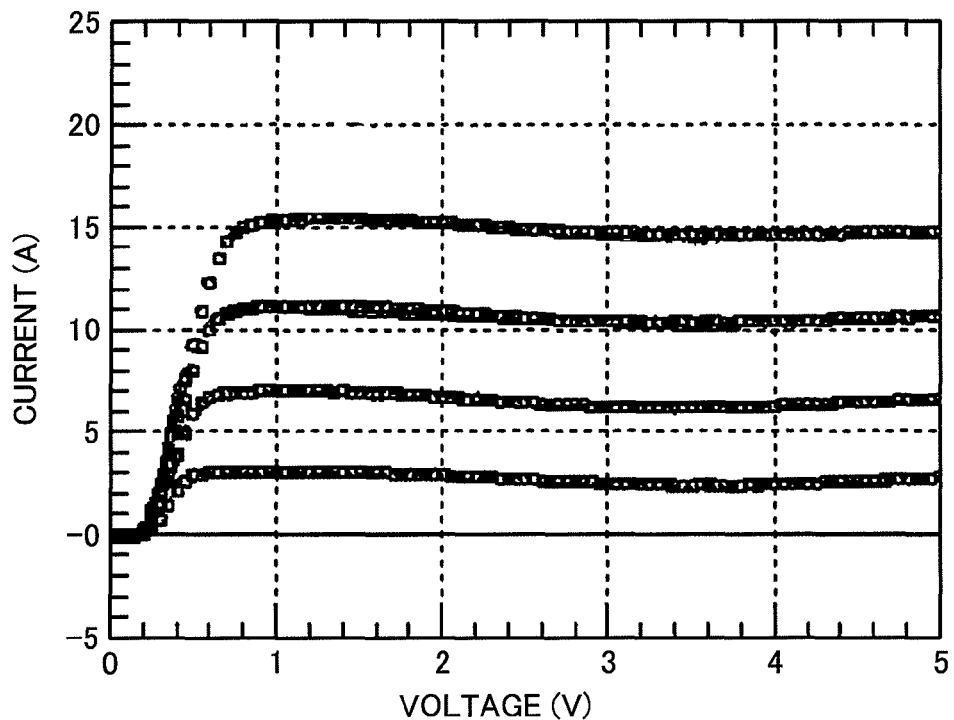
F I G. 83
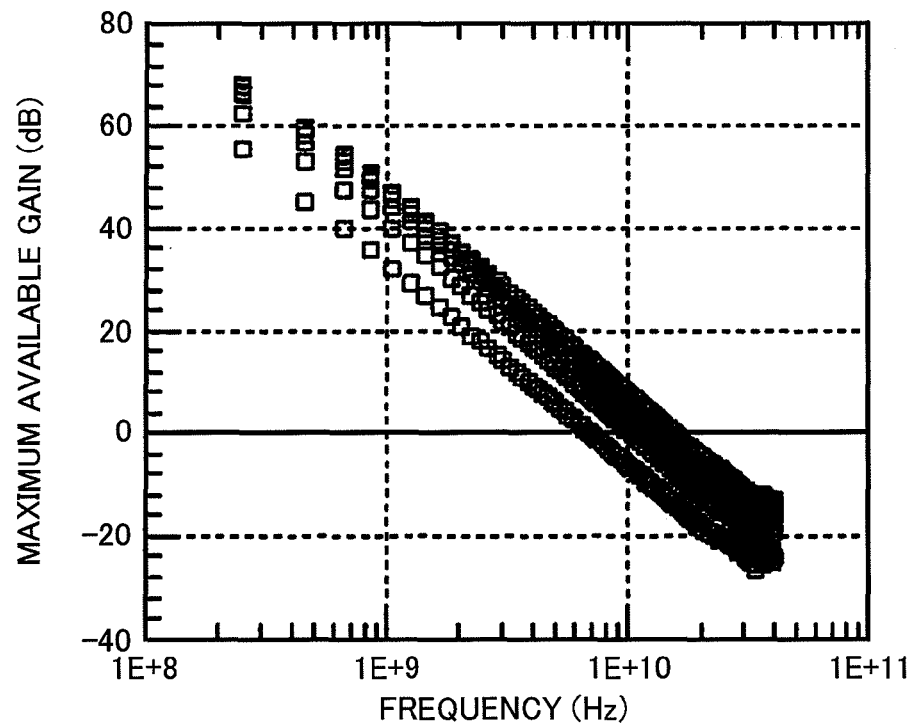
F I G. 84

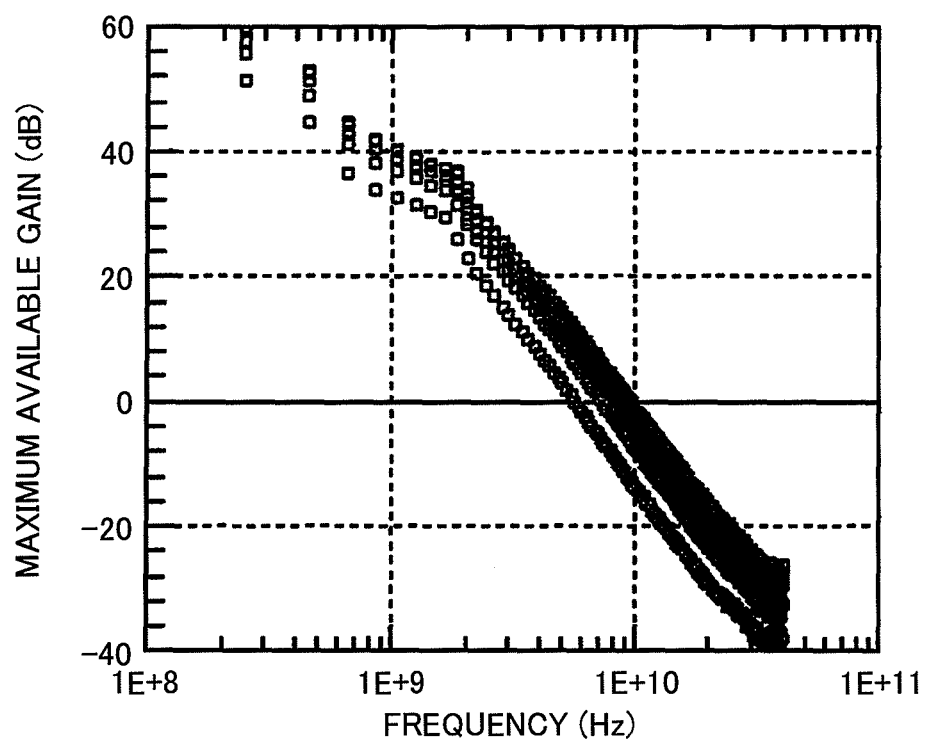
F I G . 85

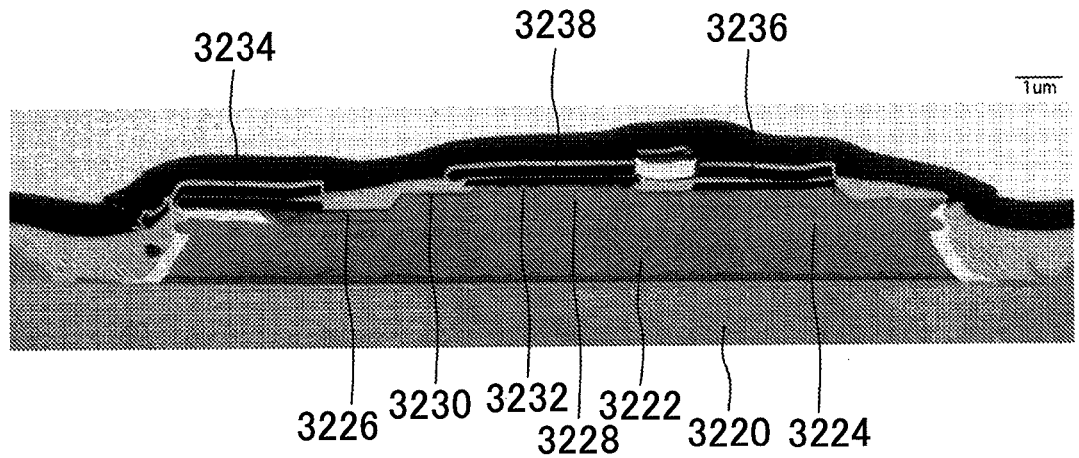
F I G . 87
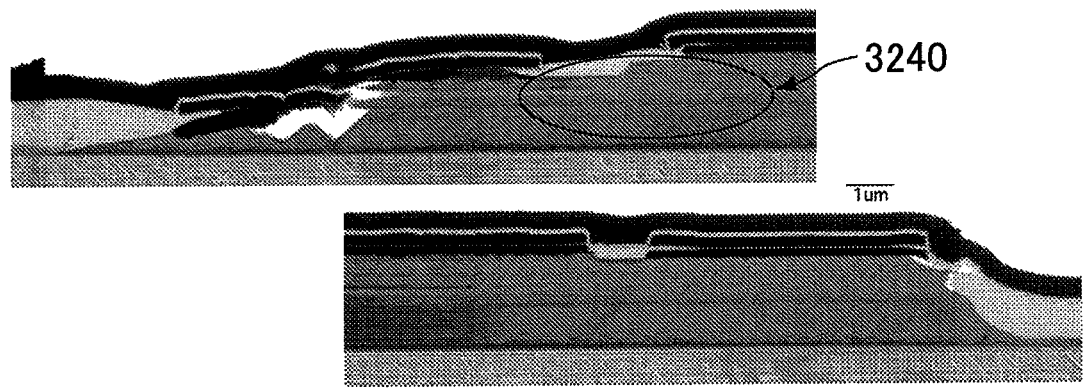
F I G . 88

SEMICONDUCTOR SUBSTRATE, ELECTRONIC DEVICE AND METHOD FOR MANUFACTURING SEMICONDUCTOR SUBSTRATE

TECHNICAL FIELD

The present invention relates to a semiconductor wafer, an electronic device, and a method of manufacturing the semiconductor wafer. More particularly, the present invention relates to a semiconductor wafer, an electronic device, and a method of manufacturing the semiconductor wafer, in which a compound semiconductor crystal thin film having superior crystallinity is formed on an insulating film with the use of a low-cost Silicon-On-Insulator (SOI) wafer.

BACKGROUND ART

A variety of highly advanced electronic devices using heterojunctions are developed as electronic devices using GaAs-based or other compound semiconductor crystals. The performance of these electronic devices depends on the crystallinity of the compound semiconductor crystals. Therefore, high-quality crystal thin films are required. When electronic devices using GaAs-based compound semiconductor crystals are manufactured, a thin film is grown on a base wafer made of GaAs, or Ge whose lattice constant is very close to the lattice constant of GaAs, or the like due to requirements including the fact that a lattice match is necessary at the hetero interface.

Patent Document 1 discloses a semiconductor device that has a limited epitaxial region that is grown on a wafer having a lattice mismatch or a wafer having a high dislocation defect density. Non-Patent Document 1 discloses a low-dislocation-density GaAs epitaxial layer grown on a Ge-coated Si wafer by means of lateral epitaxial overgrowth. Non-Patent Document 2 discloses a technique to form, on a Si wafer, a Ge epitaxial growth layer (hereinafter, may be referred to as a Ge epilayer) with high-quality. According to this technique, the Ge epilayer is first formed on a limited region of the Si wafer and then subjected to thermal cycle annealing. This enables the Ge epilayer to achieve an average dislocation density of $2.3 \times 10^6$ cm$^{-2}$.

Patent Document 1: JP 04-233720 A
Non-Patent Document 1: B.Y. Tsaur et al., "Low-dislocation-density GaAs epilayers grown on Ge-coated Si substrates by means of lateral epitaxial overgrowth," Appl. Phys. Lett. 41(4)347-349, 15 Aug. 1982
Non-Patent Document 2: Hsin-Chiao Luan et al., "High-quality Ge epilayers on Si with low threading-dislocation densities," APPLIED PHYSICS LETTERS, VOLUME 75, NUMBER 19, 8 Nov. 1999

SUMMARY OF THE INVENTION

Problem to be Solved by the Invention

GaAs-based electronic devices are preferably formed on wafers that can accomplish a lattice match with GaAs, for example, a GaAs wafer or a Ge wafer. However, the wafers that can accomplish a lattice match with GaAs, such as a GaAs wafer or a Ge wafer, are disadvantageously expensive. Furthermore, such wafers do not have sufficiently high heat dissipation characteristics. This necessitates reduction in the density of the devices for a relaxed thermal design. Therefore, good-quality semiconductor wafers are desired that are formed using low-cost Si wafers and have crystal thin films made of GaAs-based or other compound semiconductors. It is also desired to provide semiconductor wafers that can realize GaAs-based electronic devices with high-speed switching capabilities.

Means for Solving Problems

For a solution to the above-mentioned problems, according to the first aspect related to the present invention, one exemplary semiconductor wafer having a base wafer, an insulating layer, and a Si crystal layer in the stated order is provided. An inhibition layer is disposed on the Si crystal layer, has an opening penetrating therethrough to reach the Si crystal layer, and inhibits crystal growth of a compound semiconductor. A seed crystal is disposed within the opening, and the compound semiconductor has a lattice match or a pseudo lattice match with the seed crystal. A portion of the compound semiconductor, the portion being positioned within the opening, has an aspect ratio of $(\sqrt{3})/3$ or higher.

A boundary of the seed crystal, the boundary facing the compound semiconductor, has been surface-treated with a gaseous P compound. The seed crystal includes, for example, a grown $Si_xGe_{1-x}$, ($0 \leq x < 1$) crystal or a GaAs that is grown at a temperature of 500° C. or lower. The compound semiconductor is a group III-V or II-VI compound semiconductor. The compound semiconductor may be a group III-V compound semiconductor, and contain at least one among Al, Ga, and In as a group III element and contain at least one among N, P, As, and Sb as a group V element.

The opening has a bottom area of 1 mm$^2$ or less. The opening may have a bottom area of 1600 μm$^2$ or less. The opening may have a bottom area of 900 μm$^2$ or less. The opening has a bottom, a maximum width of which is 80 μm or less. The opening may have a bottom, a maximum width of which is 40 μm or less, or 5 μm or less. The inhibition layer has a maximum outer width of 4250 μm or less. The inhibition layer may have a maximum outer width of 400 μm or less.

The base wafer has a main plane that has an off angle with respect to the (100) plane or a plane crystallographically equivalent to the (100) plane, the opening has a bottom shaped like a rectangle, and one of the sides of the rectangle is substantially parallel to any one of the <010> direction, the <0-10> direction, the <001> direction, and the <00-1> direction of the base wafer. The base wafer may have a main plane that has an off angle with respect to the (111) plane or a plane crystallographically equivalent to the (111) plane, the opening may have a bottom shaped like a hexagon, and one of the sides of the hexagon may be substantially parallel to any one of the <1-10> direction, the <-110> direction, the <0-11> direction, the <01-1> direction, the <10-1> direction, and the <-101> direction of the base wafer.

The semiconductor wafer may be a semiconductor wafer in which the compound semiconductor includes a seed compound semiconductor crystal that is grown on the seed crystal to protrude above a surface of the inhibition layer, and a laterally-grown compound semiconductor crystal that is laterally grown along the inhibition layer from the seed compound semiconductor crystal serving as a nucleus. The laterally-grown compound semiconductor crystal includes a first compound semiconductor crystal that is laterally grown along the inhibition layer from the seed compound semiconductor crystal serving as a nucleus, and a second compound semiconductor crystal that is, in a different direction than that of the first compound semiconductor crystal, laterally grown along the inhibition layer from the first compound semiconductor crystal serving as a nucleus. For example, the laterally-grown compound semiconductor crystal is a group III-V or II-VI compound semiconductor.

The inhibition layer may have a plurality of the openings formed therein, and the compound semiconductor that has a lattice match or a pseudo lattice match with the seed crystal formed within each of the openings may not be in contact with the compound semiconductor that has a lattice match or a pseudo lattice match with the seed crystal formed within an adjacent opening. For example, the plurality of openings are arranged at equal intervals.

In the semiconductor wafer, the compound semiconductor may have a buffer layer made of a group III-V compound semiconductor containing P, and the buffer layer may have a lattice match or a pseudo lattice match with the seed crystal. The semiconductor wafer may further include a Si semiconductor device that is provided on a portion of the Si crystal layer, the portion being not covered by the seed crystal. Furthermore, the base wafer may be made of single crystal Si, and the semiconductor wafer may further include a Si semiconductor device that is provided on a portion of the base wafer, the portion being not covered by the seed crystal.

A plane of the Si crystal layer on which the seed crystal is formed has an off angle with respect to a crystal plane selected from among the (100) plane, the (110) plane, the (111) plane, a plane crystallographically equivalent to the (100) plane, a plane crystallographically equivalent to the (110) plane, and a plane crystallographically equivalent to the (111) plane. The off angle may be no less than 2° and no more than 6°.

According to the second aspect related to the present invention, provided is one exemplary electronic device including a substrate, an insulating layer disposed on the substrate, a Si crystal layer disposed on the insulating layer, an inhibition layer disposed on the Si crystal layer where the inhibition layer has an opening penetrating therethrough to reach the Si crystal layer and inhibits crystal growth of a compound semiconductor, a seed crystal disposed within the opening, a compound semiconductor that has a lattice match or a pseudo lattice match with the seed crystal, and a semiconductor device formed using the compound semiconductor. The compound semiconductor may include a seed compound semiconductor crystal that is grown on the seed crystal to protrude above a surface of the inhibition layer, and a laterally-grown compound semiconductor crystal that is laterally grown along the inhibition layer from the seed compound semiconductor crystal serving as a nucleus.

According to the third aspect related to the present invention, one exemplary method for producing a semiconductor wafer is provided. The method includes a step of providing an SOI wafer including a base wafer, an insulating layer, and a Si crystal layer, a step of forming an inhibition layer on the Si crystal layer where the inhibition layer inhibits crystal growth of a compound semiconductor, a step of forming an opening in the inhibition layer where the opening penetrates through the inhibition layer to reach the Si crystal layer, a step of growing a seed crystal within the opening, and a step of growing the compound semiconductor that has a lattice match or a pseudo lattice match with the seed crystal. The step of forming an opening may include a step of forming a plurality of the openings at equal intervals.

BRIEF DESCRIPTION OF THE DRAWINGS

FIG. 13 is an exemplary plan view illustrating an electronic device 200.

FIG. 19 is an exemplary plan view illustrating a semiconductor wafer 801 relating to an embodiment.

FIG. 26 illustrates the cross-sectional shape of the Ge crystal layer 2106 after annealing at the temperature of 850° C.

FIG. 32 shows an electron microscopic photograph of the compound semiconductor 2108 in Exemplary Embodiment 7.

FIG. 42 shows an electron microscopic photograph of the compound semiconductor 2108 in Exemplary Embodiment 9.

FIG. 47 shows the relation between the electric characteristics of an HBT element and the area of an opening.

FIG. 54 shows the Si element profile in a sample B.

FIG. 62 is a graph showing the relation between the growth rate of a device forming thin film 3004 and the width of an inhibition layer 3002.

FIG. 63 is a graph showing the relation between the growth rate of the device forming thin film 3004 and its area ratio.

FIG. 64 is a graph showing the relation between the growth rate of the device forming thin film 3004 and the width of the inhibition layer 3002.

FIG. 65 is a graph showing the relation between the growth rate of the device forming thin film 3004 and its area ratio.

FIG. 66 is a graph showing the relation between the growth rate of the device forming thin film 3004 and the width of the inhibition layer 3002.

FIG. 67 is a graph showing the relation between the growth rate of the device forming thin film 3004 and its area ratio.

FIG. 68 is an electron microscopic photograph showing the surface of the semiconductor device forming wafer 3000 in which the base wafer has an off angle of 2°.

FIG. 70 is an electron microscopic photograph showing the surface of the semiconductor device forming wafer 3000 in which the base wafer has an off angle of 6°.

FIG. 71 is an electron microscopic photograph showing the surface of the semiconductor device forming wafer 3000 in which the base wafer has an off angle of 6°.

FIG. 77 is a plan view illustrating one of the steps of the manufacturing process of the HBT 3100.

FIG. 78 is a plan view illustrating one of the steps of the manufacturing process of the HBT 3100.

FIG. 83 is a graph showing the data obtained by measuring the various characteristics of the manufactured HBT 3100.

FIG. 84 is a graph showing the data obtained by measuring the various characteristics of the manufactured HBT 3100.

FIG. 85 is a graph showing the data obtained by measuring the various characteristics of the manufactured HBT 3100.

FIG. 87 is a TEM photograph showing the cross-section of a HBT concurrently manufactured with the HBT 3100.

FIG. 88 shows an HBT manufactured by forming a device forming thin film on a plain wafer without an inhibition layer.

MODE FOR CARRYING OUT THE INVENTION

Some aspects of the invention will now be described based on the embodiments, which do not intend to limit the scope of the present invention, but exemplify the invention. All of the features and the combinations thereof described in the embodiment are not necessarily essential to the invention.

Figure 1:
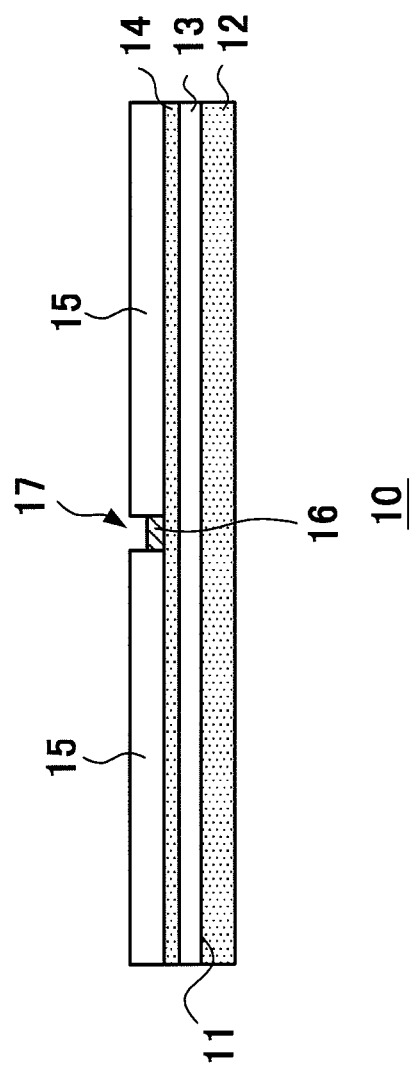
FIG. 1 schematically illustrates an exemplary cross-section of a semiconductor wafer 10.

FIG. 1 schematically illustrates an exemplary cross-section of a semiconductor wafer 10 relating to an embodiment. As shown in FIG. 1, the semiconductor wafer 10 includes, in at least part thereof, a base wafer 12, an insulating layer 13, and a Si crystal layer 14 in the stated order. Thus, the insulating layer 13 insulates the base wafer 12 and the Si crystal layer 14 from each other so as to reduce leakage currents flowing into the base wafer 12. As used herein, "a substantially perpendicular direction" refers not only to a strictly perpendicular direction but also to directions slightly off the perpendicular direction considering the manufacturing errors of the wafer and the respective components.

An inhibition layer 15 inhibits crystal growth. The inhibition layer 15 is formed on the Si crystal layer 14. The inhibition layer 15 has an opening 17 formed therein that penetrates through the inhibition layer 15 in the substantially perpendicular direction to the main plane 11 of the base wafer 12 to expose the Si crystal layer 14. In other words, the opening 17 extends to reach the Si crystal layer 14. In this way, a crystal is not grown on the surface of the inhibition layer 15 and instead selectively grown within the opening 17. The semiconductor wafer 10 further has a seed crystal 16. The seed crystal 16 is disposed within the opening 17. In this way, the seed crystal 16 achieves excellent crystallinity. Here, the insulating layer 13 may be smaller in area than the base wafer 12. The Si crystal layer 14 may be smaller in area than the insulating layer 13. The inhibition layer 15 may be smaller in area than the Si crystal layer 14.

The base wafer 12 is a silicon wafer, for example. The insulating layer 13 is a silicon oxide layer that is formed by oxidizing the main plane 11 of the base wafer 12, for example. The Si crystal layer 14 is a layer of single crystal silicon formed on the insulating layer 13, for example. The base wafer 12, the insulating layer 13, and the Si crystal layer 14 may constitute a commercially available SOI wafer.

The seed crystal 16 is epitaxially grown on the Si crystal layer 14 by chemical vapor deposition (CVD), metal organic chemical vapor deposition (MOCVD), or molecular beam epitaxy (MBE) using organic metals as the source. For example, the seed crystal 16 includes a $Si_xGe_{1-x}$ crystal ($0 \leq x < 1$) or a GaAs crystal formed at the temperature of 500° C. or lower.

The inhibition layer 15 may be made of $SiO_2$ and can be formed by, for example, CVD. The opening 17 can be, for example, formed by photolithography.

In the present embodiment, the case where the base wafer 12 and the insulating layer 13 are in contact with each other has been explained. However, the positional relation between the base wafer 12 and the insulating layer 13 is not limited to such. There may be one or more different layers between the base wafer 12 and the insulating layer 13, for example. In the present embodiment, the case where the Si crystal layer 14 and the seed crystal 16 are in contact with each other has been explained. However, the positional relation between the Si crystal layer 14 and the seed crystal 16 is not limited to such. There may be one or more different layers between the Si crystal layer 14 and the seed crystal 16, for example. Furthermore, the seed crystal 16 may be constituted by a plurality of crystal layers.

Figure 2:
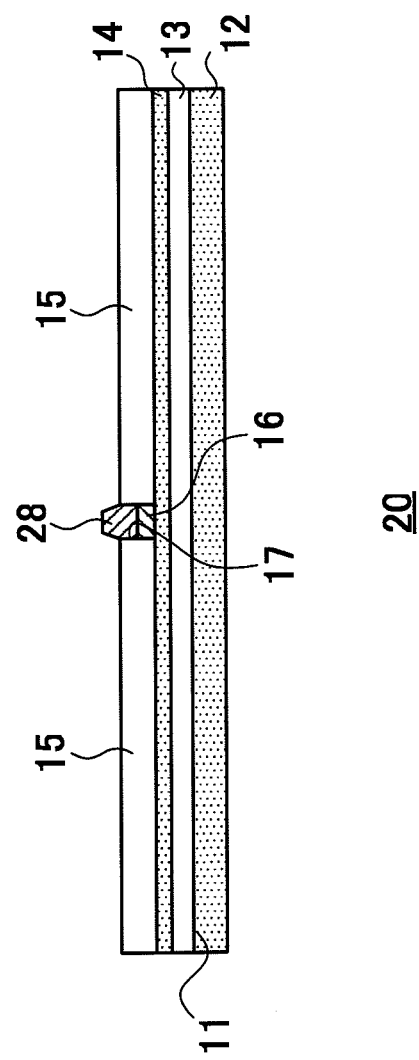
FIG. 2 schematically illustrates an exemplary cross-section of a semiconductor wafer 20.

FIG. 2 schematically illustrates an exemplary cross-section of a semiconductor wafer 20. The semiconductor wafer 20 has the same configuration as the semiconductor wafer 10 except that a compound semiconductor 28 is additionally provided. The inhibition layer 15 inhibits the crystal growth of the compound semiconductor 28. The compound semiconductor 28 has a lattice match or a pseudo lattice match with the seed crystal 16. The use of the seed crystal 16 with excellent crystallinity enables the compound semiconductor 28 to have excellent crystallinity.

The compound semiconductor 28 can be formed by an epitaxial growth method using MOCVD (metal organic chemical vapor deposition) or MBE that uses organic metals as the source. The compound semiconductor 28 is, for example, a group III-V compound semiconductor or group II-VI compound semiconductor. When the compound semiconductor 28 is a group III-V compound semiconductor, the compound semiconductor 28 may contain at least one among Al, Ga, and In as the group III element and at least one among N, P, As, and Sb as the group V element. The compound semiconductor 28 may be constituted by a plurality of crystal layers. The compound semiconductor 28 is formed so that at least a partial portion of the compound semiconductor 28 protrudes above a surface of the inhibition layer 15.

Figure 3:
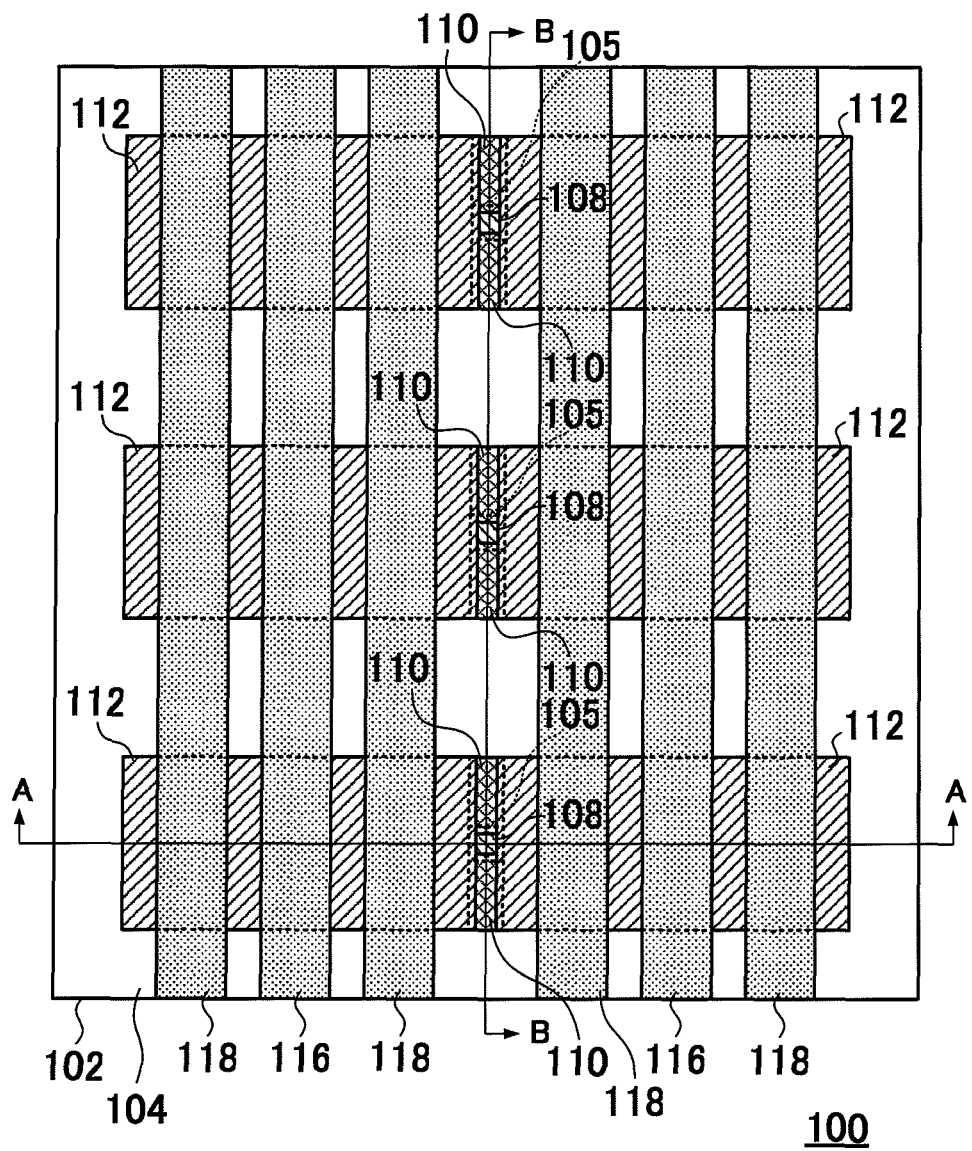
FIG. 3 is an exemplary plan view illustrating an electronic device 100 relating to an embodiment.
Figure 4:
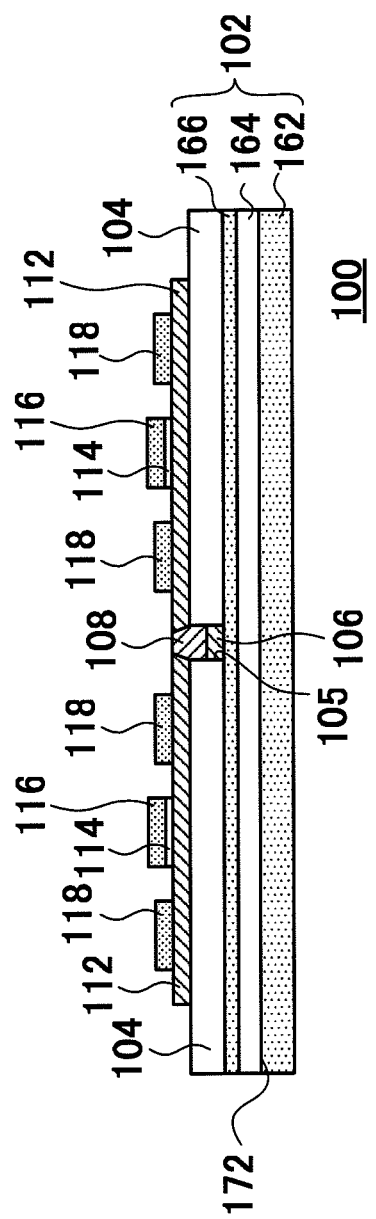
FIG. 4 illustrates a cross-section along the line A-A in FIG. 3.
Figure 5:
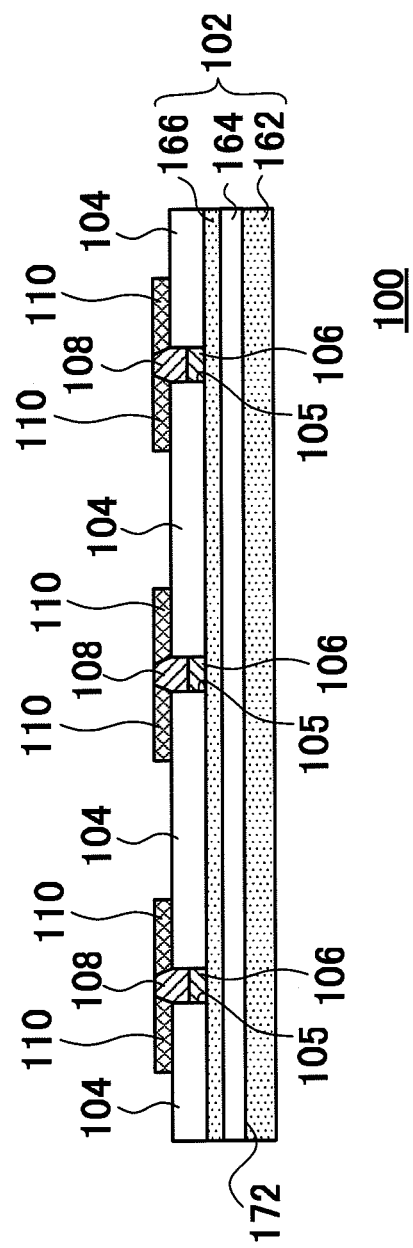
FIG. 5 illustrates a cross-section along the line B-B in FIG. 3.

FIG. 3 is an exemplary plan view illustrating an electronic device 100 relating to an embodiment. FIG. 4 illustrates a cross-section along the line A-A in FIG. 3. FIG. 5 illustrates a cross-section along the line B-B in FIG. 3. The electronic device 100 relating to the present embodiment has an SOI wafer 102 and an inhibition layer 104. The electronic device 100 includes a Ge crystal layer 106, a seed compound semiconductor crystal 108, a first compound semiconductor crystal 110, and a second compound semiconductor crystal 112. The electronic device 100 further includes a gate insulator 114, a gate electrode 116, and source/drain electrodes 118.

The inhibition layer 104 is equivalent to the inhibition layer 15. The Ge crystal layer 106 is equivalent to the seed crystal 16. The seed compound semiconductor crystal 108, the first compound semiconductor crystal 110, and the second compound semiconductor crystal 112 are each equivalent to the compound semiconductor 28. The following may not repeat the same description about the equivalent components.

In the present example, the Ge crystal layer 106, which is disposed within an opening 105, serves as a nucleus to grow the seed compound semiconductor crystal 108 until it projects from the opening 105. The seed compound semiconductor crystal 108 then serves as a nucleus to grow the first compound semiconductor crystal 110 in a first direction on the surface of the inhibition layer 104. The first compound semiconductor crystal 110 then serves as a nucleus to grow the second compound semiconductor crystal 112 in a second direction on the surface of the inhibition layer 104. Here, the first direction perpendicularly intersects the second direction, for example.

The electronic device 100 may include a plurality of metal insulator semiconductor field effect transistors (MISFETs) or high electron mobility transistors (HEMTs). The specification may describe that the respective components are sequentially stacked "on" each other or in the upward direction as shown in the drawings. However, the stacking direction of the electronic device 100 and the like is not limited to the direction from the downside to the upside that are defined in terms of the orientation of the electronic device 100 and the like during their actually usage. As used herein, when a first component is "formed on" a second component, the first component is formed on the second component in terms of the stacking direction. Furthermore, when a first component is "formed on" a second component, the first component may be in contact with the second component, or alternatively, the first component may be formed on the second component with one or more intervening layers formed therebetween.

In at least part of the SOI wafer 102, the Si wafer 162, the insulating layer 164, and the Si crystal layer 166 are arranged in the stated order. The SOI wafer 102 has the insulating layer 164 and the Si crystal layer 166 on the side of a main plane 172 of the Si wafer 162. The Si wafer 162 may be a single crystal Si wafer. The Si wafer 162 serves as the substrate of the electronic device 100.

The insulating layer 164 electrically insulates the Si wafer 162 and the Si crystal layer 166 from each other. The insulating layer 164 is in contact with the main plane 172 of the Si wafer 162. The Si crystal layer 166 may contain Si single crystals. The Si crystal layer 166 is in contact with the insulating layer 164. The Si wafer 162, the insulating layer 164, and the Si crystal layer 166 are equivalent to the base wafer 12, the insulating layer 13, and the Si crystal layer 14. The following may not repeat the same description about the equivalent components.

Active elements such as MISFETs or HEMTs are formed on the SOI wafer 102. When the electronic device 100 is formed on the SOI wafer 102, the electronic device 100 achieves a reduced stray capacitance, thereby being capable of operating faster. The insulating layer 164, which provides a high insulation resistance, can prevent the leakage currents from flowing into the Si wafer 162 from the electronic device 100.

The inhibition layer 104 is formed in contact with the Si crystal layer 166 on the side of the main plane 172 of the SOI wafer 102. The inhibition layer 104 is equivalent to the inhibition layer 15. The inhibition layer 104 has an opening 105 that penetrates therethrough in the substantially perpendicular direction to the main plane 172 of the Si wafer 162. The inhibition layer 104 inhibits the epitaxial growth of the seed compound semiconductor crystal 108, the first compound semiconductor crystal 110, and the second compound semiconductor crystal 112.

The opening 105 externally exposes the Si crystal layer 166 before the seed compound semiconductor crystal 108 is formed. Stated differently, the inhibition layer 104 has the opening 105 that extends from the surface of the inhibition layer 104 to the Si crystal layer 166. Accordingly, an epitaxial film is selectively grown within the opening 105, in which the Si crystal layer 166 is exposed. For example, the Ge crystal layer 106 is selectively grown within the opening 105. Furthermore, the Ge crystal layer 106 serves as a nucleus to selectively grow the seed compound semiconductor crystal 108 within the opening 105. On the other hand, no epitaxial film is grown on the surface of the inhibition layer 104 since crystal growth is inhibited on the surface of the inhibition layer 104. The inhibition layer 104 may contain silicon oxide or silicon nitride.

As used herein, "an aspect ratio of an opening" is defined as a result of dividing "the depth of the opening" by "the width of the opening." For example, an aspect ratio is defined as the result of dividing the etching depth by the pattern width in "Handbook for Electronics, Information and Communication Engineers, Volume 1," edited by the Institute of Electronics, Information and Communication Engineers, Page 751, 1988, published by Ohmsha. The term "aspect ratio" is used herein to mean a similar meaning to the above. The depth of the opening is defined as the depth of the opening in the direction in which the thin films are stacked on the wafer. The width of the opening is defined as the width of the opening in the perpendicular direction to the stacking direction. When the opening has a varying width, the width of the opening is defined as the minimum width of the opening. For example, when the opening is shaped as a rectangle when seen in the stacking direction, the width of the opening is defined as the length of the short side of the rectangle.

When the Ge crystal layer 106 is grown within the opening 105, the depth of the opening 105 is defined as the distance between the surface of the Ge crystal layer 106 and the surface of the inhibition layer 104. When the seed compound semiconductor crystal 108 is selectively grown from the Ge crystal layer 106 serving as a nucleus, the depth of the opening 105 is defined as a portion of the seed compound semiconductor crystal 108, the portion being positioned within the opening 105. Here, the portion of the seed compound semiconductor crystal 108, the portion being positioned within the opening 105, refers to the perpendicular width of the seed compound semiconductor crystal 108 from the level of the surface of the Ge crystal layer 106 to the level of the surface of the inhibition layer 104. Accordingly, the aspect ratio of the opening 105 is herein defined as the result of dividing the height of the portion of the seed compound semiconductor crystal 108 which is positioned within the opening 105 by the width of the opening.

When the Ge crystal layer 106 formed within the opening 105 is not heated to the temperature around 600 to 900° C., the opening 105 preferably has an aspect ratio of $\sqrt{3}/3$ or higher, for example. More specifically, when the Si crystal layer 166 has a plane orientation (100) at the bottom of the opening 105, the opening 105 may have an aspect ratio of 1 or higher. When the Si crystal layer 166 has a plane orientation (111) at the bottom of the opening 105, the opening 105 may have an aspect ratio of $\sqrt{2}$ (=approximately 1.414) or higher. When the Si crystal layer 166 has a plane orientation (110) at the bottom of the opening 105, the opening 105 may have an aspect ratio of $\sqrt{3}/3$ (=approximately 0.577) or higher.

When the Ge crystal layer 106 is formed within the opening 105 having an aspect ratio of $\sqrt{3}/3$ or higher, the defects in the Ge crystal layer 106 are terminated by the wall of the opening 105. This reduces the defects on the surface of the Ge crystal layer 106, the surface being not covered by the wall of the opening 105 and thus externally exposed. Thus, when the opening 105 has an aspect ratio of $\sqrt{3}/3$ or higher, even if the Ge crystal layer 106 formed within the opening 105 is not subjected to annealing, the density of the defects on the surface of the Ge crystal layer 106 that is externally exposed through the opening 105 can be lowered to fall within a prescribed acceptable range. The use of the surface of the Ge crystal layer 106 that is exposed through the opening 105 as a nucleus of the seed compound semiconductor crystal 108 can enhance the crystallinity of the seed compound semiconductor crystal 108.

When it is possible to heat the Ge crystal layer 106 formed within the opening 105 to the temperature around 600 to 900° C. to anneal the Ge crystal layer 106, the opening 105 may be allowed to have an aspect ratio of less than $\sqrt{2}$. The opening 105 is allowed to have an aspect ratio of less than $\sqrt{2}$ since annealing can complementarily reduce the defects in the Ge crystal layer 106. More specifically, when the Si crystal layer 166 has a plane orientation (100) at the bottom of the opening 105, the opening 105 may have an aspect ratio of less than 1. When the Si crystal layer 166 has a plane orientation (111) at the bottom of the opening 105, the opening 105 may have an aspect ratio of less than $\sqrt{2}$ (=approximately 1.414) or higher. When the Si crystal layer 166 has a plane orientation (110) at the bottom of the opening 105, the opening 105 may have an aspect ratio of less than $\sqrt{3}/3$ (=approximately 0.577) or higher. The Ge crystal layer 106 may be subjected to annealing before any compound semiconductor crystal is grown on the Ge crystal layer 106.

The opening 105 may have a bottom area of 1 mm² or smaller, preferably less than 0.25 mm². In this case, the seed compound semiconductor crystal 108 also has a bottom area of 1 mm² or smaller, or 0.25 mm². When the seed compound semiconductor crystal 108 is sized equal to or smaller than a prescribed size, performing annealing under prescribed conditions can move a defect at any point within the seed compound semiconductor crystal 108 to the edge of the seed compound semiconductor crystal 108. Thus, the defect density of the seed compound semiconductor crystal 108 can be easily lowered.

The opening 105 may have a bottom area of 0.01 mm² or smaller, preferably 1600 μm² or smaller, more preferably 900 μm² or smaller. In these cases, the seed compound semiconductor crystal 108 formed within the opening 105 similarly has a bottom area of 0.01 mm² or smaller, 1600 μm² or smaller, or 900 μm² or smaller.

When there is a large difference in thermal expansion coefficient between the SOI wafer 102 and a functional layer such as the seed compound semiconductor crystal 108 and a compound semiconductor layer, thermal annealing is highly likely to locally bend the functional layer. Here, the time required to anneal the Ge crystal layer 106 formed within the opening 105 can be made shorter when the areas are 0.01 mm² or smaller than when the areas exceeds 0.01 mm². Thus, the opening 105 having a bottom area of 0.01 mm² or smaller can reduce the crystal defects that may be generated in the functional layer by the bend.

When the opening 105 has a bottom area of larger than 1600 μm², crystal defects cannot be sufficiently reduced and the semiconductor wafer is thus not likely to have prescribed characteristics necessary to manufacture devices. When the opening 105 has a bottom area of 1600 μm² or smaller, the number of crystal defects may be reduced to become equal to or fall below a prescribed number. If such is the case, the functional layer formed within the opening can be used to manufacture a high-performance device. When the bottom area of the opening 105 is 900 μm² or smaller; the number of crystal defects is more likely to be reduced to become equal to or fall below a prescribed number and the manufacturing yield of the devices can be improved.

If the opening 105 has a bottom area of 1600 μm² or smaller, the functional layer formed within the opening can be used to manufacture a high-performance device. When the bottom area of the opening 105 is 900 μm² or smaller, the manufacturing yield of the devices can be improved.

On the other hand, the opening 105 may have a bottom area of 25 μm² or larger. The bottom area of smaller than 25 μm² destabilizes the growth rate of the crystal epitaxially grown within the opening 105 and is likely to impair the shape of the crystal. The bottom area of smaller than 25 μm² may also make it difficult to process the compound semiconductor formed within the opening 105 into a device and thus lower the yield.

The ratio of the bottom area of the opening 105 to the area of a covering region is preferably 0.01% or higher. Here, the covering region is defined as a region in which the inhibition layer 104 covers the Si crystal layer 166. The above ratio of lower than 0.01% destabilizes the rate at which a crystal is grown within the opening 105. When a plurality of openings 105 are formed in a single covering region, the bottom areas of the openings 105 in the covering region are summed together so that the total bottom area is used in calculating the above ratio.

The bottom of the opening 105 may be shaped such that the maximum width is 100 μm or smaller, preferably 80 μm or smaller. The maximum width of the bottom of the opening 105 is defined as the length of the longest straight line between any two points of the bottom of the opening 105. When the bottom of the opening 105 is shaped as a square or rectangle, the length of the side of the bottom may be 100 μm or smaller, preferably 80 μm or smaller. When the maximum width of the bottom is 100 μm or smaller, the Ge crystal layer 106 formed within the opening 105 can be annealed within a shorter duration than when the maximum width of the bottom is larger than 100 μm.

The Ge crystal layer 106 may be sized such that no defects are generated in the Ge crystal layer 106 even when stress occurs due to the difference in thermal expansion coefficient at the annealing temperature between the Ge crystal layer 106 and the Si crystal layer 166. For example, the maximum width of the Ge crystal layer 106 in the substantially parallel direction to the main plane 172 may be 40 μm or smaller, preferably 20 μm or smaller. Since the maximum width of the Ge crystal layer 106 is dependent on the maximum width of the bottom of the opening 105, the maximum width of the bottom of the opening 105 is preferably no more than a prescribed value. For example, the maximum width of the bottom of the opening 105 may be 40 μm or smaller, more preferably 30 μm or smaller.

A single opening 105 may be formed in a single inhibition layer 104. In this way, a crystal can be epitaxially grown at a stable rate within the opening 105. Alternatively, a plurality of openings 105 may be formed in a single inhibition layer 104. In this case, the openings 105 are preferably arranged at equal intervals. In this way, a crystal can be epitaxially grown at a stable rate within the openings 105.

When the bottom of the opening 105 is shaped as a polygon, at least one among the sides of the polygon preferably extends substantially in parallel to any one of the crystallographic plane orientations of the main plane of the SOI wafer 102. The shape of the bottom of the opening 105 and the crystallographic plane orientations of the main plane of the SOI wafer 102 are preferably determined in relation to each other such that the crystal grown within the opening 105 has a stable lateral plane. Here, the expression "substantially parallel" includes a case where one of the sides of the polygon extends in a direction at a slight angle with respect to one of the crystallographic plane orientations of the wafer. The angle is, for example, 5° or smaller. This configuration can reduce disturbances in the crystal growth and contributes to stable growth of the crystal. Therefore, a well-shaped seed crystal can be obtained, which helps easy crystal growth.

The main plane of the SOI wafer 102 may be one of the (100) plane, the (110) plane and the (111) plane, or crystallographically equivalent to these planes. The main plane of the SOI wafer 102 is preferably at a slight angle with respect to the above-listed crystallographic plane orientations. Stated differently, the SOI wafer 102 preferably has an off angle. The angle may be 10° or smaller. The angle may be no less than 0.05° and no more than 6°, no less than 0.3° no more than 6°, no less than 2° and no more than 6°. When a rectangular crystal is grown within the opening, the main plane of the wafer may be one of the (100) plane and the (110) plane, or crystallographically equivalent to these planes. In this way, the crystal is more likely to have lateral planes related by 4-fold symmetry.

An exemplary case is described where the inhibition layer 104 is formed on the (100) plane of the surface of the SOI wafer 102, the opening 105 has a bottom shaped as a square or rectangle, and the seed compound semiconductor crystal 108 is a GaAs crystal. In this case, at least one among the sides of the bottom shape of the opening 105 may extend in a direction substantially parallel to any one of the <010> direction, the <0-10> direction, the <001> direction, and the <00-1> direction of the SOI wafer 102. In this way, the GaAs crystal has stable lateral planes.

Another exemplary case is described where the inhibition layer 104 is formed on the (111) plane of the surface of the SOT wafer 102, the opening 105 has a bottom shaped as a hexagon, and the seed compound semiconductor crystal 108 is a GaAs crystal. In this case, at least one among the sides of the bottom shape of the opening 105 may extend in a direction substantially parallel to any one of the <1-10> direction, the <-110> direction, the <0-11> direction, the <01-1> direction, the <10-1> direction, and the <-101> direction of the SOI wafer 102. In this way, the GaAs crystal has stable lateral planes. The bottom of the opening 105 may be shaped as a regular hexagon.

A plurality of inhibition layers 104 may be formed on the SOI wafer 102. In this case, the SOI wafer 102 has a plurality of covering regions formed thereon. For example, the inhibition layer 104 of FIG. 3 may be formed on the SOI wafer 102 in each of the regions 803 of FIG. 19.

The seed compound semiconductor crystal 108 is grown within the opening 105 by chemical vapor deposition (CVD) or vapor phase epitaxy (VPE). According to these techniques, a source gas containing component elements of a thin-film crystal to be formed is supplied onto a wafer and a thin film is formed by vapor-phase chemical reaction of the source gas or chemical reaction of the source gas at the surface of the wafer. When supplied into a reactor, the source gas produces intermediates (hereinafter, may be referred to as precursors) in gas phase reactions. The produced intermediates diffuse in the gas phase to adsorb onto the surface of the wafer. The intermediates that have adsorbed onto the surface of the wafer undergo surface diffusion on the surface of the wafer, to be formed into a solid film.

Here, a sacrificial growth portion may be formed on the SOI wafer 102 between two adjacent inhibition layers 104. The sacrificial growth portion adsorbs the source of the Ge crystal layer 106 or the seed compound semiconductor crystal 108 to form a thin film at a higher rate than any of the upper planes of the two inhibition layers 104. The thin film deposited on the sacrificial growth portion does not need to have equal crystalline quality to the Ge crystal layer 106 or the seed compound semiconductor crystal 108 and may be a polycrystal or amorphous body. The thin film deposited on the sacrificial growth portion may not be used to manufacture devices.

The sacrificial growth portion may separately surround each inhibition layer 104. In this way, a crystal can be epitaxially grown at a stable rate within the opening 105.

Each inhibition layer 104 may have a plurality of openings 105. The electronic device 100 may have a sacrificial growth portion formed between two adjacent openings 105. The sacrificial growth portions may be arranged at equal intervals.

A region of the SOI wafer 102 that is in the vicinity of its surface may serve as the sacrificial growth portion. Alternatively, a groove that is formed in the inhibition layer 104 so as to penetrate through the inhibition layer 104 down to the SOI wafer 102 may serve as the sacrificial growth portion. The groove may have a width of no less than 20 μm and no more than 500 μm. It should be noted that crystal growth may also take place in the sacrificial growth portion.

As described above, the sacrificial growth portion is positioned between two adjacent inhibition layers 104. Furthermore, the sacrificial growth portion surrounds each inhibition layer 104. In this way, the sacrificial growth portion traps, adsorbs, or seizes the precursors that are diffused on the surface of the covering region. Therefore, a crystal can be grown at a stable rate within the opening 105. The precursors may be an exemplary source for the seed compound semiconductor crystal 108.

For example, the surface of the SOI wafer 102 is externally exposed in a region other than the covering region in which the covering regions of a prescribed size are formed on the surface of the SOI wafer 102. When a crystal is grown within the opening 105 by MOCVD, some of the precursors that have reached the surface of the SOI wafer 102 are grown into a crystal on the surface of the SOI wafer 102. Since some of the precursors are consumed on the surface of the SOI wafer 102 as described above, a crystal is grown at a stable rate within the opening 105.

As yet another example, a semiconductor region made of Si, GaAs, or the like serves as the sacrificial growth portion. For example, the sacrificial growth portion is formed on the surface of the inhibition layer 104 by depositing an amorphous or polycrystalline semiconductor with ion plating, sputtering or the like. The sacrificial growth portion may be positioned between two adjacent inhibition layers 104 or included in the inhibition layer 104. Alternatively, a region may be provided between two adjacent covering regions that inhibits the diffusion of the precursors. The covering region may be surrounded by a region that inhibits the diffusion of the precursors.

As long as a slight distance is provided between two adjacent inhibition layers 104, a crystal is grown at a stable rate within the opening 105. Two adjacent inhibition layers 104 may be spaced away from each other by 20 μm or greater. Two adjacent inhibition layers 104 may be spaced away from each other by 20 μm or greater with a sacrificial growth portion provided therebetween. In this way, a crystal is grown at a more stable rate within the opening 105. Here, the distance between two adjacent inhibition layers 104 is defined as the minimum distance between a point on the periphery of one of the two inhibition layers 104 and a point on the periphery of the other. The inhibition layers 104 may be arranged at equal intervals. In particular, when two adjacent inhibition layers 104 are spaced away from each other by a distance less than 10 μm, a crystal can be grown at a stable rate within the opening 105 by arranging a plurality of inhibition layers 104 at equal intervals.

The SOI wafer 102 may be a high-resistance wafer without impurities or a low-resistance wafer with p- or n-type impurities. The Ge crystal layer 106 may be made of Ge without impurities or Ge with p- or n-type impurities.

When seen in the stacking direction, the opening 105 has any shape such as square, rectangular, circular, elliptical, oval and other shapes. When the opening 105 is shaped as a circle or ellipse when seen in the stacking direction, the diameter of the circle or the minor axis of the ellipse is referred to as the width of the opening 105. Furthermore, when taken along a plane parallel to the stacking direction, the cross-section of the opening 105 may also have any shape such as rectangular, trapezoidal, parabolic, hyperbolic, and other shapes. When the cross-section of the opening 105 that is taken along a plane parallel to the stacking direction is shaped as a trapezoid, the minimum width at the bottom or entrance of the opening 105 is referred to as the width of the opening 105.

When shaped as a rectangle or square when seen in the stacking direction and as a rectangle when seen in cross section that is taken along a plane parallel to the stacking direction, the internal space defined within the opening 105 is three-dimensionally shaped as a cuboid. Here, it should be noted that the internal space defined within the opening 105 is three-dimensionally shaped in any manner. When the internal space defined within the opening 105 is three-dimensionally shaped in any manner other than as a cuboid, the aspect ratio of a cuboid that approximates the three-dimensional shape of the internal space defined within the opening 105 may be used as the aspect ratio of the three-dimensional shape.

The Ge crystal layer 106 may have a defect trap that traps defects, which move within the Ge crystal layer 106. The defects may include defects that are present when the Ge crystal layer 106 is formed. The defect trap may be a plane among a crystal boundary of the Ge crystal layer 106 or a crystal surface of the Ge crystal layer 106, or a flaw physically formed in the Ge crystal layer 106. For example, the defect trap is a plane among a crystal boundary or a crystal surface, the plane having a direction that is not substantially parallel to the Si wafer 162. For example, the defect trap is formed by etching the Ge crystal layer 106 into lines or discrete islands to form a crystal boundary in the Ge crystal layer 106. Alternatively, the defect trap is also formed by physically damaging the Ge crystal layer 106 by means of mechanical scratching, friction, ion implantation or the like. The defect trap is formed in a region of the Ge crystal layer 106 that is not exposed by the opening 105. The defect trap may be a boundary between the Ge crystal layer and the inhibition layer 104.

The defect trap may be positioned so as to be away from any point in the Ge crystal layer 106 by a distance that is equal to or shorter than the distance by which defects can move by annealing that is carried out at a prescribed temperature for a prescribed duration. The distance L [μm] by which defects can move may be between 3 μm and 20 μm when annealing is performed at the temperature of 700 to 950° C. The defect trap may be positioned within the above-defined distance from every defect in the Ge crystal layer 106. In this manner, the annealing can reduce the threading defect density (or also referred to as the threading dislocation density) within the Ge crystal layer 106. For example, the threading dislocation density of the Ge crystal layer 106, which is shown as an exemplary seed crystal layer, is reduced to $1 \times 10^6 / cm^2$ or lower.

The annealing of the Ge crystal layer 106 may be carried out with the temperature and the duration being set such that the defects that are present when the Ge crystal layer 106 is formed can move to the defect trap of the Ge crystal layer 106. For example, when the outer edge of the Ge crystal layer 106 serves as the defect trap, the annealing may be performed with the temperature and the time of period being set such that a defect at any point within the Ge crystal layer 106 can move to the outer edge of the Ge crystal layer 106. The Ge crystal layer 106 may be sized such that the density of the defects within the Ge crystal layer 106 may be reduced by the annealing-induced movement of the defects that are present when the Ge crystal layer 106 is formed. The Ge crystal layer 106 may be formed such that the maximum width does not exceed double the distance by which defects may move when annealing is performed under prescribed conditions.

With the above-described configuration, the density of the defects is reduced in a region of the Ge crystal layer 106 excluding the defect trap. For example, when the Ge crystal layer 106 is epitaxially grown, lattice defects and the like may occur. The defects can move within the Ge crystal layer 106. As the temperature of the Ge crystal layer 106 increases, the movement speed also increases. Furthermore, the defects are trapped by the surface, the boundary, and the like of the Ge crystal layer 106.

By subjecting the Ge crystal layer 106 to annealing with the temperature and the duration being set as above, the defects can be moved within the Ge crystal layer 106 and trapped, for example, by the boundary between the Ge crystal layer 106 and the inhibition layer 104. In this way, the annealing causes the defects that were present within the Ge crystal layer 106 to get together at the boundary. Therefore, the density of the defects within the Ge crystal layer 106 is reduced. As a result, the surface of the Ge crystal layer 106 that is externally exposed through the opening 105 achieves better crystallinity than before the annealing.

This reduces the defects in an epitaxial thin film, thereby improving the performance of the electronic device 100. For example, when the surface of the Ge crystal layer 106 that is externally exposed in the opening 105 serves as a nucleus to grow the seed compound semiconductor crystal 108, the seed compound semiconductor crystal 108 accomplishes enhanced crystallinity. Furthermore, the use of the Ge crystal layer 106 with excellent crystallinity to constitute a semiconductor wafer makes it possible to form a high-quality thin film of such a type that cannot be directly grown on the Si crystal layer 166 because of lattice mismatch.

The Ge crystal layer 106 is locally formed in part of the region between the second compound semiconductor crystal 112 and the Si crystal layer 166, and may have a lattice match or a pseudo lattice match with the second compound semiconductor crystal 112. Thus, the Ge crystal layer 106 achieves a low density of defects.

As used herein, a low density of defects indicates a case where an average number of threading dislocations is 0.1 or smaller within a crystal layer of a prescribed size. Here, a threading dislocation is defined as a defect that penetrates through the Ge crystal layer 106. The case where the average number of threading dislocations is 0.1 is equivalent to a case where testing ten devices having an active layer of approximately 10 μm×10 μm discovers that one of the devices has threading dislocations. The case where the average number of threading dislocations is 0.1 is, in terms of dislocation density, equivalent to a case where the average dislocation density, which is measured by the etch-pit method or horizontal cross-section observation based on a transmission electron microscope (hereinafter, may be referred to as TEM), is approximately 1.0×105 cm-2 or lower.

The plane of the Ge crystal layer 106, the plane facing the seed compound semiconductor crystal 108, may be subjected to surface treatment with a P-containing gas. This can enhance the crystallinity of the film formed on the Ge crystal layer 106. The P-containing gas may be a gas containing $PH_3$ (phosphine).

The Ge crystal layer 106 can be formed, for example, by CVD or MBE (molecular beam epitaxy). The source gas used may be $GeH_4$. The Ge crystal layer 106 may be formed by CVD under the pressure of no less than 0.1 Pa and no more than 100 Pa. This makes the growth rate of the Ge crystal layer 106 less likely to be affected by the area of the opening 105. This results in the more uniform thickness for the Ge crystal layer 106, for example. In this case, a Ge crystal can be prevented from being deposited on the surface of the inhibition layer 104.

The Ge crystal layer 106 may be formed by CVD within an atmosphere that contains a halogen-containing gas as at least part of the source gas. The halogen-containing gas may be a hydrogen chloride gas or chlorine gas. In this manner, a Ge crystal can be prevented from being deposited on the surface of the inhibition layer 104 even when the Ge crystal layer 106 is formed by CVD under the pressure of 100 Pa or higher.

In the present embodiment, the case where the Ge crystal layer 106 is in contact with the surface of the SOI wafer 102 has been explained. However, the positional relationship between the Ge crystal layer 106 and the SOI wafer 102 is not limited to such. For example, any other layers may be disposed between the Ge crystal layer 106 and the SOI wafer 102. Here, one or more layers may be disposed between the Ge crystal layer 106 and the SOI wafer 102.

For example, the Ge crystal layer 106 is formed according to the following procedure. To begin with, a seed crystal is formed at a low temperature. The seed crystal may be $Si_xGe_{1-x}$ (0≤x<1). The seed crystal may be grown at a temperature of no less than 330° C. and no more than 450° C. After this, the temperature of the SOI wafer 102, on which the seed crystal has been formed, is raised to a prescribed level. Subsequently, the Ge crystal layer 106 may be formed.

The seed compound semiconductor crystal 108 may be grown from the Ge crystal layer 106 serving as a nucleus so that the upper portion of the seed compound semiconductor crystal 108 protrudes from the surface of the inhibition layer 104. For example, the seed compound semiconductor crystal 108 is grown within the opening 105 until protruding above the surface of the inhibition layer 104.

The seed compound semiconductor crystal 108 is, for example, a group IV, III-V, or II-VI compound semiconductor that has a lattice match or a pseudo lattice match with the Ge crystal layer 106. More specifically, the seed compound semiconductor crystal 108 may be GaAs, InGaAs, $Si_xGe_{1-x}$ (0≤x<1). A buffer layer may be formed between the seed compound semiconductor crystal 108 and the Ge crystal layer 106. The buffer layer has a lattice match or a pseudo lattice match with the Ge crystal layer 106. For example, the buffer layer includes a group III-V compound semiconductor layer containing P.

The seed compound semiconductor crystal 108 is an exemplary functional layer. The seed compound semiconductor crystal 108 is formed in contact with the Ge crystal layer 106. In other words, the seed compound semiconductor crystal 108 is grown on the Ge crystal layer 106. For example, the seed compound semiconductor crystal 108 is epitaxially grown.

The seed compound semiconductor crystal 108 has an arithmetic mean deviation of the profile (hereinafter, may be referred to as a Ra value) of 0.02 μm or smaller, preferably 0.01 μm or lower, for example. In this way, the seed compound semiconductor crystal 108 can be used to manufacture high-performance devices. Here, the Ra value is an index representing surface roughness and can be calculated based on JIS B0601-2001. The Ra value can be calculated by turning a roughness curve of a prescribed length at the center line and dividing the area defined by the roughness curve and the center line by the measured length.

The seed compound semiconductor crystal 108 may be grown at the rate of 300 nm/min or lower, preferably 200 nm/min or lower, more preferably 60 nm/min or lower. This can improve the Ra value of the seed compound semiconductor crystal 108 to be 0.02 μm or smaller. On the other hand, the seed compound semiconductor crystal 108 may be grown at the rate of 1 nm/min or higher, preferably 5 nm/min or higher. In this way, the seed compound semiconductor crystal 108 with a high quality is obtained without sacrificing the productivity. For example, the seed compound semiconductor crystal 108 may be grown at the rate of no less than 1 nm/min and no more than 300 nm/min.

In the present embodiment, the case where the seed compound semiconductor crystal 108 is formed on the surface of the Ge crystal layer 106 has been explained. However, the present invention is not limited to such. For example, an intermediate layer may be disposed between the Ge crystal layer 106 and the seed compound semiconductor crystal 108. The intermediate layer may be constituted by a single layer or by a plurality of layers. The intermediate layer may be formed at the temperature of 600° C. or lower, preferably 550° C. or lower. This improves the crystallinity of the seed compound semiconductor crystal 108. On the other hand, the intermediate layer may be formed at the temperature of 400° C. or higher. The intermediate layer may be formed at the temperature of no less than 400° C. and no more than 600° C. This improves the crystallinity of the seed compound semiconductor crystal 108. The intermediate layer is a GaAs layer that is formed at the temperature of 600° C. or lower, preferably 550° C. or lower, for example.

The seed compound semiconductor crystal 108 may be formed according to the following procedure. To begin with, an intermediate layer is formed on the surface of the Ge crystal layer 106. The intermediate layer is grown, for example, at the temperature of 600° C. or lower. After this, the temperature of the SOI wafer 102, on which the intermediate layer has been formed, is raised to a prescribed level. Subsequently, the seed compound semiconductor crystal 108 may be formed.

The first compound semiconductor crystal 110 may be laterally grown along the inhibition layer 104 from a prescribed plane of the seed compound semiconductor crystal 108 that protrudes above the surface of the inhibition layer 104, where the prescribed plane serves as the seed plane of the nucleus. When the SOI wafer 102 has a plane orientation of (100) and the opening 105 extends in the <001> direction, the seed planes of the seed compound semiconductor crystal 108 include the (110) plane and the plane equivalent to the (110) plane. When the opening 105 extends in the <011> direction, the seed planes of the seed compound semiconductor crystal 108 include the (111)A plane and the plane that is equivalent to the (111)A plane. Since the annealing or the like has improved the crystallinity of the seed compound semiconductor crystal 108, the first compound semiconductor crystal 110 with excellent crystallinity can be formed.

The first compound semiconductor crystal 110 may be a group IV, III-V, or II-VI compound semiconductor that has a lattice match or a pseudo lattice match with the seed compound semiconductor crystal 108. For example, the first compound semiconductor crystal 110 may be GaAs, InGaAs, $Si_xGe_{1-x}$ (0≤x<1).

The second compound semiconductor crystal 112 is laterally grown along the inhibition layer 104 by using, as a seed plane, a prescribed plane of the first compound semiconductor crystal 110. As mentioned earlier, the second compound semiconductor crystal 112 may be laterally grown in a different direction than the first compound semiconductor crystal 110.

The second compound semiconductor crystal 112 may have a lattice match or a pseudo lattice match with the Ge crystal layer 106. Since the second compound semiconductor crystal 112 is grown by using as a seed plane a particular plane of the first compound semiconductor crystal 110 with excellent crystallinity, the second compound semiconductor crystal 112 achieves excellent crystallinity. Thus, the second compound semiconductor crystal 112 has a defect-free region including no defects.

The second compound semiconductor crystal 112 may include a group II-VI or III-V compound semiconductor that has a lattice match or a pseudo lattice match with the Ge crystal layer 106. For example, the second compound semiconductor crystal 112 includes a GaAs or InGaAs layer.

The SOI wafer 102 may have a $Si_{1-x}Ge_x$ layer (0<x<1) therein in the portion at which the SOI wafer 102 is in contact with the Ge crystal layer 106, where the $Si_{1-x}Ge_x$ layer is in contact with the boundary between the SOI wafer 102 and the Ge crystal layer 106. In other words, the Ge atoms within the Ge crystal layer 106 may diffuse into the SOI wafer 102 to form a SiGe layer. In this case, the crystallinity of the epitaxial layer formed on the Ge crystal layer 106 can be improved. The average Ge composition x in the Si1-xGex layer can be 60% or higher in the region that is spaced, by a distance of no less than 5 nm and no more than 10 nm, away from the boundary between the SOI wafer 102 and the Ge crystal layer 106. In this case, the crystallinity of the epitaxial layer formed on the Ge crystal layer 106 can be particularly improved.

In the present embodiment, the case where the second compound semiconductor crystal 112 is laterally grown along the inhibition layer 104 by using as a seed plane a particular plane of the first compound semiconductor crystal 110 has been explained. Alternatively, however, the seed compound semiconductor crystal 108 and the first compound semiconductor crystal 110 may be integrally formed as a single-piece compound semiconductor crystal. The second compound semiconductor crystal 112 may be laterally grown on the inhibition layer 104 by using as a seed plane a particular plane of the single-piece compound semiconductor crystal. The single-piece seed compound semiconductor crystal may be grown from the Ge crystal layer 106 serving as a nucleus and protrude above the surface of the inhibition layer 104. In this manner, the inhibition layer 104 is at least partially positioned between the second compound semiconductor crystal 112 and the insulating layer 164 of the SOI wafer 102.

On the defect-free region of the second compound semiconductor crystal 112, an active element having an active region may be formed. The active element is, for example, a MISFET including the gate insulator 114, the gate electrode 116, and the source/drain electrodes 118. The MISFET may be a metal-oxide-semiconductor field-effect transistor (MOSFET). The active element may alternatively be a HEMT.

The gate insulator 114 electrically insulates the gate electrode 116 from the second compound semiconductor crystal 112. The gate insulator 114 is, for example, an AlGaAs film, an AlInGaP film, a silicon oxide film, a silicon nitride film, an aluminum oxide film, a gallium oxide film, a gadolinium oxide film, a hafnium oxide film, a zirconium oxide film, a lanthanum oxide film, and a mixture or a multilayer film of these insulating films.

The gate electrode 116 may be an exemplary control electrode. The gate electrode 116 controls the current or voltage between the input and the output, for example, the source and the drain. The gate electrode 116 may include a metal such as aluminum, copper, gold, silver, platinum, and tungsten, a highly-doped semiconductor such as silicon, tantalum nitride, a metallic silicide or the like.

The source/drain electrodes 118 may be exemplary input and output electrodes. The source/drain electrodes 118 are respectively in contact with the source and drain regions. The source/drain electrodes 118 may include a metal such as aluminum, copper, gold, silver, platinum, and tungsten, a highly-doped semiconductor such as silicon, tantalum nitride, a metallic silicide or the like.

Under the source/drain electrodes 118, the source and drain regions are formed but not shown in the drawings. An active layer, which is positioned under the gate electrode 116 and in which a channel region is to be formed between the source region and the drain region, may be the second compound semiconductor crystal 112 itself or a layer formed on the second compound semiconductor crystal 112. A buffer layer may be formed between the second compound semiconductor crystal 112 and the active layer. The active layer or buffer layer can be, for example, a GaAs layer, an InGaAs layer, an AlGaAs layer, an InGaP layer, a ZnSe layer or the like.

As shown in FIG. 3, the electronic device 100 has six MISFETs. The six MISFETs are divided into two groups of three MISFETs, and the three MISFETs in each group are connected to each other by the interconnections of the gate electrode 116 and the source/drain electrodes 118. A plurality of second compound semiconductor crystals 112, each of which is grown from one of a plurality of Ge crystal layers 106 formed on the SOI wafer 102, are formed on the inhibition layer 104 so as not to be in contact with each other.

Since the second compound semiconductor crystals 112 are not in contact with each other, no boundaries are formed between adjacent second compound semiconductor crystals 112. Therefore, no defects are generated resulting from such boundaries. Active elements, which are to be formed on the second compound semiconductor crystals 112, only require excellent crystallinity for their active layers. Thus, the active elements are not adversely affected by the fact that the second compound semiconductor crystals 112 are not in contact with each other.

To increase the driving currents applied to each of the active elements, the active elements are, for example, connected to each other in parallel. In the electronic device shown as an example in FIGS. 3 to 5, two MISFETs are formed with an opening 105 therebetween. Such two MISFETs may be spaced away from each other by removing the compound semiconductor layer based on etching or the like, or by inactivating the compound semiconductor layer based on ion implantation or the like.

In the present embodiment, the case where the seed crystal layer includes a Ge crystal formed by crystal growth has been explained. The seed crystal layer may include $Si_xGe_{1-x}$ ($0 \leq x < 1$). The seed crystal layer may include $Si_xGe_{1-x}$ with a low content of Si. The seed crystal layer may include GaAs that is formed at the temperature of 500° C. or lower. The seed crystal layer may include a plurality of layers.

In the present embodiment, the case where the Si wafer 162, the insulating layer 164, the Si crystal layer 166, the Ge crystal layer 106, and the compound semiconductor that has a lattice match or a pseudo lattice match with the annealed Ge crystal layer 106 are arranged in the stated order in the substantially perpendicular direction to the main plane 172 of the Si wafer 162 has been explained. However, the positional relations between the respective components are not limited in this regard. For example, the compound semiconductor may be in contact with at least one among the planes of the Ge crystal layer 106, the planes being substantially perpendicular to the main plane 172 of the Si wafer 162 and have a lattice match or a pseudo lattice match with the Ge crystal layer 106. In this case, the Ge crystal layer 106 and the compound semiconductor are arranged adjacent to each other in the substantially parallel direction to the main plane 172 of the Si wafer 162.

In the present embodiment, the case where the inhibition layer 104 is formed on the Si crystal layer 166, and the Ge crystal layer 106 is formed within the opening 105 in the inhibition layer 104 has been explained. However, the present invention is not limited in this regard. After the Ge crystal layer 106 has been formed, the inhibition layer 104 may be formed in a region in which the Ge crystal layer 106 is not formed. For example, the electronic device 100 may include the Si wafer 162, the insulating layer 164, the Si crystal layer 166, and the annealed Ge crystal layer 106 in the stated order. The electronic device 100 may also include the inhibition layer 104 that is formed by thermally oxidizing the Si crystal layer 166 while using the annealed Ge crystal layer 106 as a mask. The electronic device 100 may also include a compound semiconductor that has a lattice match or a pseudo lattice match with the annealed Ge crystal layer 106.

In this case, the inhibition layer 104 is formed along the lateral planes of the Ge crystal layer 106 to have the larger thickness than the Ge crystal layer 106. As a result, a recess is formed to be centered around the Ge crystal layer 106. The recess may be an example of the opening 105. In this case, the aspect ratio of the opening 105, which is calculated by dividing the depth of the opening by the width of the opening, can be calculated by dividing the distance between the upper plane of the Ge crystal layer 106 to the upper plane of the inhibition layer 104 by the width of the Ge crystal layer 106.

Figure 6:
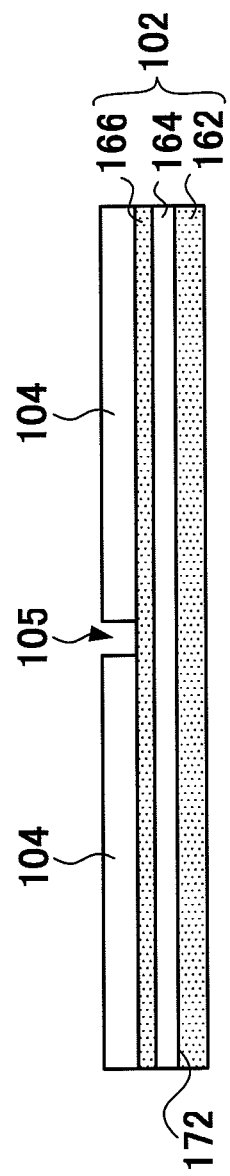
FIG. 6 illustrates an exemplary cross-section during the manufacturing process of the electronic device 100.

FIGS. 6 to 10 show exemplary cross-sections observed during the manufacturing process of the electronic device 100. FIG. 6 illustrates an exemplary cross-section taken along the line A-A of FIG. 3 in a step during the manufacturing process. As shown in FIG. 6, the SOI wafer 102 is provided that includes the Si wafer 162, the insulating layer 164, and the Si crystal layer 166 in the stated order. The SOI wafer 102 may be commercially available. Subsequently, the inhibition layer 104, which is to inhibit crystal growth, is formed on the Si crystal layer 166 of the SOI wafer 102. The inhibition layer 104 can be, for example, formed by chemical vapor deposition (CVD), sputtering. In the inhibition layer 104, the opening 105 is formed that penetrates through the inhibition layer 104 to reach the SOI wafer 102. The opening 105 can be, for example, formed by photolithography. Alternatively, the inhibition layer 104 can also be formed by thermally oxidizing part of the Si crystal layer 166.

Figure 7:
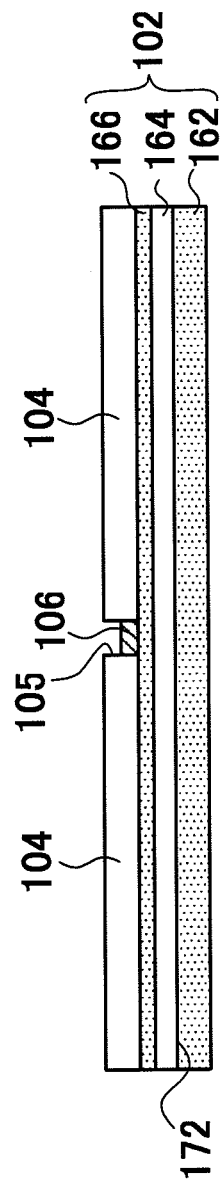
FIG. 7 illustrates an exemplary cross-section during the manufacturing process of the electronic device 100.

FIG. 7 illustrates an exemplary cross-section taken along the line A-A of FIG. 3 during the manufacturing process. As shown in FIG. 7, the Ge crystal layer 106 is formed within the opening 105. In this manner, the SOI wafer 102 is provided that includes in at least part thereof the Si wafer 162, the insulating layer 164, the Si crystal layer 166, and the Ge crystal layer 106 in the stated order. The Ge crystal layer 106 may be subjected to annealing.

Figure 8:
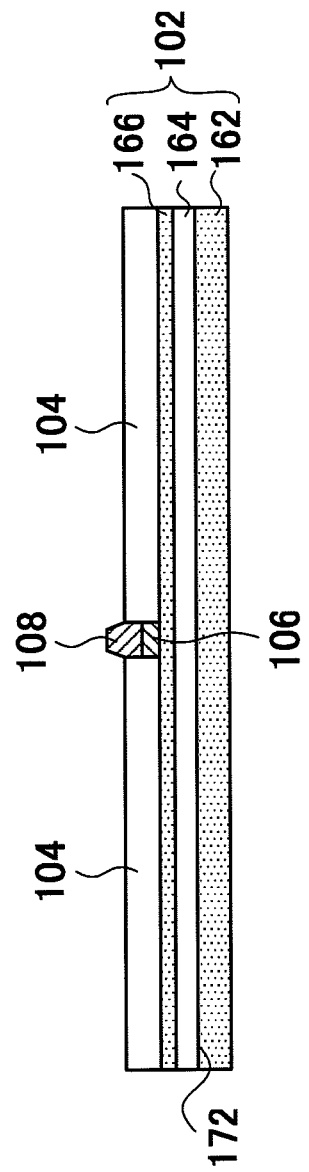
FIG. 8 illustrates an exemplary cross-section during the manufacturing process of the electronic device 100.

FIG. 8 illustrates an exemplary cross-section taken along the line A-A of FIG. 3 in the subsequent step during the manufacturing process. As shown in FIG. 8, the seed compound semiconductor crystal 108 is formed using the Ge crystal layer 106 serving as a nucleus so as to become convex with respect to the surface of the inhibition layer 104. In other words, the seed compound semiconductor crystal 108 protrudes above the surface of the inhibition layer 104.

A prescribed plane of the seed compound semiconductor crystal 108 is used as a seed plane to form the first compound semiconductor crystal 110. The cross-section observed at this stage is similar to the cross-section shown in FIG. 5. When forming GaAs exemplifying the seed compound semiconductor crystal 108 and the first compound semiconductor crystal 110, an epitaxial growth method using MOCVD or MBE that uses organic metals as the source can be used. In this case, trimethyl gallium (TM-Ga), $AsH_3$ (arsine) and other gases can be used as the source gas. The growth can take place at the temperature of no less than 600° C. and no more than 700° C., for example.

Figure 9:
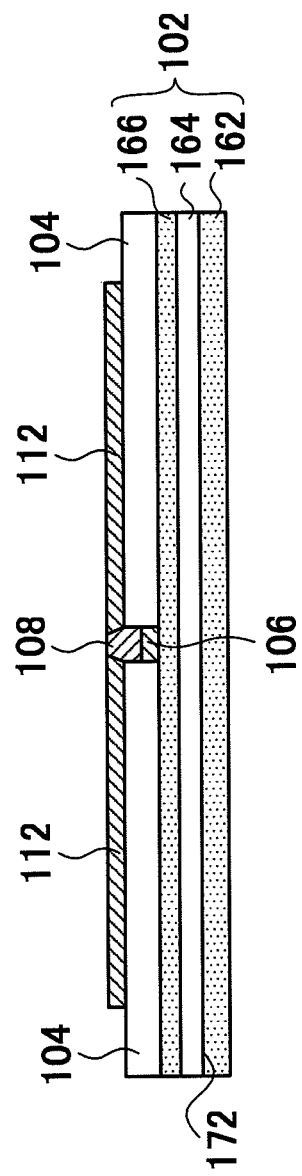
FIG. 9 illustrates an exemplary cross-section during the manufacturing process of the electronic device 100.

FIG. 9 illustrates an exemplary cross-section taken along the line A-A of FIG. 3 in the subsequent step during the manufacturing process. As shown in FIG. 9, the second compound semiconductor crystal 112 is laterally grown on the inhibition layer 104 by using a prescribed plane of the first compound semiconductor crystal 110 as a seed plane. When forming GaAs exemplifying the second compound semiconductor crystal 112, an epitaxial growth method using MOCVD or MBE that uses organic metals as the source can be used. In this case, trimethyl gallium (TM-Ga), $AsH_3$ (arsine) and other gases can be used as the source gas.

For example, the lateral growth preferably takes place at low temperatures to facilitate the lateral growth on the (001) plane. Specifically speaking, the growth may be controlled to take place at the temperature of 700° C. or lower, preferably at the temperature of 650° C. or lower. For example, the lateral growth preferably takes place with the partial pressure of $AsH_3$ being set high when taking place in the <110> direction. More particularly, the lateral growth is preferably controlled to take place with the partial pressure of $AsH_3$ being set at $1 \times 10^{-3}$ atom or higher. In this manner, the growth rate in the <110> direction can be controlled to be higher than the growth rate in the <-110> direction.

Figure 10:
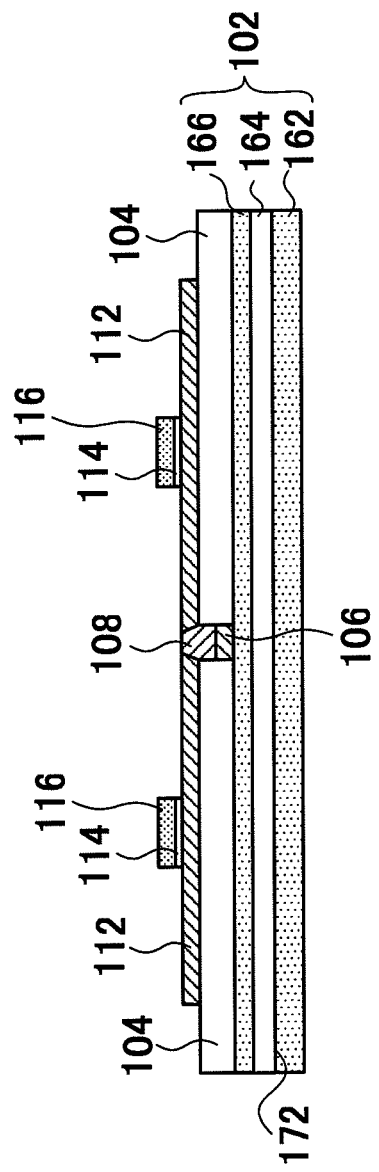
FIG. 10 illustrates an exemplary cross-section during the manufacturing process of the electronic device 100.

FIG. 10 illustrates an exemplary cross-section taken along the line A-A of FIG. 3 in the subsequent step during the manufacturing process. As shown in FIG. 10, an insulating film that is to be formed into the gate insulator 114 and a conductive film that is to be formed into the gate electrode 116 are sequentially formed on the second compound semiconductor crystal 112. The formed conductive and insulating films are patterned, for example, by photolithography. As a result of the patterning, the gate insulator 114 and the gate electrode 116 are formed. After this, a conductive film that is to be formed into the source/drain electrodes 118 is formed. The formed conductive film is patterned, for example, by photolithography. As a result of the patterning, the electronic device 100 shown in FIG. 4 is obtained.

Figure 11:
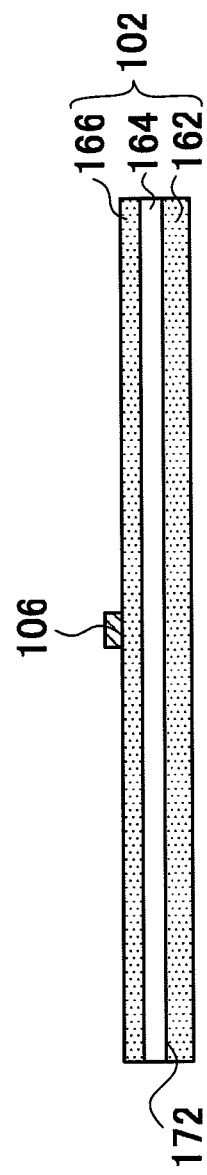
FIG. 11 illustrates an exemplary cross-section during another manufacturing process of the electronic device 100.
Figure 12:
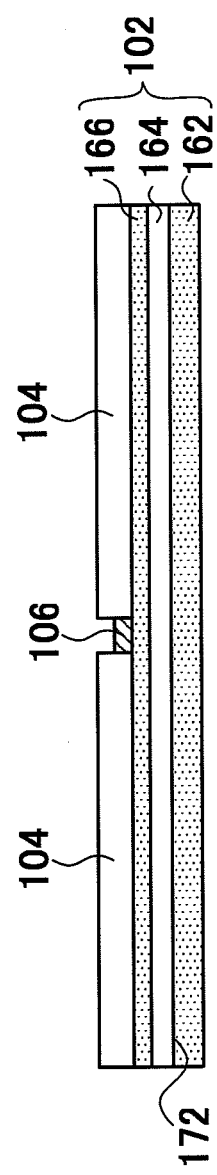
FIG. 12 illustrates an exemplary cross-section during another manufacturing process of the electronic device 100.

FIGS. 11 and 12 illustrate exemplary cross-sections that are observed during a different manufacturing process for the electronic device 100. As shown in FIG. 13, the SOI wafer 102 is provided that includes in at least part thereof the Si wafer 162, the insulating layer 164, the Si crystal layer 166, and the Ge crystal layer 106 in the stated order. The Ge crystal layer 106 is patterned by etching or the like into a single Ge crystal layer 106 or a plurality of discrete Ge crystal layers 106.

For example, the Ge crystal layer 106 is formed on the Si crystal layer 166 of the SOI wafer 102 by forming a crystalline Ge film on the SOI wafer 102 and then removing the Ge film except for its partial region based on etching. The etching can be performed, for example, by photolithography. The Ge crystal layer 106 may have a maximum width of 5 µm or smaller, preferably 2 µm or smaller. As used herein, "a width" is defined as a length in the substantially parallel direction to one of the main planes of the SOI wafer 102.

As shown in FIG. 12, the inhibition layer 104 is formed in a region on the SOI wafer 102 in which the Ge crystal layer 106 is not formed. The inhibition layer 104 is formed, for example, by local oxidization while using the Ge crystal layer 106 as an oxidization-resistant mask. The subsequent steps are similar to the steps starting from the one in FIG. 8.

FIG. 13 is an exemplary plan view illustrating an electronic device 200. FIG. 13 does not show gate, source, and drain electrodes. In the electronic device 200, a second compound semiconductor crystal 112 may include a defect trap 120 to trap defects. The defect trap 120 may start from an opening 105 in which a Ge crystal layer 106 and a seed compound semiconductor crystal 108 are formed and terminates at the edges of the second compound semiconductor crystal 112.

The position of the defect trap 120 is controlled, for example, by forming the opening 105 at a prescribed position. Here, the prescribed position is appropriately designed depending on the purpose of the electronic device 200. There may be a plurality of openings 105. The openings 105 may be arranged at equal intervals. The openings 105 may be formed according to some rules, for example, periodically. In each of the openings 105, the seed compound semiconductor crystal 108 is formed.

Figure 14:
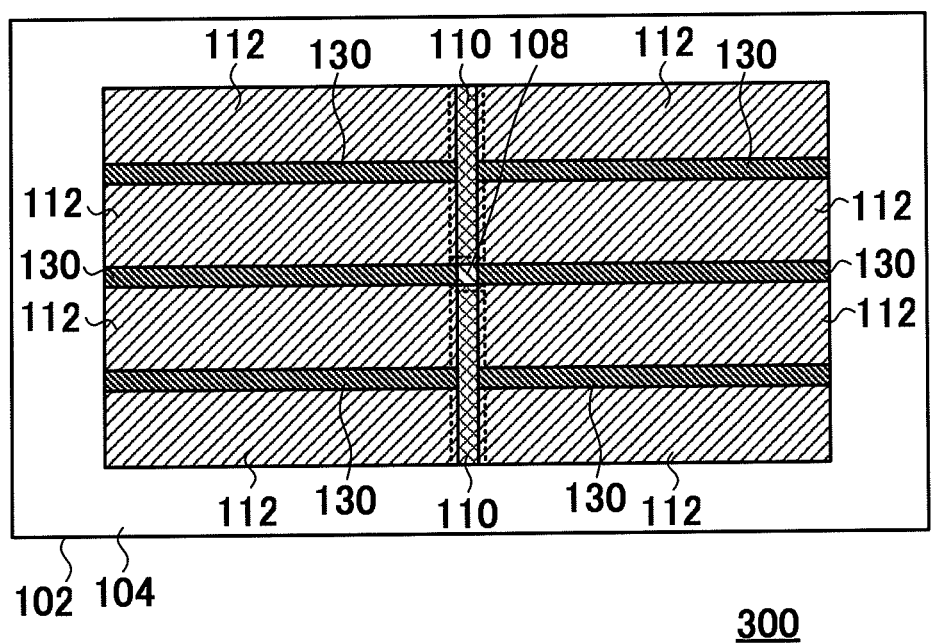
FIG. 14 is an exemplary plan view illustrating an electronic device 300.

FIG. 14 is an exemplary plan view illustrating an electronic device 300. FIG. 14 does not show gate, source, and drain electrodes. In the electronic device 300, a second compound semiconductor crystal 112 has a defect trap 130 in addition to the defect trap 120 described with reference to the electronic device 200. The defect trap 130 starts from the seed plane of the first compound semiconductor crystal 110 or defect centers formed in the inhibition layer 104 at prescribed intervals and terminates at the edges of the second compound semiconductor crystal 112.

The defect centers may be formed by physically damaging the seed plane or the inhibition layer 104. The methods to physically damage the seed plane or the inhibition layer 104 include, for example, mechanical scratching, friction, and ion implantation. Here, the prescribed interval is appropriately designed depending on the purpose of the electronic device 300. There may be a plurality of defect centers. The defect centers may be arranged at equal intervals. The defect centers may be formed according to some rules, for example, periodically.

The defect traps 120 and 130 may be formed during the crystal growth step for the second compound semiconductor crystal 112. If the defect traps 120 and 130 are formed, the defects present within the second compound semiconductor crystal 112 can gather to the defect traps 120 and 130. This can reduce stress and other problems in the region of the second compound semiconductor crystal 112 that excludes the defect traps 120 and 130 and can thus improve the crystallinity in the region. In this manner, defects can be reduced in the region of the second compound semiconductor crystal 112 in which an electronic device is to be formed.

When a compound semiconductor is laterally grown on the (100) plane of the SOI wafer 102, the growth takes place more easily in the <011> direction of a silicon wafer than in the <0-11> direction of the SOI wafer 102. When the compound semiconductor is grown in the <0-11> direction of the SOI wafer 102, the (111)B plane of the compound semiconductor appears at the end plane of the laterally grown compound semiconductor. This (111)B plane is stable and thus likely to be flat. Accordingly, a gate insulator, a source electrode, a gate electrode, and a drain electrode are formed to manufacture an electronic device on the (111)B plane of the compound semiconductor.

On the other hand, when the compound semiconductor is laterally grown in the <011> direction of the SOI wafer 102, the (111)B plane of the compound semiconductor inversely appears at the end plane of the laterally-grown compound semiconductor. In this case, a large (100) plane can be obtained on the upper side. Thus, an electronic device can be formed on the (100) plane. In addition, the compound semiconductor can be also laterally grown in either of the <010> and <001> directions of the SOI wafer 102 with the partial pressure of the arsine being set high. When the compound semiconductor is grown in either of these directions, the (110) or (101) plane of the compound semiconductor is likely to appear at the end plane of the laterally grown compound semiconductor. It is also possible to form a gate insulator, a source electrode, a gate electrode, and a drain electrode to manufacture an electronic device on the (110) or (101) plane of the compound semiconductor.

Figure 15:
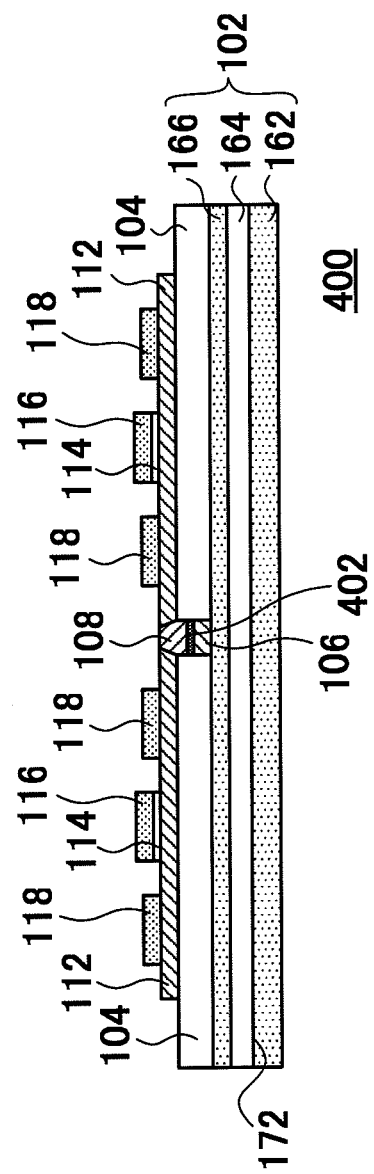
FIG. 15 is an exemplary cross-sectional view illustrating an electronic device 400.

FIG. 15 is an exemplary cross-sectional view illustrating an electronic device 400. The exemplary cross-section shown in FIG. 15 is equivalent to the cross-section taken along the line A-A in FIG. 3. The electronic device 400 may have the same configuration as the electronic device 100 except for that a buffer layer 402 is provided.

The buffer layer 402 has a lattice match or a pseudo lattice match with the Ge crystal layer 106. The buffer layer 402 is formed between the Ge crystal layer 106 and the seed compound semiconductor crystal 108. The buffer layer 402 may be a group III-V compound semiconductor containing P. The buffer layer 402 may be, for example, an InGaP layer. The InGaP layer can be, for example, formed by epitaxial growth.

The InGaP layer is, for example, formed by MOCVD or MBE that uses organic metals as the source. These growth techniques use, as the source gas, trimethyl gallium (TM-Ga), trimethyl indium (TM-In), $PH_3$ (phosphine), for example. When the InGaP layer is epitaxially grown, the crystalline thin film is formed at the temperature of 650° C., for example. The presence of the buffer layer 402 further improves the crystallinity of the seed compound semiconductor crystal 108.

In the case of $PH_3$ treatment, the temperature is preferably set no less than 500° C. and no more than 900° C., for example. This temperature range is preferable since no effects are produced in the case of lower than 500° C. and the Ge crystal layer 106 is modified in the case of higher than 900° C. A more preferable temperature range may be, for example, no less than 600° C. and no more than 800° C. During the exposure, $PH_3$ may be activated by plasmas or the like.

The buffer layer 402 may be a single layer or a plurality of layers. The buffer layer 402 may be formed at the temperature of 600° C. or lower, preferably 550° C. or lower. This improves the crystallinity of the seed compound semiconductor crystal 108. The buffer layer 402 may be a GaAs layer formed at the temperature of 600° C. or lower, preferably 550° C. or lower. The buffer layer 402 may be formed at the temperature of 400° C. or higher. In this case, the plane of the Ge crystal layer 106, the plane facing the buffer layer 402, may be subjected to surface treatment with a gaseous P compound.

Figure 16:
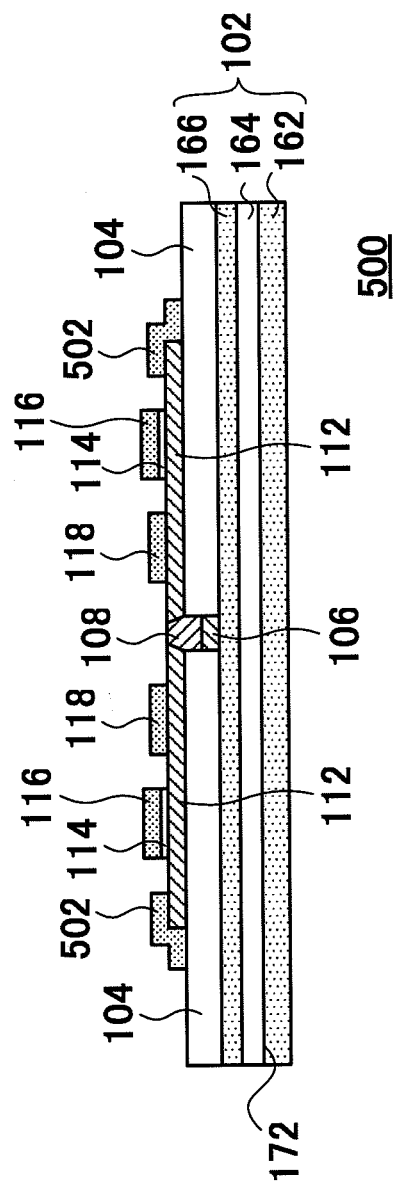
FIG. 16 is an exemplary cross-sectional view illustrating an electronic device 500.

FIG. 16 is an exemplary cross-sectional view illustrating an electronic device 500. The exemplary cross-section shown in FIG. 16 is equivalent to the cross-section taken along the line A-A in FIG. 3. The electronic device 500 may have the same configuration as the electronic device 100 except for that source/drain electrodes 502 are differently positioned. In the electronic device 500, a MISFET has a source/drain electrode 118 and a source/drain electrode 502.

The source/drain electrode 502 is an exemplary first input/output electrode. The source/drain electrode 118 is an exemplary second input/output electrode. As shown in FIG. 16, the growing plane of the second compound semiconductor crystal 112 is covered with the source/drain electrode 502. Stated differently, the source/drain electrode 502 is also formed on the lateral plane of the second compound semiconductor crystal 112.

By forming the source/drain electrode 502 so as to also cover the lateral plane of the second compound semiconductor crystal 112, the input/output electrode can be positioned so as to intersect with the extended line in the direction in which carriers move in the second compound semiconductor crystal 112 or the active layer formed thereon (may sometimes be referred to as the carrier movement layer). This facilitates the movement of the carriers, thereby improving the performance of the electronic device 500.

Figure 17:
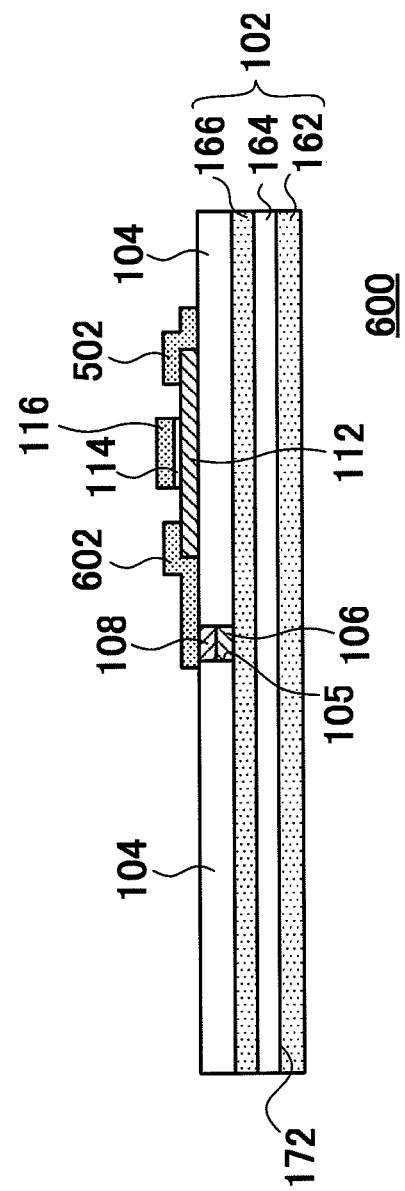
FIG. 17 is an exemplary cross-sectional view illustrating an electronic device 600.

FIG. 17 is an exemplary cross-sectional view illustrating an electronic device 600. The exemplary cross-section shown in FIG. 17 is equivalent to the cross-section taken along the line A-A in FIG. 3. The electronic device 600 may have the same configuration as the electronic device 500 except for that source/drain electrodes 602 are differently positioned. In the electronic device 600, a MISFET has a source/drain electrode 602 and the source/drain electrode 502.

The region of the second compound semiconductor crystal 112 that is positioned above the opening 105 has been removed, for example, by etching. The etching externally exposes a lateral plane of the second compound semiconductor crystal 112. As shown in FIG. 17, the externally exposed lateral plane of the second compound semiconductor crystal 112 is covered with the source/drain electrode 602. This further facilitates the movement of the carriers in the electronic device 600, thereby further improving the performance of the electronic device 600. The Ge crystal layer 106 may be first formed by etching a Ge film and the inhibition layer 104 may be then formed in the region in which the Ge crystal layer 106 is not formed. In this case, the region in which the Ge crystal layer 106 is formed serves as the opening 105.

The source/drain electrode 602 is connected to the Si crystal layer 166 via the Ge crystal layer 106 or the seed compound semiconductor crystal 108 in the opening 105 externally exposed by the etching. This, for example, enables the potential of one of the input/output terminals of the MISFET to be maintained at the wafer potential, thereby reducing noise.

Figure 18:
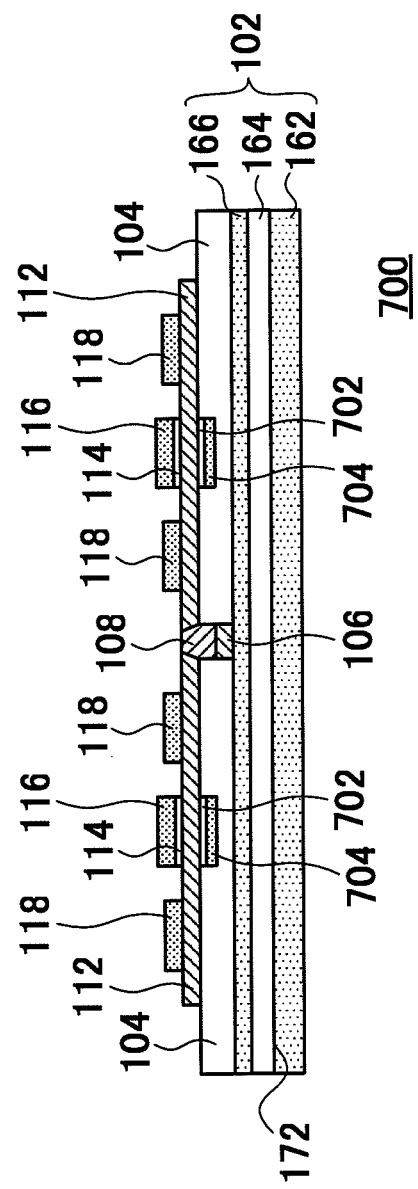
FIG. 18 is an exemplary cross-sectional view illustrating an electronic device 700.

FIG. 18 is an exemplary cross-sectional view illustrating an electronic device 700. The exemplary cross-section shown in FIG. 18 is equivalent to the cross-section taken along the line A-A in FIG. 3. The electronic device 700 has the same configuration as the electronic device 100 except for that a lower gate insulator 702 and a lower gate electrode 704 are provided.

The lower gate electrode 704 opposes the gate electrode 116 with the second compound semiconductor crystal 112 being sandwiched therebetween. The lower gate electrode 704 may be formed in a groove formed in the surface of the inhibition layer 104. The lower gate insulator 702 is formed between the lower gate electrode 704 and the second compound semiconductor crystal 112.

By disposing the gate electrode 116 and the lower gate electrode 704 as described above in the electronic device 700, a double gate structure can be easily realized. This can accomplish better gate control and thus improve the switching and other capabilities of the electronic device 700.

FIG. 19 is an exemplary plan view illustrating a semiconductor wafer 801. The semiconductor wafer 801 has, on an SOI wafer 802, a region 803 in which an element is famed. A plurality of regions 803 are provided on the surface of the SOI wafer 802, as shown in FIG. 19. The regions 803 are arranged at equal intervals.

The SOI wafer 802 is equivalent to the SOI wafer 102. In other words, the Ge crystal layers 106 are arranged at equal intervals on the Si crystal layer 166.

Figure 20:
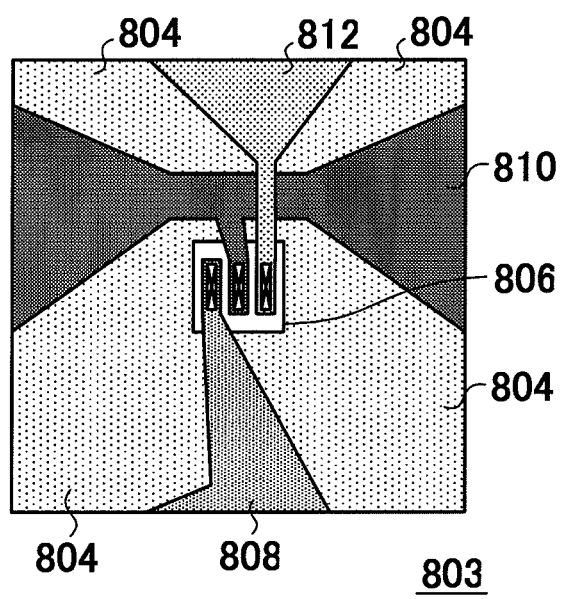
FIG. 20 is an enlargement view illustrating a region 803.

FIG. 20 illustrates, as an example, the region 803. In the region 803, an inhibition layer 804 is formed. The inhibition layer 804 is equivalent to the inhibition layer 104 of the electronic device 100. The inhibition layer 804 is insulative. The inhibition layer 804 is, for example, one of a silicon oxide layer, a silicon nitride layer, a silicon oxynitride layer, and an aluminum oxide layer, or a multilayer film of these layers. An opening 806 is equivalent to the opening 105 of the electronic device 100. In other words, the opening 806 has the same aspect ratio and area as the opening 105. Here, a plurality of inhibition layers 804 are formed on the SOI wafer 802. The inhibition layers 804 are spaced away from each other. For example, each inhibition layer 804 is shaped as a square with a side of no less than 50 µm and no more than 400 µm. The inhibition layers 804 may be arranged at equal intervals of no less than 50 µm and no more than 500 µm.

In the semiconductor wafer 801 of the present embodiment, a heterojunction bipolar transistor (hereinafter, may be referred to as HBT) is formed as an electronic element in the opening 806 shown in FIG. 22. On the inhibition layer 804 that surrounds the opening 806, a collector electrode 808 to be connected to the collector of the HBT, an emitter electrode 810 to be connected to the emitter, and a base electrode 812 to be connected to the base are formed. The electrodes can be replaced by interconnections or interconnection bonding pads. Here, HBTs are shown as exemplary electronic elements, and one HBT may be formed in each opening 806. The electronic elements may be connected to each other or connected in parallel.

Figure 21:
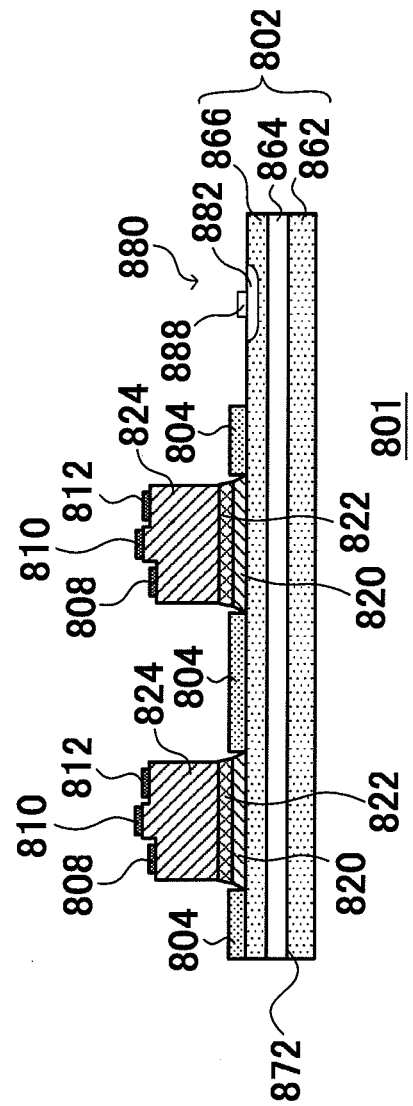
FIG. 21 is an exemplary cross-sectional view illustrating the semiconductor wafer 801 together with a HBT formed within an opening 806 in a covering region that is covered with an inhibition layer 804.

FIG. 21 is an exemplary cross-sectional view illustrating the semiconductor wafer 801 together with a HBT formed within the opening 806 in a covering region that is covered with the inhibition layer 804. The semiconductor wafer 801 includes the SOI wafer 802, the inhibition layer 804, the Ge crystal layer 820, a buffer layer 822, and a compound semiconductor functional layer 824.

In at least a partial region of the SOI wafer 802, a Si wafer 862, an insulating layer 864, and a Si crystal layer 866 are arranged in the stated order. The Si wafer 862, the insulating layer 864, and the Si crystal layer 866 are equivalent to the Si wafer 162, the insulating layer 164, and the Si crystal layer 166 of the electronic device 100. The Si wafer 862 has a main plane 872. The main plane 872 is equivalent to the main plane 172 of the Si wafer 162.

The inhibition layer 804 is formed on the Si crystal layer 866 to inhibit crystal growth of the compound semiconductor functional layer 824. The inhibition layer 804 inhibits epitaxial growth of the compound semiconductor functional layer 824. The inhibition layer 804 is equivalent to the inhibition layer 104.

The inhibition layer 804 is provided to cover part of the Si crystal layer 866. In the inhibition layer 804, the opening 806 is formed that penetrates through the inhibition layer 804 to reach the Si crystal layer 866. The surface of the inhibition layer 804 may be shaped as a square, and the opening 806 may be positioned at the center of the surface of the inhibition layer 804. The inhibition layer 804 may be in contact with the Si crystal layer 866.

The Ge crystal layer 820 has the same configuration as the Ge crystal layer 106. For example, the Ge crystal layer 820 is grown within the opening 806 in the inhibition layer 804. The Ge crystal layer 820 is selectively grown within the opening 806.

The inhibition layer 804 inhibits epitaxial growth on the surface of the inhibition layer 804. Thus, the Ge crystal layer 820 is not formed on the surface of the inhibition layer 804. On the other hand, the Ge crystal layer 820 is formed on the Si crystal layer 866 within the opening 806 since the region of the Si crystal layer 866 that is externally exposed through the opening 806 is not covered by the inhibition layer 804. The Ge crystal layer 820 may be in contact with the Si crystal layer 866 or formed on the Si crystal layer 866 with an intermediate layer disposed therebetween.

The buffer layer 822 has a lattice match or a pseudo lattice match with the Ge crystal layer 820. The buffer layer 822 has the same configuration as the buffer layer 402. The buffer layer 822 is sandwiched between the Ge crystal layer 820 and the compound semiconductor functional layer 824. The buffer layer 822 may be a group III-V compound semiconductor layer containing P. For example, the buffer layer 822 is an InGaP layer. The InGaP layer is epitaxially grown, for example.

When the InGaP layer is epitaxially grown in contact with the Si crystal layer 866, the InGaP layer is not formed on the surface of the inhibition layer 804 and selectively grown on the surface of the Ge crystal layer 820. As another example, the buffer layer 822 may be a GaAs layer that is grown on the Si crystal layer 866 at the temperature of 500° C. or lower. The semiconductor wafer 801 may be realized without the buffer layer 822. In this case, the plane of the Ge crystal layer 820, the plane facing the compound semiconductor functional layer 824, may be subjected to surface treatment with a P-containing gas.

The compound semiconductor functional layer 824 has a lattice match or a pseudo lattice match with the Ge crystal layer 820. The compound semiconductor functional layer 824 is used, for example, for manufacturing a HBT. The HBT is shown as an exemplary electronic element. The compound semiconductor functional layer 824 may be in contact with the Ge crystal layer 820. In other words, the compound semiconductor functional layer 824 may be in contact with the Ge crystal layer 820 or formed on the Ge crystal layer 820 with the buffer layer 822 disposed therebetween. The compound semiconductor functional layer 824 may be formed by crystal growth. For example, the compound semiconductor functional layer 824 is formed by epitaxial growth.

The compound semiconductor functional layer 824 may be a group III-V or II-VI compound layer that has a lattice match or a pseudo lattice match with the Ge crystal layer 820. The compound semiconductor functional layer 824 may be a group III-V compound layer that has a lattice match or a pseudo lattice match with the Ge crystal layer 820, and contain at least one among Al, Ga, and In as the group III element and at least one among N, P, As, and Sb as the group V element. For example, the compound semiconductor functional layer 824 is a GaAs or InGaAs layer.

In the compound semiconductor functional layer 824, a HBT is formed as an electronic element. Here, the present embodiment takes an HBT as an example of the electronic element formed in the compound semiconductor functional layer 824. The electronic element, however, is not limited to an HBT, but may alternatively be a light emitting diode, a high electron mobility transistor (hereinafter, may be referred to as HEMT), a solar cell, or a thin film sensor, for example.

On the surface of the compound semiconductor functional layer 824, a collector mesa, an emitter mesa, and a base mesa for the HBT are formed. The collector electrode 808, the emitter electrode 810, and the base electrode 812 connected to contact holes are formed on the surfaces of the collector mesa, the emitter mesa, and the base mesa. The compound semiconductor functional layer 824 includes the collector, emitter, and base layers of the HBT. Specifically speaking, the collector layer is formed on the buffer layer 822, the emitter layer is formed between the buffer layer 822 and the collector layer, and the base layer is formed between the buffer layer 822 and the emitter layer.

The collector layer may be a multilayer film obtained by stacking an n$^+$GaAs layer having a carrier concentration of $3.0\times10^{18}$ cm$^{-3}$ and the thickness of 500 nm and an n$^-$GaAs layer having a carrier concentration of $1.0\times10^{16}$ cm$^{-3}$ and the thickness of 500 nm in the stated order. The emitter layer may be a multilayer film obtained by stacking an n$^-$InGaP layer having a carrier concentration of $3.0\times10^{17}$ cm$^{-3}$ and the thickness of 30 nm, an n$^+$GaAs layer having a carrier concentration of $3.0\times10^{18}$ cm$^{-3}$ and the thickness of 100 nm, and an n$^+$InGaAs layer having a carrier concentration of $1.0\times10^{19}$ cm$^{-3}$ and the thickness of 100 nm in the stated order. The base layer may be a p$^-$GaAs layer having a carrier concentration of $5.0\times10^{19}$ cm$^{-3}$ and the thickness of 50 nm. It should be noted that the above-mentioned carrier concentration and thickness values are designed values.

A MISFET 880 may be formed in at least part of the region of the Si layer in which the compound semiconductor functional layer 824 is not formed. As shown in FIG. 21, the MISFET 880 may include a well 882 and a gate electrode 888. Although not shown in FIG. 21, the MISFET 880 may have a source region and a drain region formed in the well 882. Furthermore, a gate insulator may be formed between the well 882 and the gate electrode 888.

The Si layer other than the compound semiconductor functional layer 824 may be the Si wafer 862 or the Si crystal layer 866. The MISFET 880 may be formed in a region of the Si crystal layer 866 that is not covered by the Ge crystal layer 820.

The Si wafer 862 may be a single crystal Si wafer. In this case, the MISFET 880 may be formed in a region of the single crystal Si wafer that is covered neither by the Ge crystal layer 820 nor by the insulating layer 864. On the Si wafer 862 or the Si crystal layer 866, there may be not only electronic elements such as active and functional elements that are formed by processing the Si layer but also at least one among interconnections formed on the Si layer, interconnections including Si, electronic circuits formed by combinations of the interconnections, and micro electro mechanical systems (MEMS).

In the present embodiment, the case where the seed crystal layer includes a grown Ge crystal formed by crystal growth has been explained. The present invention, however, is not limited in this regard. For example, the seed crystal layer may be made of Si$_x$Ge$_{1-x}$ (0≤x<1) as in the electronic device 100. The seed crystal layer may be made of Si$_x$Ge$_{1-x}$ with a low Si content. The seed crystal layer may include a GaAs or InGaAs layer formed at the temperature of 500° C. or lower.

EXEMPLARY EMBODIMENTS

Exemplary Embodiment 1

In accordance with the procedure shown in FIGS. 6 and 7, the semiconductor wafer was fabricated that has, on the SOI wafer 102, the inhibition layer 104 in which the openings 105 are formed and the Ge crystal layers 106 grown within the openings 105. On the SOI wafer 102, 25,000 Ge crystal layers 106 were fabricated. Furthermore, in accordance with the procedure shown in FIGS. 6 to 10, the electronic device 100 was fabricated in each Ge crystal layer 106. Accordingly, 25,000 electronic devices were fabricated.

The Si wafer 162 of the SOI wafer 102 was a single crystal Si wafer. SiO$_2$ was deposited by CVD to form the inhibition layer 104. After this, the openings 105 were formed in the inhibition layer 104 by photolithography. Here, the openings 105 were controlled to have an aspect ratio of 1. The Ge crystal layers 106 were formed by CVD using GeH$_4$ as the source gas. The maximum width of the Ge crystal layers 106 was set to 2 μm in the substantially parallel direction to the surface of the SOI wafer 102. After the Ge crystal layers 106 were formed, two-phase annealing was carried out that includes high-temperature annealing at the temperature of 800° C. for 10 minutes and low-temperature annealing at the temperature of 680° C. for 10 minutes. The above-described two-phase annealing was performed ten times. In the above-described manner, the semiconductor wafer was fabricated.

On the Ge crystal layers 106 of the semiconductor wafer, GaAs crystals were formed as the seed compound semiconductor crystals 108, the first compound semiconductor crystals 110 and the second compound semiconductor crystals 112. The GaAs crystals were grown by MOCVD at the temperature of 650° C. using TM-Ga and AsH₃ as the source gases. The second compound semiconductor crystal 112 was grown with the partial pressure of AsH₃ being set to $1\times10^{-3}$ atm. On the second compound semiconductor crystal 112, the gate insulator 114 made of highly resistant AlGaAs, the gate electrode 116 made of Pt, and the source/drain electrodes 118 made of W were formed. Thus, the electronic device 100 was fabricated.

The semiconductor wafer with the Ge crystal layers 106 having been formed was examined as to whether defects were generated on the surfaces of the Ge crystal layers 106. The examination utilized the etch-pit method. The examination discovered no defects on the surfaces of the Ge crystal layers 106. Furthermore, ten electronic devices 100 were examined as to whether threading defects were generated. The examination was performed by in-plane cross-section observation with a TEM. The examination discovered that none of the electronic devices 100 had threading defects.

According to the present embodiment, the Ge crystal layers 106 were formed within the openings 105 having an aspect ratio of $\sqrt{3}/3$ or higher. Therefore, the Ge crystal layers 106 had excellent crystallinity at the surfaces thereof at the time of being deposited. Furthermore, the present embodiment subjected the Ge crystal layers 106 to annealing, thereby further improving the crystallinity of the Ge crystal layers 106. Since the Ge crystal layers 106 achieved improved crystallinity, enhanced crystallinity was also realized for the seed compound semiconductor crystal 108, which was grown from the Ge crystal layer 106 serving as a nucleus, for the first compound semiconductor crystal 110, which was grown by using a specific plane of the seed compound semiconductor crystal 108 as a seed plane, and for the second compound semiconductor crystal 112, which was grown by using a prescribed plane of the first compound semiconductor crystal 110 as a seed plane.

Thus, enhanced crystallinity was realized for the active layer of the electronic device 100, which was formed on the second compound semiconductor crystal 112. The electronic device 100 thus could accomplish improved performance despite being formed on the low-cost SOI wafer 102. According to the electronic device 100 relating to the present embodiment, the electronic element was formed in the second compound semiconductor crystal 112 formed on the SOI wafer 102. Therefore, the stray capacitance was decreased and the operating speed was resultantly increased for the electronic device 100. Furthermore, the leakage currents to the Si wafer 162 could be reduced.

Exemplary Embodiment 2

The semiconductor wafer 801 with 2500 regions 803 was fabricated in the following manner. The Si wafer 862 of the SOI wafer 802 was a single crystal Si wafer. The inhibition layers 804 of silicon oxide were formed by CVD and the openings 806 were subsequently formed by photolithography. The openings 806 were controlled to have an aspect ratio of 1. The openings 806 were shaped as a square with a side of 100 μm, and adjacent openings 806 were arranged away from each other with a distance of 500 μm therebetween. Within the openings 806, the Ge crystal layers 820 were formed. The Ge crystal layers 820 were formed by MOCVD using GeH₄ as the source gas. The maximum width of the Ge crystal layers 820 was set to 2 μm in the substantially parallel direction to the surface of the SOI wafer 802. After the Ge crystal layers 820 were formed, two-phase annealing was carried out that includes high-temperature annealing at the temperature of 800° C. for 2 minutes and low-temperature annealing at the temperature of 680° C. for 2 minutes. The above-described two-phase annealing was performed ten times.

The semiconductor wafer 801 with the Ge crystal layers 820 having been formed was examined as to whether defects were generated on the surfaces of the Ge crystal layers 820. The examination utilized the etch-pit method. The examination discovered no defects on the surfaces of the Ge crystal layers. According to the above-described procedure, the Ge crystal layer 820 was selectively grown within the opening 806 defined by the inhibition layer 804, and the Ge crystal layer 820 was subjected to the two-phase annealing multiple times. In this manner, the Ge crystal layer 820 accomplished improved crystallinity. Furthermore, forming an InGaP layer as the buffer layer 822 contributed to fabricate the semiconductor wafer 801 including a GaAs layer as the compound semiconductor functional layer 824 with excellent crystallinity.

After this, the semiconductor wafer 801 fabricated in the above-described manner was utilized to fabricate an electronic device. The electronic device was fabricated in the following manner. The buffer layer 822 of InGaP was formed on the Ge crystal layer 820 in each region 803. The buffer layer 822 was grown by MOCVD at the temperature of 650° C. using TM-Ga, TM-In and PH₃ as the source gases.

On the buffer layer 822, an n⁺GaAs layer having a carrier concentration of $3.0\times10^{18}$ cm⁻³ and the thickness of 500 nm and an n⁻GaAs layer having a carrier concentration of $2.0\times10^{16}$ cm⁻³ and the thickness of 500 nm are formed in the stated order to form the collector layer of the HBT. On the collector layer, a p⁺GaAs layer having a carrier concentration of $5.0\times10^{19}$ cm⁻³ and the thickness of 50 nm was formed to form the base layer of the HBT. On the base layer, an n⁻InGaP layer having a carrier concentration of $3.0\times10^{17}$ cm⁻³ and the thickness of 30 nm, an n⁺GaAs layer having a carrier concentration of $3.0\times10^{18}$ cm⁻³ and the thickness of 100 nm, and an n⁺InGaAs layer having a carrier concentration of $1.0\times10^{19}$ cm⁻³ and the thickness of 100 nm were formed in the stated order to form the emitter layer of the HBT. It should be noted that the above-mentioned carrier concentration and thickness values are designed values.

In the above-described manner, the compound semiconductor functional layer 824 including the base, emitter, and collector layers was formed. The GaAs layers of the base, emitter, and collector layers were grown by MOCVD at the temperature of 650° C. using TM-Ga and AsH₃ as the source gases. After this, prescribed etching was performed to form each of a base layer electrode interconnection, an emitter layer electrode interconnection, and a collector layer electrode interconnection. On the surface of the compound semiconductor functional layer 824, the collector electrode 808, the emitter electrode 810, and the base electrode 812 were formed, as a result of which the HBT was fabricated. On the emitter and collector layers, an AuGeNi layer was formed by vacuum vapor deposition. On the base layer, an AuZn layer was formed by vacuum vapor deposition. After formed, the AuGeNi and AuZn layers were thermally treated under a hydrogen atmosphere at the temperature of 420° C. for 10 minutes to form the electrodes. The electrodes were electrically connected to the above-described driving circuits, so that the electronic device was fabricated.

In the above-described manner, a small-sized and low-power-consumption electronic device was accomplished. Furthermore, examination with a secondary electron microscope (hereinafter, may be referred to as an SEM) did not find surface roughness on the order of μm on the surface of the compound semiconductor functional layer 824.

Exemplary Embodiment 3

The semiconductor wafer 801 was fabricated that has a GaAs buffer layer formed at the temperature of 500° C. or lower between the Si crystal layer 866 and the Ge crystal layer 820. This semiconductor wafer 801 was fabricated in the same manner as in Exemplary Embodiment 2 except that the buffer layer was formed between the Si crystal layer 866 and the Ge crystal layer 820. The GaAs buffer layer was grown by MOCVD at the temperature of 450° C. using TM-Ga and AsH$_3$ as the source gases. This could improve the crystallinity of the compound semiconductor functional layer 824 to some extent.

Exemplary Embodiment 4

The semiconductor wafer 801 was fabricated that has the PH$_3$ gas-treated surface of the Ge crystal layer 820. This semiconductor wafer 801 was fabricated in the same manner as in Exemplary Embodiment 2 except that the InGaP buffer layer 822 was omitted and that the compound semiconductor functional layer 824 was formed after the plane of the Ge crystal layer 820, the plane facing the compound semiconductor functional layer 824, was treated with PH$_3$ gas. This could improve the crystallinity of the compound semiconductor functional layer 824 to some extent.

Exemplary Embodiment 5

Figure 22:
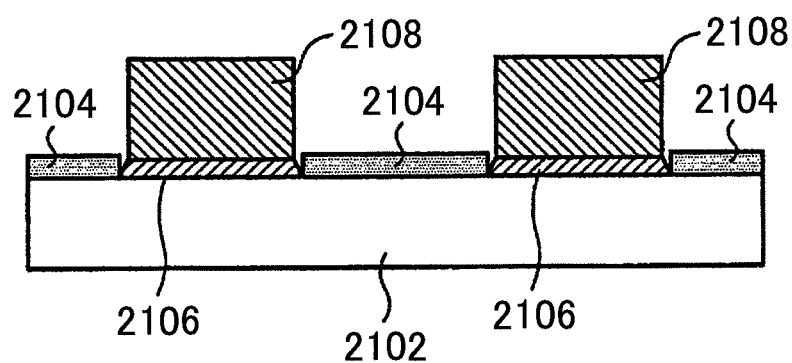
FIG. 22 schematically illustrates the cross-section of a manufactured semiconductor wafer.

FIG. 22 is a schematic cross-sectional view illustrating a semiconductor wafer used in Exemplary Embodiments 5 to 13. The semiconductor wafer includes a Si wafer 2102, an inhibition layer 2104, a Ge crystal layer 2106, and a compound semiconductor 2108. The compound semiconductor 2108 includes, for example, the seed compound semiconductor crystal 108.

Figure 23:
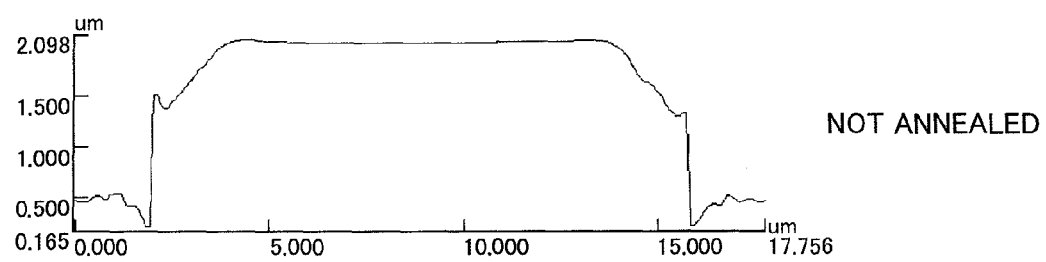
FIG. 23 illustrates the cross-sectional shape of a Ge crystal layer 2106 before annealing.
Figure 24:
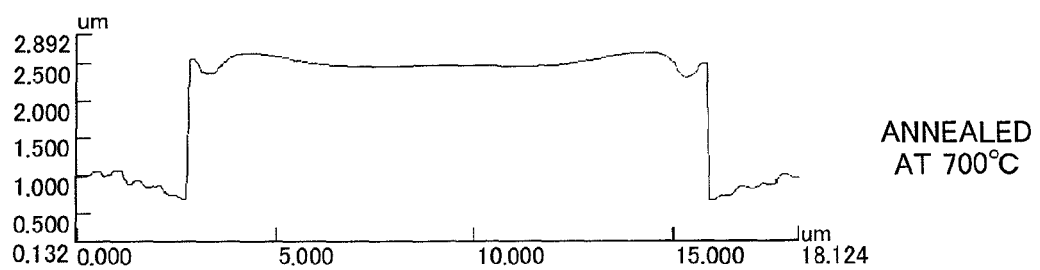
FIG. 24 illustrates the cross-sectional shape of the Ge crystal layer 2106 after annealing at the temperature of 700° C.
Figure 25:
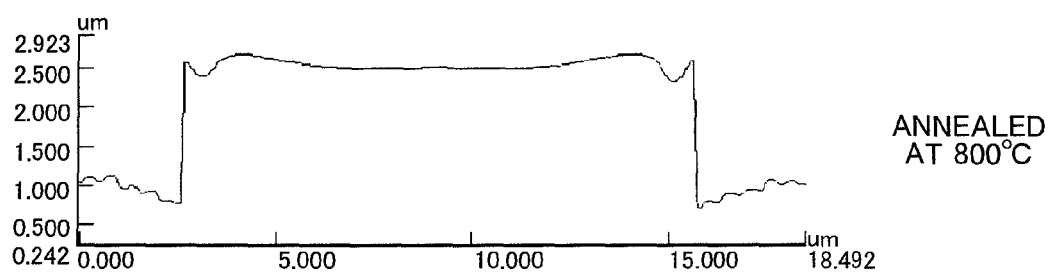
FIG. 25 illustrates the cross-sectional shape of the Ge crystal layer 2106 after annealing at the temperature of 800° C.
Figure 27:
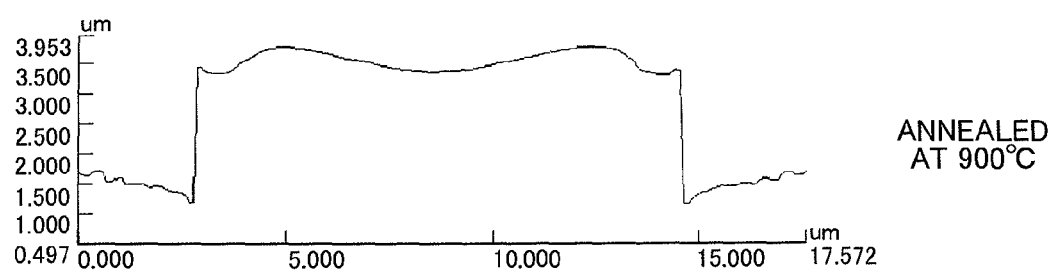
FIG. 27 illustrates the cross-sectional shape of the Ge crystal layer 2106 after annealing at the temperature of 900° C.

FIGS. 23 to 27 present how the temperature of annealing is related to the flatness of the Ge crystal layer 2106. FIG. 23 illustrates the cross-sectional shape of the Ge crystal layer 2106 observed when the Ge crystal layer 2106 is not annealed. FIGS. 24, 25, 26, and 27 respectively illustrate the cross-sectional shapes of the Ge crystal layer 2106 observed when the Ge crystal layer 2106 has been annealed at the temperatures of 700° C., 800° C., 850° C. and 900° C. The cross-sectional shape of the Ge crystal layer 2106 was observed using a laser microscope. In these figures, the vertical axis represents the distance in the perpendicular direction to the main plane of the Si wafer 2102 and thus shows the thickness of the Ge crystal layer 2106. In these figures, the horizontal axis represents the distance in the parallel direction to the main plane of the Si wafer 2102.

Here, the Ge crystal layer 2106 was formed in the following manner. To begin with, the inhibition layer 2104 of SiO$_2$ was formed on the surface of the Si wafer 2102 by thermal oxidization, and a covering region and an opening were defined in the inhibition layer 2104. The outer periphery of the inhibition layer 2104 is equivalent to the outer periphery of the covering region. The Si wafer 2102 was a commercially available single crystal Si wafer. The covering region was shaped as a square with a side of 400 μm in plan view. After this, the Ge crystal layer 2106 was selectively grown by CVD within the opening.

As seen from FIGS. 23 to 27, as the temperature of annealing decreases, the flatness of the surface of the Ge crystal layer 2106 improves. In particular, when the temperature of annealing is 900° C. or lower, the surface of the Ge crystal layer 2106 has excellent flatness.

Exemplary Embodiment 6

The semiconductor wafer was fabricated that includes the Si wafer 2102, the inhibition layer 2104, the Ge crystal layer 2106, and the compound semiconductor 2108, which serves as a device forming layer. It was examined how the rate at which a crystal is grown within the opening 105 formed in the inhibition layer 2104 is related to the size of the covering region and the size of the opening 105. The thickness of the compound semiconductor 2108 that was grown within a prescribed duration was measured while varying the planar shape of the covering region and the bottom shape of the opening 105 defined in the inhibition layer 2104.

To begin with, the covering region and the opening 105 were formed on the surface of the Si wafer 2102 in the following manner. The Si wafer 2102 was, for example, a commercially available single crystal Si wafer. For example, a SiO$_2$ layer was formed by thermal oxidization on the surface of the Si wafer 2102 as an example of the inhibition layer 2104.

The SiO$_2$ layer was etched into SiO$_2$ layers of a prescribed size. Here, three or more SiO$_2$ layers of the prescribed size were formed. The SiO$_2$ layers of the prescribed size were shaped as a square of the same size in plan view. Furthermore, the opening 105 of a prescribed size was formed by etching at the center of each square-shaped SiO$_2$ layer. Here, the center of the opening 105 was controlled to coincide with the center of the square-shaped SiO$_2$ layer. Here, one opening 105 was formed in each one of the square-shaped SiO$_2$ layers. The length of the side of the square-shaped SiO$_2$ layer may be herein referred to as the length of the side of the covering region.

After this, the Ge crystal layer 2106 was selectively grown by MOCVD within the opening 105. GeH$_4$ was used as the source gas. The flow rate of the source gas and the deposition time were respectively set at prescribed values. Subsequently, a GaAs crystal was formed by MOCVD as an example of the compound semiconductor 2108. The GaAs crystal was epitaxially grown on the surface of the Ge crystal layer 2106 within the opening 105 at the temperature of 620° C. and under the pressure of 8 MPa. Trimethyl gallium and arsine were used as the source gases. The flow rates of the source gases and the deposition time were respectively set at prescribed values.

After the compound semiconductor 2108 was formed, the thickness of the compound semiconductor 2108 was measured. The thickness of the compound semiconductor 2108 was calculated in such a manner that a stylus profilometer (Surface Profiler P-10 available from KLA Tencor, Inc.) was used to measure the thickness of the compound semiconductor 2108 at three locations and the resulting three thickness values were averaged. Here, the standard deviation of the thickness values measured at the three locations was also calculated. Alternatively, the thickness may be calculated in such a manner that the thickness of the compound semiconductor 2108 was directly measured at three locations by cross-sectional observation with a transmission or scanning electron microscope and the resulting three thickness values are averaged.

In accordance with the above-described procedure, the thickness of the compound semiconductor 2108 was measured while the bottom shape of the opening 105 was varied and the length of the side of the covering region was varied between 50 µm, 100 µm, 200 µm, 300 µm, 400 µm, and 500 µm. The bottom shape of the opening 105 was varied between a square with a side of 10 µm, a square with a side of 20 µm, and a rectangle with a short side of 30 µm and a long side of 40 µm.

When the length of the side of the covering region is 500 µm, the plurality of square-shaped $SiO_2$ layers are integrally formed. In this case, the covering regions with a side of 500 µm are not actually arranged at an interval of 500 µm, but this case is referred, for the sake of simplicity, to as the case where the length of the side of the covering region is set at 500 µm. In addition, the distance between two adjacent covering regions is referred to as 0 µm for the sake of simplicity.

Figure 28:
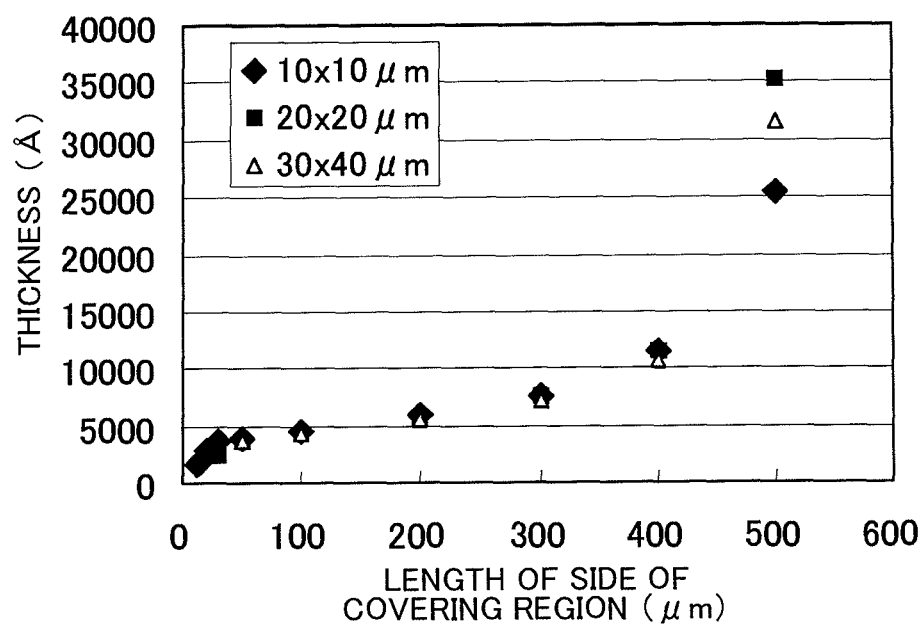
FIG. 28 presents the average thickness of a compound semiconductor 2108 in Exemplary Embodiment 6.
Figure 29:
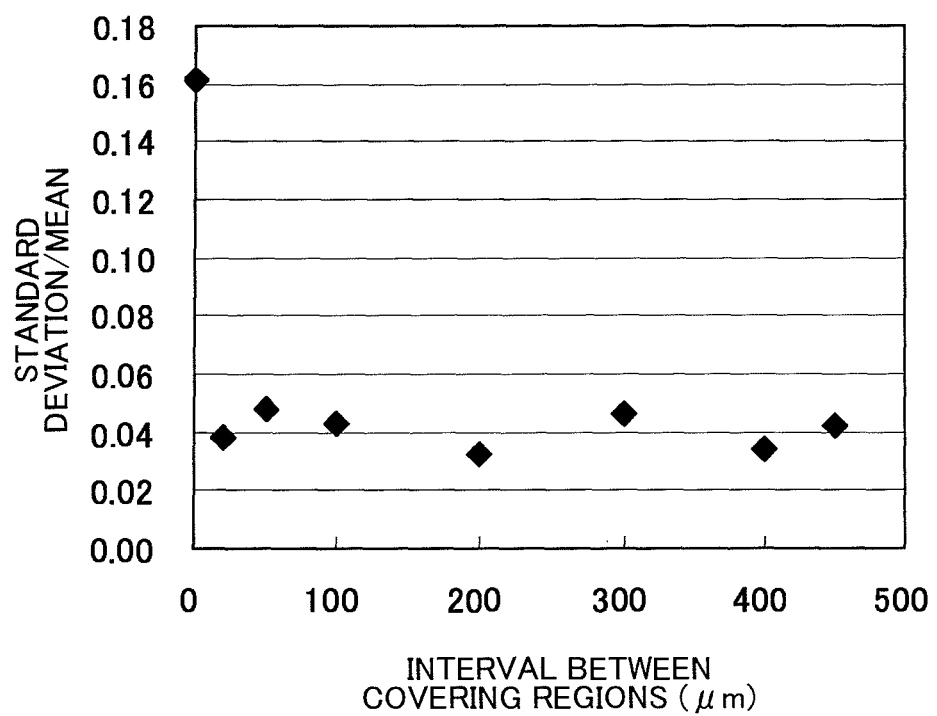
FIG. 29 presents the variation coefficient of the thickness of the compound semiconductor 2108 in Exemplary Embodiment 6.

The results of the experiments performed in Exemplary Embodiment 6 are shown in FIGS. 28 and 29. FIG. 28 presents the average thicknesses of the compound semiconductor 2108 calculated in the respective experiments performed in Exemplary Embodiment 6. FIG. 29 presents the variation coefficients of the thickness of the compound semiconductor 2108 in the respective experiments performed in Exemplary Embodiment 6.

FIG. 28 shows how the growth rate of the compound semiconductor 2108 is dependent on the sizes of the covering region and the opening 105. In FIG. 28, the vertical axis represents the thickness [Å] of the compound semiconductor 2108 grown within a prescribed duration, and the horizontal axis represents the length [µm] of the side of the covering region. In the present exemplary embodiment, since the measured thickness of the compound semiconductor 2108 represents the result of the growth within a prescribed duration, dividing the measured thickness by the prescribed duration produces an approximate value for the growth rate of the compound semiconductor 2108.

In FIG. 28, the diamond marks represent the data resulting from the experiment in which the bottom of the opening 105 is shaped as a square with a side of 10 µm, and the square marks represent the data resulting from the experiment in which the bottom of the opening 105 is shaped as a square with a side of 20 µm. In FIG. 28, the triangular marks represent the data resulting from the experiment in which the bottom of the opening 105 is shaped as a rectangle with a long side of 40 µm and a short side of 30 µm.

FIG. 28 shows that the growth rate monotonically increases as the size of the covering region increases. FIG. 28 also tells that, when the length of the side of the covering region is 400 µm or less, the growth rate increases in an approximately linear manner and only slightly varies depending on the shape of the bottom of the opening 105. On the other hand, when the length of the side of the covering region is 500 µm, the growth rate increases radically when compared with the case where the length of the side of the covering region is 400 µm or less and varies more greatly depending on the shape of the bottom of the opening 105. Therefore, the maximum width of the plane of the inhibition layer in the parallel direction to the Si crystal layer is preferably 400 µm or less.

FIG. 29 shows how the variation coefficient for the growth rate of the compound semiconductor 2108 is dependent on the distance between two adjacent covering regions. Here, the variation coefficient is defined as the ratio of the standard deviation to the mean, and can be calculated by dividing the standard deviation of the thickness values measured at the three locations by the average among these thickness values. In FIG. 29, the vertical axis represents the variation coefficient of the thickness [Å] of the compound semiconductor 2108 grown within a prescribed duration and the horizontal axis represents the distance [µm] between adjacent covering regions. FIG. 29 shows the data resulting from the experiments in which the distance between two adjacent covering regions is set at 0 µm, 20 µm, 50 µm, 100 µm, 200 µm, 300 µm, 400 µm, and 450 µm. In FIG. 29, the diamond marks indicate the data resulting from the experiment in which the bottom of the opening 105 is shaped as a square with a side of 10 µm.

The data values shown in FIG. 29 as resulting from the experiments in which the distance between two adjacent covering regions is set at 0 µm, 100 µm, 200 µm, 300 µm, 400 µm, and 450 µm respectively correspond to the data values shown in FIG. 28 as resulting from the experiments in which the length of the side of the covering region is set at 500 µm, 400 µm, 300 µm, 200 µm, 100 µm and 50 µm. In the experiments in which the distance between two adjacent covering regions is set at 20 µm and 50 µm, the thickness of the compound semiconductor 2108 was measured according to the same procedure as in the other experiments, while the length of the side of the covering region is set at 480 µm and 450 µm.

FIG. 29 shows that the growth rate of the compound semiconductor 2108 is very stable when the distance between two adjacent covering regions is 20 µm than when the distance is 0 µm. This finding indicates that a crystal is grown at a stable rate within the opening 105 as long as there is a slight space between two adjacent covering regions. Stated differently, the finding indicates that the crystal growth rate can be stabilized as long as a region is provided between two adjacent covering regions to allow a crystal to be grown therein. Furthermore, it can be derived that the variation in the crystal growth rate can be reduced by arranging a plurality of openings 105 at equal intervals even when the distance between two adjacent covering regions is 0 µm.

Exemplary Embodiment 7

Semiconductor wafers were fabricated in the same manner as in Exemplary Embodiment 6 while the length of the side of the covering region is set at 200 µm, 500 µm, 700 µm, 1000 µm, 1500 µm, 2000 µm, 3000 µm, and 4250 µm, and the thickness of the compound semiconductor 2108 grown within the opening 105 was measured. In Exemplary Embodiment 7, a plurality of $SiO_2$ layers of the same size were arranged on the Si wafer 2102. Furthermore, the $SiO_2$ layers were spaced away from each other. The shape of the bottom of the opening 105 was varied between three options including a square with a side of 10 µm, a square with a side of 20 µm, and a rectangle with a short side of 30 µm and a long side of 40 µm as in Exemplary Embodiment 6. The Ge crystal layer 2106 and the compound semiconductor 2108 were grown under the same conditions as in Exemplary Embodiment 6.

Exemplary Embodiment 8

The thickness of the compound semiconductor 2108 grown within the opening 105 was measured when the same conditions were employed as in Exemplary Embodiment 7 except that the supply of trimethyl gallium was reduced to half and the growth rate of the compound semiconductor 2108 was reduced to approximately half. In Exemplary Embodiment 8, experiments were performed while the length of the side of the covering region was set at 200 µm, 500 µm, 1000 µm, 2000 µm, 3000 µm, or 4250 µm, and the bottom of the opening 105 was shaped as a square of 10 µm.

Figure 30:
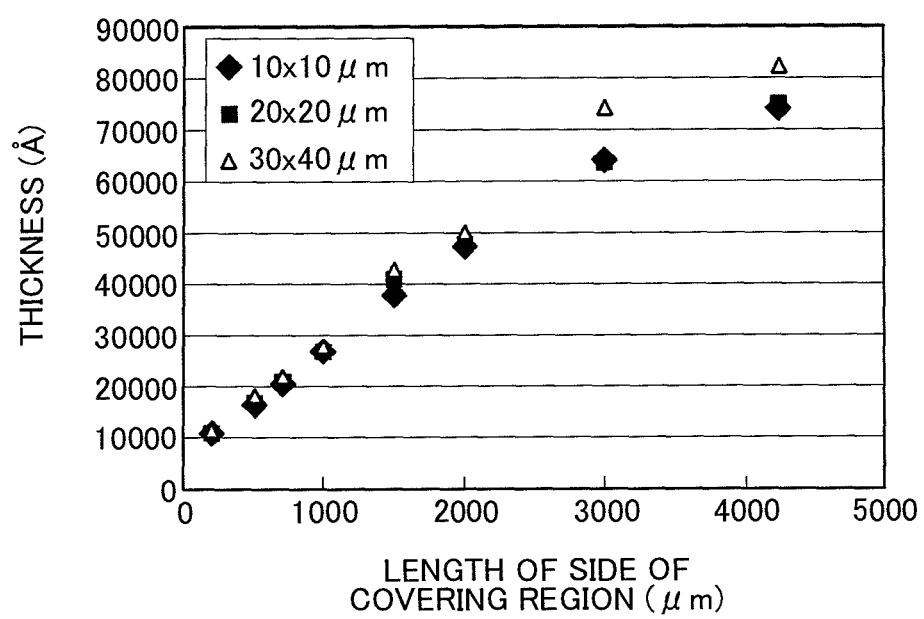
FIG. 30 presents the average thickness of a compound semiconductor 2108 in Exemplary Embodiment 7.
Figure 31:
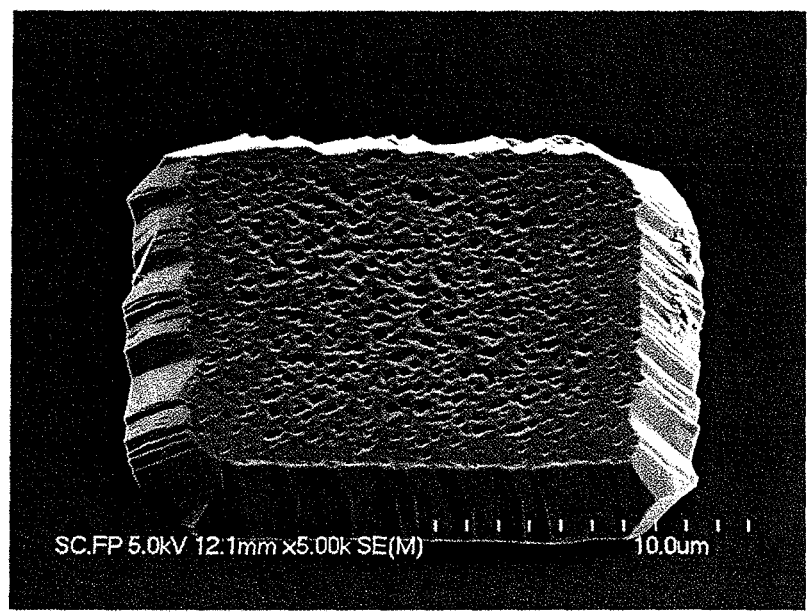
FIG. 31 shows an electron microscopic photograph of the compound semiconductor 2108 in Exemplary Embodiment 7.
Figure 33:
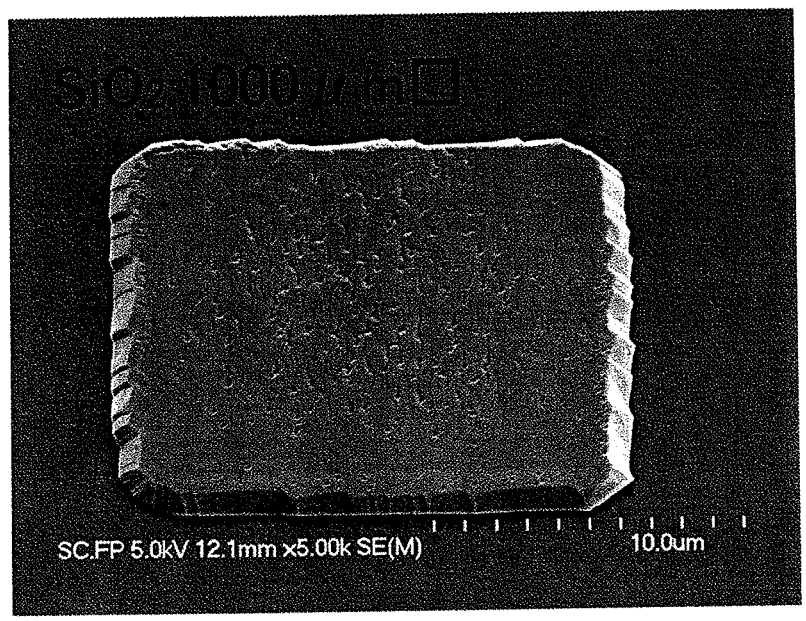
FIG. 33 shows an electron microscopic photograph of the compound semiconductor 2108 in Exemplary Embodiment 7.
Figure 34:
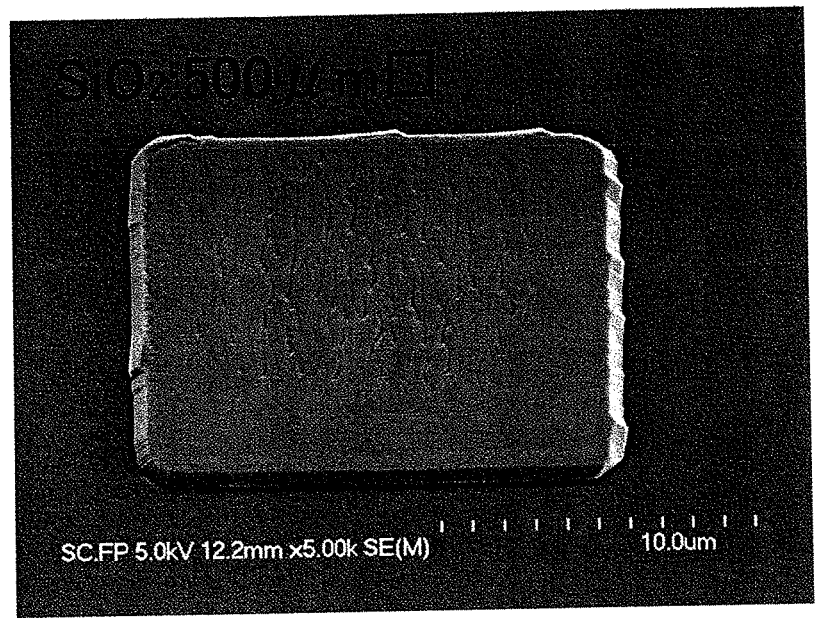
FIG. 34 shows an electron microscopic photograph of the compound semiconductor 2108 in Exemplary Embodiment 7.
Figure 35:
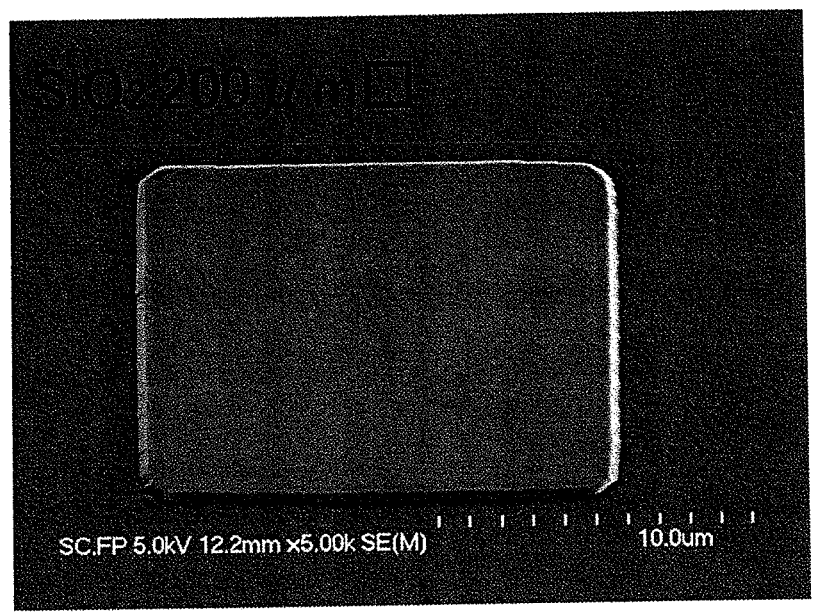
FIG. 35 shows an electron microscopic photograph of the compound semiconductor 2108 in Exemplary Embodiment 7.
Figure 36:
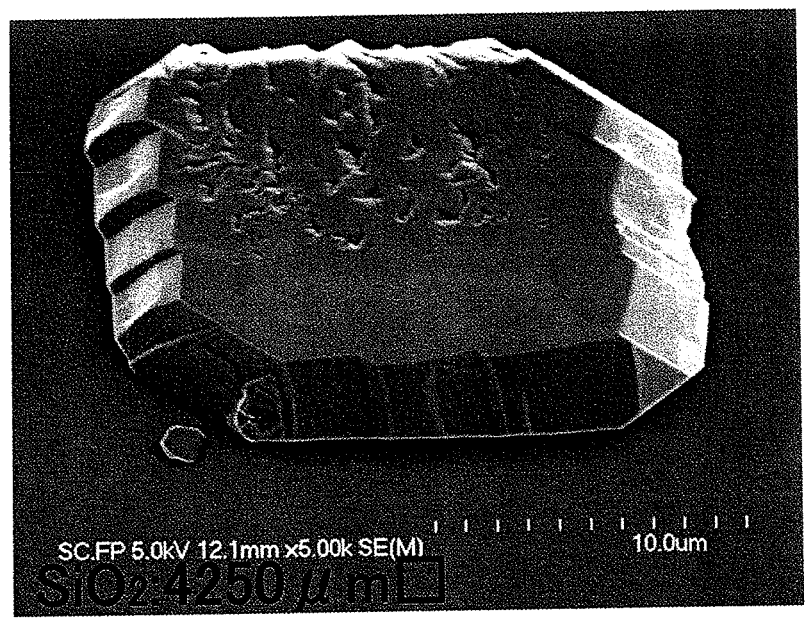
FIG. 36 shows an electron microscopic photograph of the compound semiconductor 2108 in Exemplary Embodiment 8.
Figure 37:
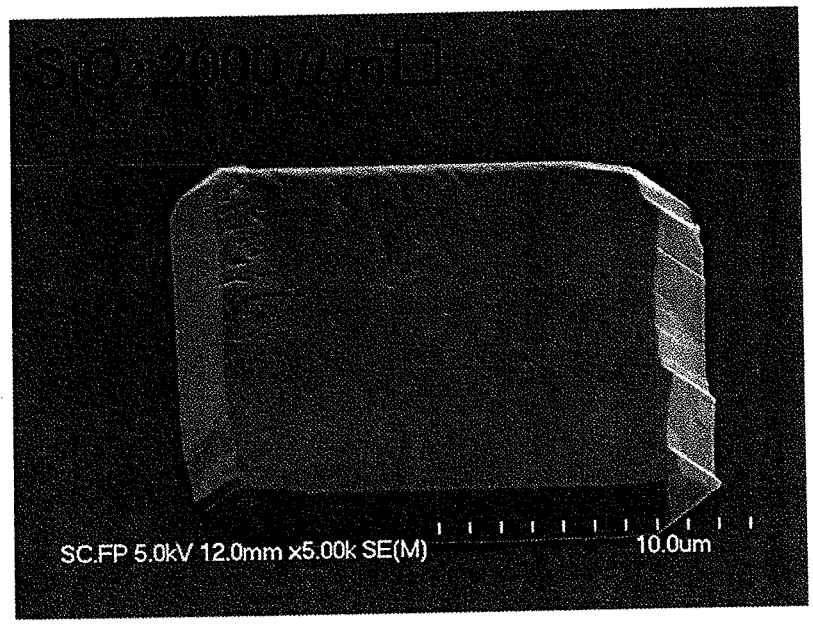
FIG. 37 shows an electron microscopic photograph of the compound semiconductor 2108 in Exemplary Embodiment 8.
Figure 38:
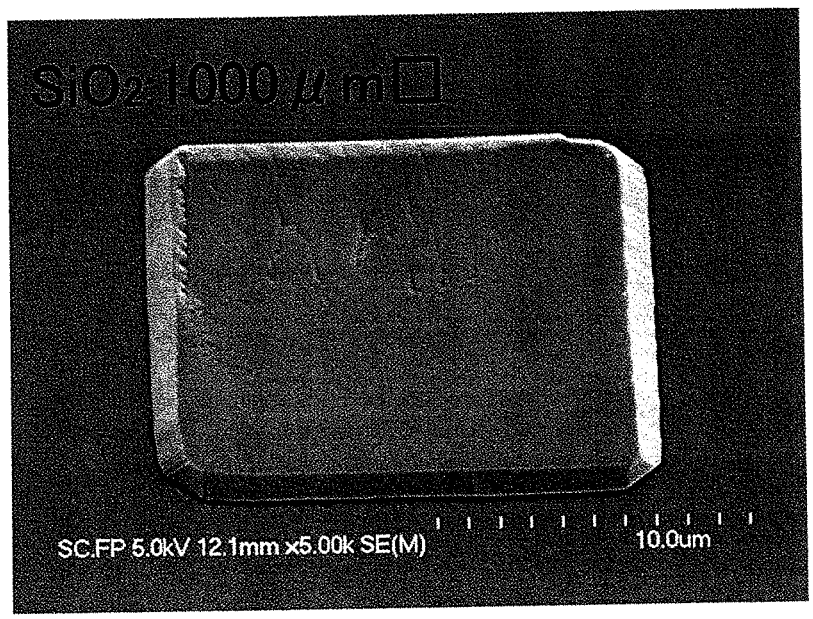
FIG. 38 shows an electron microscopic photograph of the compound semiconductor 2108 in Exemplary Embodiment 8.
Figure 39:
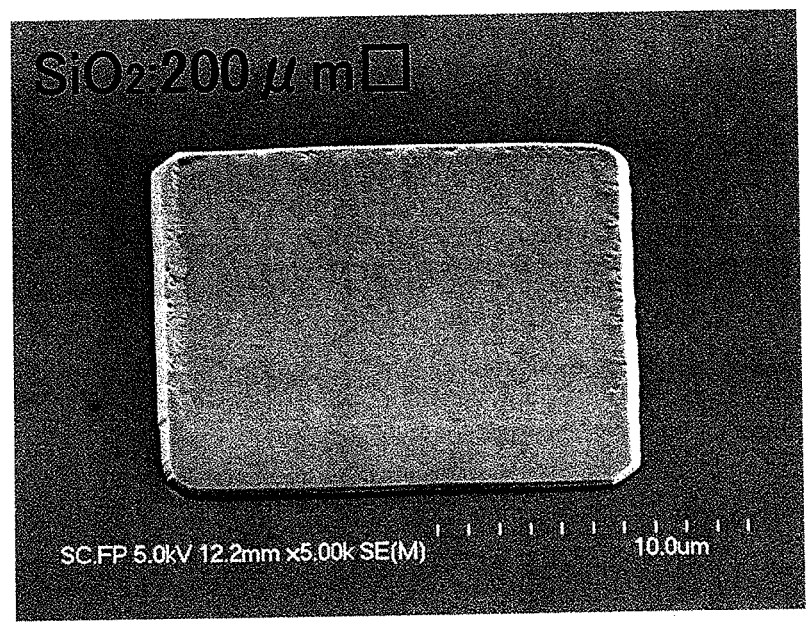
FIG. 39 shows an electron microscopic photograph of the compound semiconductor 2108 in Exemplary Embodiment 8.
Figure 40:
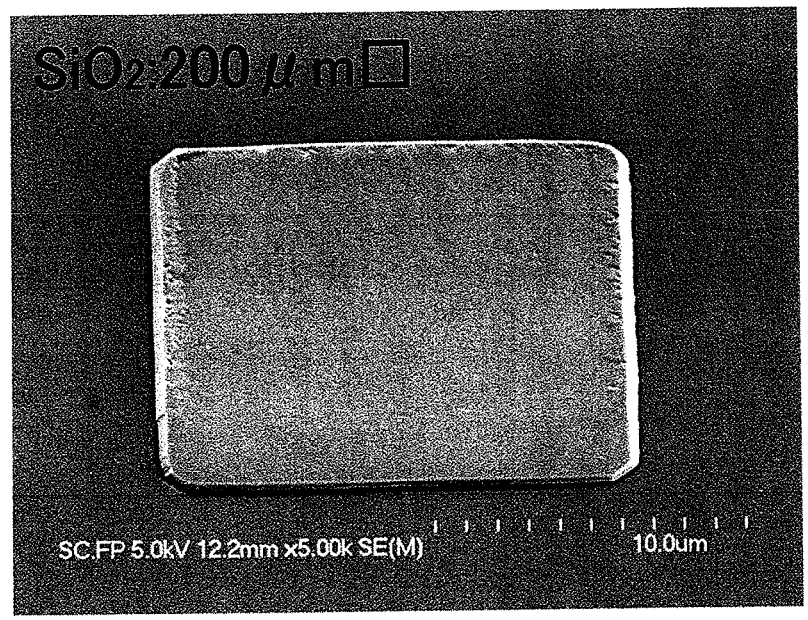
FIG. 40 shows an electron microscopic photograph of the compound semiconductor 2108 in Exemplary Embodiment 8.

The results of the experiments performed in Exemplary Embodiments 7 and 8 are shown in FIGS. 30 to 40 and Table 1. FIG. 30 presents the average thickness of the compound semiconductor 2108 that is calculated in each of the experiments performed in Exemplary Embodiment 7. FIGS. 31 to 35 show electron microscope photographs of the compound semiconductors 2108 fabricated in the respective experiments performed in Exemplary Embodiment 7. FIGS. 36 to 40 show electron microscope photographs of the compound semiconductors 2108 fabricated in the respective experiments performed in Exemplary Embodiment 8. Table 1 shows the growth rate of the compound semiconductor 2108 and the Ra value for the experiments performed in Exemplary Embodiments 7 and 8.

FIG. 30 shows how the growth rate of the compound semiconductor 2108 is dependent on the sizes of the covering region and the opening 105. In FIG. 30, the vertical axis represents the thickness of the compound semiconductor 2108 grown within a prescribed duration, and the horizontal axis represents the length [μm] of the side of the covering region. In the present exemplary embodiment, since the measured thickness of the compound semiconductor 2108 represents the result of the growth within a prescribed duration, dividing the measured thickness by the prescribed duration produces an approximate value for the growth rate of the compound semiconductor 2108.

In FIG. 30, the diamond marks represent the data resulting from the experiment in which the bottom of the opening 105 is shaped as a square with a side of 10 μm, and the square marks represent the data resulting from the experiment in which the bottom of the opening 105 is shaped as a square with a side of 20 μm. In FIG. 30, the triangular marks represent the data resulting from the experiment in which the bottom of the opening 105 is shaped as a rectangle with a long side of 40 μm and a short side of 30 μm.

FIG. 30 shows that the growth rate stably increases as the size of the covering region increases until the length of the side of the covering region reaches 4250 μm. Thus, the maximum width of the plane of the inhibition layer in the parallel direction to the Si crystal layer is preferably 4250 μm or less. The results shown in FIGS. 28 and 30 indicate that a crystal is grown at a stable rate within the opening 105 as long as there is a slight space between two adjacent covering regions. Stated differently, the results indicate that the crystal growth rate can be stabilized as long as a region is provided between two adjacent covering regions to allow a crystal to be grown therein.

FIGS. 31 to 35 show the surfaces of the compound semiconductors 2108 observed by an electron microscope in the respective experiments performed in Exemplary Embodiment 7. FIGS. 31, 32, 33, 34 and 35 respectively show the results of the experiments in which the length of the side of the covering region is set at 4250 μm, 2000 μm, 1000 μm, 500 μm, and 200 μm. FIGS. 31 to 35 indicate that the quality of the surface of the compound semiconductor 2108 becomes more degraded as the size of the covering region increases.

FIGS. 36 to 40 show the surfaces of the compound semiconductors 2108 observed by an electron microscope in the respective experiments performed in Exemplary Embodiment 8. FIGS. 36, 37, 38, 39 and 40 respectively show the results of the experiments in which the length of the side of the covering region is set at 4250 μm, 2000 μm, 1000 μm, 500 μm, and 200 μm. FIGS. 36 to 40 indicate that the quality of the surface of the compound semiconductor 2108 becomes more degraded as the size of the covering region increases. Comparing the results of the experiments performed in Exemplary Embodiments 7 and 8 reveals that better quality is accomplished for the surface of the compound semiconductor 2108 in Exemplary Embodiment 8.

Table 1 shows the growth rate [Å/min] of the compound semiconductor 2108 and the Ra value [μm] for the experiments performed in Exemplary Embodiments 7 and 8. It should be noted here that the thickness of the compound semiconductor 2108 was measured by means of a stylus profilometer. The Ra value was calculated based on observation with a laser microscope apparatus. Table 1 shows that the surface roughness is improved as the growth rate of the compound semiconductor 2108 is decreased. Table 1 also shows that the Ra value is 0.02 μm or less when the growth rate of the compound semiconductor 2108 is 300 nm/min or less.

TABLE 1

| LENGTH OF SIDE OF COVERING REGION [μm] | EXEMPLARY EMBODIMENT 7 | | EXEMPLARY EMBODIMENT 8 | |
|---|---|---|---|---|
| | GROWTH RATE [Å/min] | Ra VALUE [μm] | GROWTH RATE [Å/min] | Ra VALUE [μm] |
| 200 | 526 | 0.006 | 286 | 0.003 |
| 500 | 789 | 0.008 | 442 | 0.003 |
| 1000 | 1216 | 0.012 | 692 | 0.005 |
| 2000 | 2147 | 0.017 | 1264 | 0.007 |
| 3000 | 3002 | 0.020 | 1831 | 0.008 |
| 4250 | 3477 | 0.044 | 2190 | 0.015 |

Exemplary Embodiment 9

Figure 41:
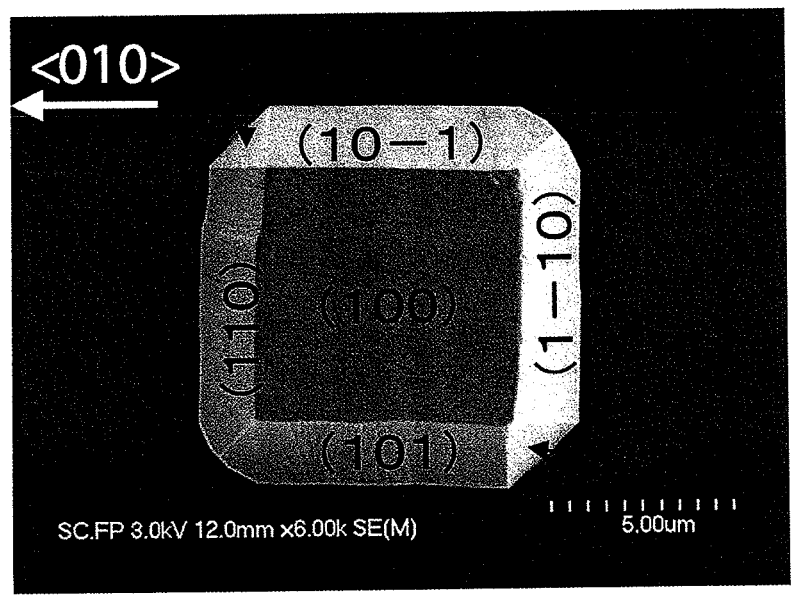
FIG. 41 shows an electron microscopic photograph of the compound semiconductor 2108 in Exemplary Embodiment 9.
Figure 43:
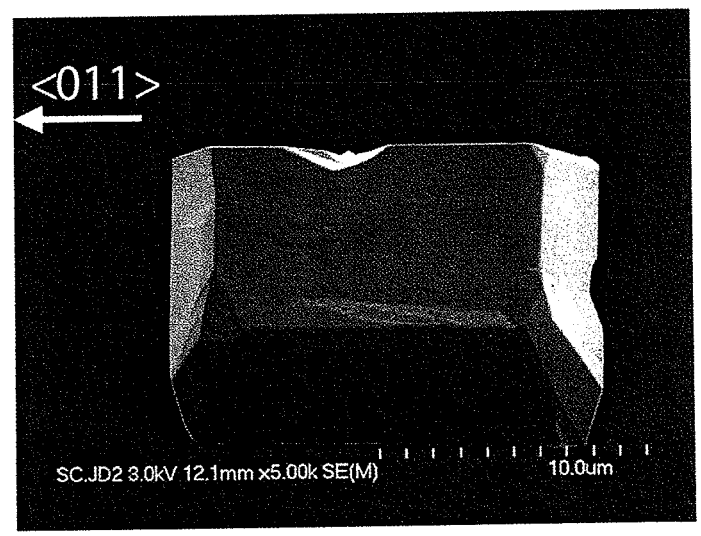
FIG. 43 shows an electron microscopic photograph of the compound semiconductor 2108 in Exemplary Embodiment 9.

In accordance with the same procedure as in Exemplary Embodiment 6, the semiconductor wafer was fabricated that includes the Si wafer 2102, the inhibition layer 2104, the Ge crystal layer 2106, and the compound semiconductor 2108, which is a GaAs crystal, for example. In the present exemplary embodiment, the surface of the Si wafer 2102 on which the inhibition layer 2104 was formed was the (100) plane. FIGS. 41 to 43 show electron microscope photographs of the surface of the GaAs crystal formed on the semiconductor wafer.

FIG. 41 shows the GaAs crystal grown within the opening 105 when one of the sides of the shape of the bottom of the opening 105 was adapted to extend in the substantially parallel direction to the <010> direction of the Si wafer 2102. In the present exemplary embodiment, the planar shape of the covering region was a square with a side of 300 μm. The shape of the bottom of the opening 105 was a square with a side of 10 μm. In FIG. 41, the white arrow indicates the <010> direction. As seen from FIG. 41 a well-shaped crystal was formed.

FIG. 41 shows that the (10-1) plane, the (1-10) plane, the (101) plane, and the (110) plane appear on the four lateral planes of the GaAs crystal. In the drawing, the (11-1) plane appears at the upper left corner of the GaAs crystal, and the (1-11) plane appears at the lower right corner of the GaAs crystal. The (11-1) and (1-11) planes are equivalent to the (−1-1-1) plane and stable.

On the other hand, no such planes appear at the lower left and upper right corners of the GaAs crystal in the drawing. For example, the (111) plane is expected to appear at the lower left corner in the drawing, but does not. This is probably because the lower left corner, in the drawing, is between the (110) and (101) planes that are more stable than the (111) plane.

FIG. 42 shows the GaAs crystal grown within the opening 105 when one of the sides of the shape of the bottom of the opening 105 was adapted to extend in the substantially parallel direction to the <010> direction of the Si wafer 2102. FIG. 42 shows the GaAs crystal observed from above at the angle of 45 degrees. In the present exemplary embodiment, the planar shape of the covering region was a square with a side of 50 μm. The shape of the bottom of the opening 105 was a square with a side of 10 μm. In FIG. 42, the white arrow indicates the <010> direction. As seen from FIG. 42 a well-shaped crystal was formed.

FIG. 43 shows the GaAs crystal grown within the opening 105 when one of the sides of the shape of the bottom of the opening 105 was adapted to extend in the substantially parallel direction to the <011> direction of the Si wafer 2102. In the present exemplary embodiment, the planar shape of the covering region was a square with a side of 400 μm. The shape of the bottom of the opening 105 was a square with a side of 10 μm. In FIG. 43, the white arrow indicates the <011> direction. As seen from FIG. 43, a less well-shaped crystal was formed than the crystals shown in FIGS. 41 and 42. This is probably because a relatively unstable (111) plane appears at the lateral plane of the GaAs crystal.

Exemplary Embodiment 10

In accordance with the same procedure as in Exemplary Embodiment 6, the semiconductor wafer was fabricated that includes the Si wafer 2102, the inhibition layer 2104, the Ge crystal layer 2106, and the compound semiconductor 2108, which is a GaAs layer, for example. In the present exemplary embodiment, an intermediate layer was formed between the Ge crystal layer 2106 and the compound semiconductor 2108. In the present exemplary embodiment, the planar shape of the covering region was a square with a side of 200 μm. The shape of the bottom of the opening 105 was a square with a side of 10 μm. After the Ge crystal layer 2106 having the thickness of 850 nm was formed by CVD within the opening 105, the Ge crystal layer 2106 was annealed at the temperature of 800° C.

After the Ge crystal layer 2106 was annealed, the temperature of the Si wafer 2102 on which the Ge crystal layer 2106 was formed was controlled to become 550° C., and the intermediate layer was then formed by MOCVD. The intermediate layer was grown using trimethyl gallium and arsine as the source gases. The intermediate layer had the thickness of 30 nm. Subsequently, the temperature of the Si wafer 2102 on which the intermediate layer was formed was raised to 640° C., and the GaAs layer was formed by MOCVD as an example of the compound semiconductor 2108. The GaAs layer had the thickness of 500 nm. Except for these conditions, the semiconductor wafer was fabricated under the same conditions as in Exemplary Embodiment 6.

Figure 44:
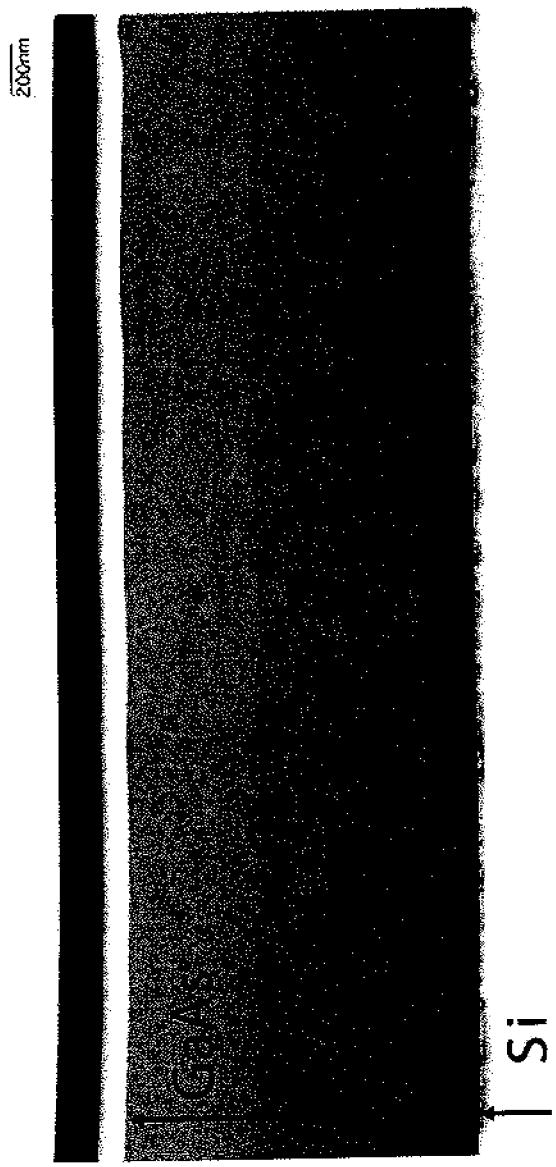
FIG. 44 shows an electron microscopic photograph of a semiconductor wafer in Exemplary Embodiment 10.

FIG. 44 shows the cross-section of the fabricated semiconductor wafer observed by a transmission electron microscope. As seen from FIG. 44, no dislocations were found in the Ge crystal layer 2106 and the GaAs layer. This means that the above-described configuration makes it possible to form a high-quality Ge layer and a compound semiconductor layer that has a lattice match or a pseudo lattice match with the Ge layer on a Si wafer.

Exemplary Embodiment 11

In accordance with the same procedure as in Exemplary Embodiment 10, the semiconductor wafer was fabricated that includes the Si wafer 2102, the inhibition layer 2104, the Ge crystal layer 2106, the intermediate layer, and the compound semiconductor 2108, which is a GaAs layer, for example. After this, the fabricated semiconductor wafer was utilized to fabricate an HBT element structure. The HBT element structure was fabricated according to the following procedure. To begin with, the semiconductor wafer was fabricated in accordance with the same procedure as in Exemplary Embodiment 10. In the present exemplary embodiment, the planar shape of the covering region was a square with a side of 50 μm. The shape of the bottom of the opening 105 was a square with a side of 20 μm. Except for these conditions, the semiconductor wafer was fabricated under the same conditions as in Exemplary Embodiment 10.

Subsequently, semiconductor layers were formed by MOCVD on the surface of the GaAs layer of the fabricated semiconductor wafer. In this manner, the HBT element structure was provided that includes the Si wafer 2102, the Ge crystal layer 2106 having the thickness of 850 nm, the intermediate layer having the thickness of 30 nm, the undoped GaAs layer having the thickness of 500 nm, an n-type GaAs layer having the thickness of 300 nm, an n-type InGaP layer having the thickness of 20 nm, an n-type GaAs layer having the thickness of 3 nm, a GaAs layer having the thickness of 300 nm, a p-type GaAs layer having the thickness of 50 nm, an n-type InGaP layer having the thickness of 20 nm, an n-type GaAs layer having the thickness of 120 nm, and an n-type InGaAs layer having the thickness of 60 nm in the stated order. Furthermore, electrodes are disposed on the fabricated HBT element structure. Thus, an HBT element was fabricated as an exemplary electronic element or device. To form the semiconductor layers, Si was used as the n-type impurity. To form the semiconductor layers, C was used as the p-type impurity.

Figure 45:
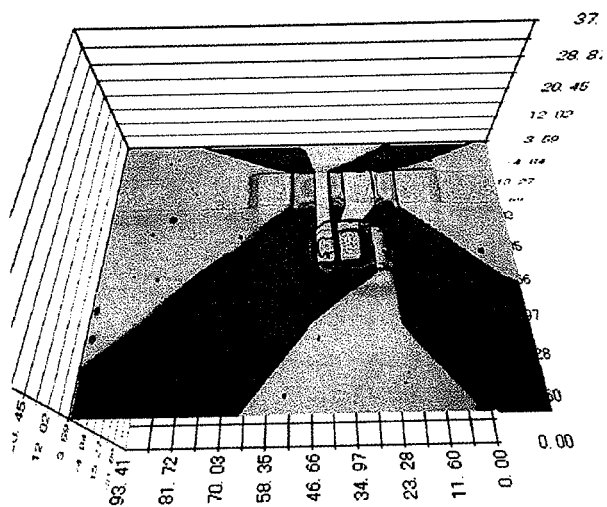
FIG. 45 shows a laser microscopic photograph of a HBT element in Exemplary Embodiment 11.

FIG. 45 shows a laser microscopic photograph of the fabricated HBT element. In FIG. 45, the pale gray portion indicates the electrodes. FIG. 45 shows that three electrodes are arranged within the region of the opening 105 in the vicinity of the center of the square-shaped covering region. The three electrodes are the base electrode, the emitter electrode, and the collector electrode of the HBT element from left in the drawing. Measuring the electrical characteristics of the HBT element confirmed that the HBT element could correctly operate as a transistor. Furthermore, examining the cross-section of the HBT element with a transmission electron microscope finds no dislocations.

Exemplary Embodiment 12

In accordance with the same procedure as in Exemplary Embodiment 11, three HBT elements having the same structure as the HBT element fabricated in Exemplary Embodiment 11 were fabricated. The fabricated three HBT elements were connected to each other in parallel. In the present exemplary embodiment, the planar shape of the covering region was a rectangle with a long side of 100 μm and a short side of 50 μm. In the covering region, three openings 105 were formed. All the openings 105 were shaped at the bottom as a square with a side of 15 μm. Except for these conditions, the HBT elements were fabricated under the same conditions as in Exemplary Embodiment 11.

Figure 46:
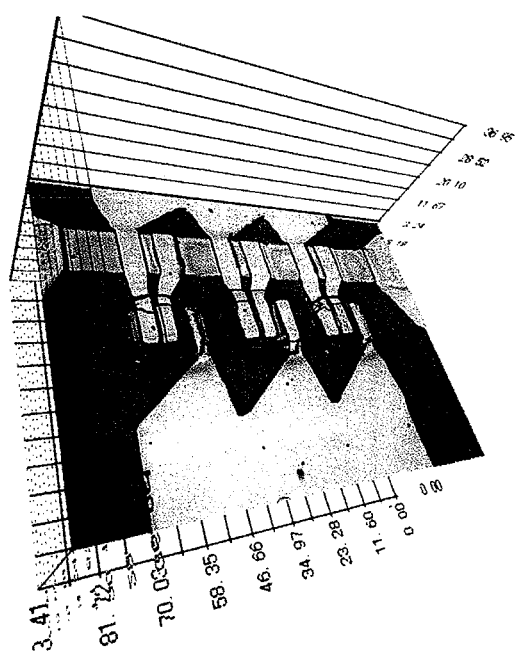
FIG. 46 shows a laser microscopic photograph of an electronic element in Exemplary Embodiment 12.

FIG. 46 shows a laser microscopic photograph of the fabricated HBT element. In FIG. 46, the pale gray portion indicates the electrodes. FIG. 46 shows that the three HBT elements were connected to each other in parallel. Measuring the electrical characteristics of the electronic elements confirmed that the electronic elements could correctly operate as a transistor.

Exemplary Embodiment 13

HBT elements were fabricated while the area of the bottom of the opening 105 was varied. In this manner, it was examined how the electrical characteristics of the fabricated HBT element were dependent on the area of the bottom of the opening 105. The HBT elements were fabricated in accordance with the same procedure as in Exemplary Embodiment 11. The measured electrical characteristics of the HBT element included the base sheet resistance $R_b$ [Ω/□] and the current gain β. The current gain β was calculated by dividing the value of the collector current by the value of the base current. In the present exemplary embodiment, HBT elements were fabricated with the shape of the bottom of the opening 105 being varied between a square with a side of 20 a rectangle with a short side of 20 μm and a long side of 40 μm, a square with a side of 30 μm, a rectangle with a short side of 30 μm and a long side of 40 μm, and a rectangle with a short side of 20 μm and a long side of 80 μm.

When the shape of the bottom of the opening 105 was a square, the opening 105 was formed such that one of the two sides of the shape of the bottom of the opening 105 that are perpendicular to each other extended in parallel to the <010> direction of the Si wafer 2102 and the other side extended in parallel to the <001> direction of the Si wafer 2102. When the shape of the bottom of the opening 105 was a rectangle, the opening 105 was formed such that the long side of the shape of the bottom of the opening 105 extended in the parallel direction to the <010> direction of the Si wafer 2102 and the short side extended in the parallel direction to the <001> direction of the Si wafer 2102. The planar shape of the covering region was mainly set to a square with a side of 300 μm.

FIG. 47 shows how the ratio of the current gain β to the base sheet resistance $R_b$ of the HBT element is dependent on the area [μm²] of the bottom of the opening 105. In FIG. 47, the vertical axis represents the value obtained by dividing the current gain β by the base sheet resistance $R_b$ and the horizontal axis represents the area of the bottom of the opening 105. Although FIG. 47 does not show the values of the current gain β, high values around 70 to 100 were accomplished for the current gain. On the other hand, when an HBT element was formed in which the same HBT element structure was formed on the entire plane of the Si wafer 2102, the current gain β was 10 or less.

This tells that devices with excellent electrical characteristics can be fabricated by locally forming the HBT element structure on the surface of the Si wafer 2102. In particular, it has been proved that devices with excellent electrical characteristics can be fabricated when the bottom of the opening 105 has a shape with a side of 80 μm or less, or has an area of 1600 μm² or less. In this case, the bottom of the seed crystal formed within the opening 105 similarly has a maximum width of 80 μm or less, or has an area of 1600 μm² or less. Here, the maximum width of the bottom of the seed crystal is defined as the length of the longest straight light connecting between any two points on the bottom of the seed crystal.

FIG. 47 tells that, when the bottom of the opening 105 has an area of 900 μm² or less, the ratio of the current gain β to the base sheet resistance $R_b$ varies less than when the bottom of the opening 105 has an area of 1600 μm². This indicates that the devices can be manufactured with high yield when the bottom of the opening 105 has a shape with a side of 40 μm or less or has an area of 900 μm² or less. In this case, the bottom of the seed crystal formed within the opening 105 similarly has a maximum width of 40 μm or less, or has an area of 900 μm² or less.

As described above, a semiconductor wafer could be fabricated by a method of manufacturing a semiconductor wafer, including: a step of forming, on a main plane of a Si wafer, an inhibition layer that inhibits crystal growth; a step of forming, in the inhibition layer, an opening that penetrates through the inhibition layer in a substantially perpendicular direction to the main plane of the wafer to reach the wafer by patterning the inhibition layer; a step of growing a Ge layer within the opening 105 in contact with the wafer; and a step of growing a functional layer on the Ge layer. A semiconductor wafer could be fabricated by a method of manufacturing a semiconductor wafer, including: a step of forming an inhibition layer on a Si wafer, where the inhibition layer has an opening 105 and inhibits crystal growth; a step of forming a Ge layer within the opening 105; and a step of forming a functional layer after the Ge layer is formed.

As described above, a semiconductor wafer could be fabricated by forming on a main plane of a Si wafer an inhibition layer that inhibits crystal growth, forming in the inhibition layer an opening 105 that penetrates through the inhibition layer in a substantially perpendicular direction to the main plane of the wafer to reach the wafer, forming a Ge layer by crystal growth within the opening 105 in contact with the wafer, and forming a functional layer by crystal growth on the Ge layer. A semiconductor wafer could be fabricated that includes a Si wafer, an inhibition layer that is provided on the wafer, that has an opening 105, and that inhibits crystal growth, a Ge layer that is formed within the opening 105, and a functional layer that is formed after the Ge layer is formed.

As described above, an electronic device could be fabricated by forming on a main plane of a Si wafer an inhibition layer that inhibits crystal growth, forming in the inhibition layer an opening 105 that penetrates through the inhibition layer in a substantially perpendicular direction to the main plane of the wafer to reach the wafer, forming a Ge layer by crystal growth within the opening 105 in contact with the wafer, forming a functional layer by crystal growth on the Ge layer, and forming an electronic element in the functional layer. An electronic device could be fabricated that includes a Si wafer, an inhibition layer that is provided on the wafer, that has an opening 105, and that inhibits crystal growth, a Ge layer that is formed within the opening 105, a functional layer that is formed after the Ge layer is formed, and an electronic element that is formed in the functional layer.

Exemplary Embodiment 14

Figure 48:
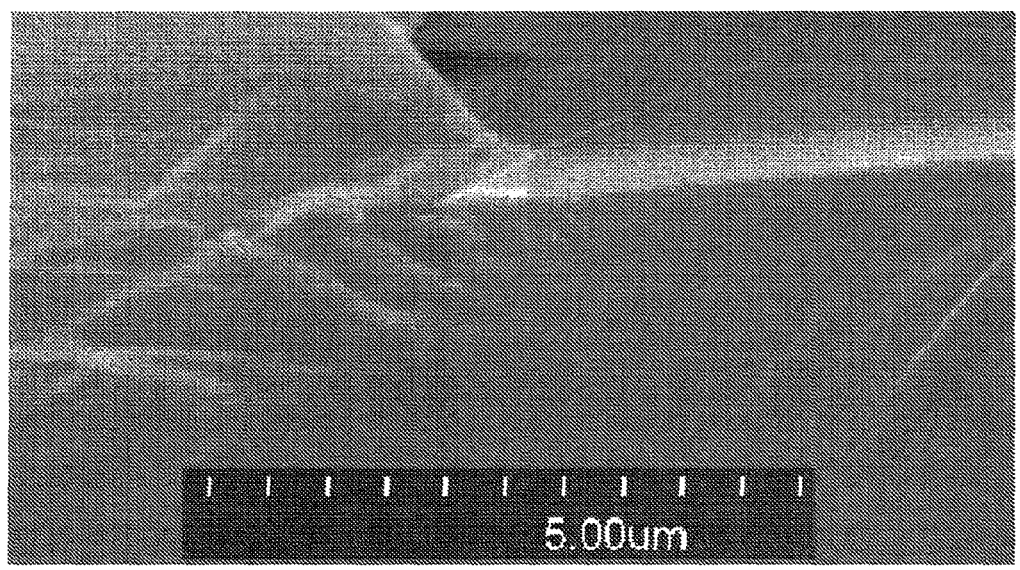
FIG. 48 is a scanning electron microscopic photograph showing crystals in cross-sectional view.
Figure 49:
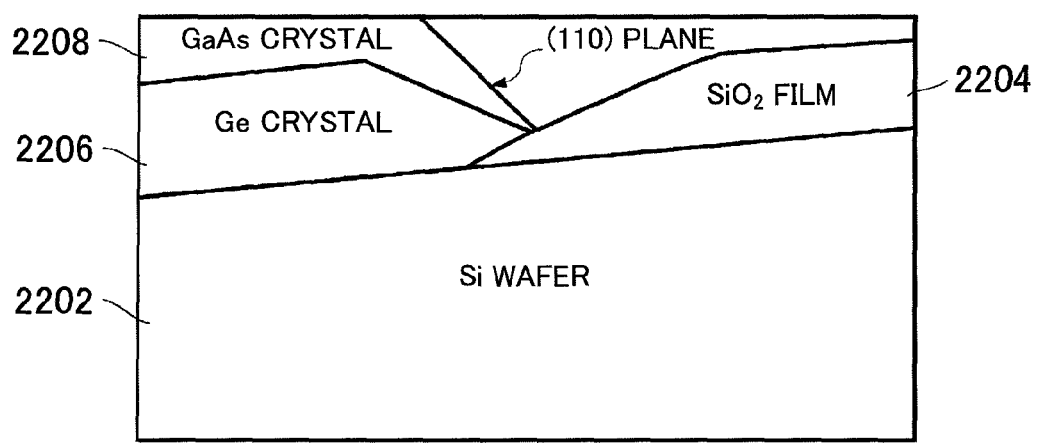
FIG. 49 is a simplified view of the photograph of FIG. 48 for ease of understanding.

FIG. 48 is a scanning electron microscopic photograph showing in cross-sectional view the crystals of a fabricated semiconductor wafer. FIG. 49 is a simplified view of the photograph of FIG. 48 for ease of understanding. The semiconductor wafer was fabricated in the following manner. An Si wafer 2202, the main plane of which is the (100) plane, was provided. On the Si wafer 2202, a $SiO_2$ film 2204 was formed as an insulating film. In the $SiO_2$ film 2204, an opening 105 was formed that penetrates through the $SiO_2$ film 2204 to reach the main plane of the Si wafer 2202. On a portion of the main plane of the Si wafer 2202 that is externally exposed through the opening 105, a Ge crystal 2206 was formed by CVD using monogermane as the source. The Si wafer 2202, the $SiO_2$ film 2204, and the Ge crystal 2206 were respectively equivalent to the Si crystal layer 166, the inhibition layer 104, the Ge crystal layer 106.

On the Ge crystal 2206, a GaAs crystal 2208 was grown to form a seed compound semiconductor by MOCVD using trimethyl gallium and arsine as the source. The GaAs crystal 2208 was equivalent to the seed compound semiconductor crystal 108. The growth of the GaAs crystal 2208 included low-temperature growth at the temperature of 550° C. followed by growth at the temperature of 640° C. During the growth at the temperature of 640° C., the partial pressure of arsine was set at 0.05 kPa. It can be confirmed that the GaAs crystal 2208 is grown on the Ge crystal 2206. It can be confirmed that the (110) plane appears as the seed plane of the GaAs crystal 2208.

Subsequently, the GaAs crystal 2208 was further laterally grown as a laterally grown compound semiconductor layer. During the lateral growth, the temperature was set at 640° C. and the partial pressure of arsine was set at 0.43 kPa.

Figure 50:
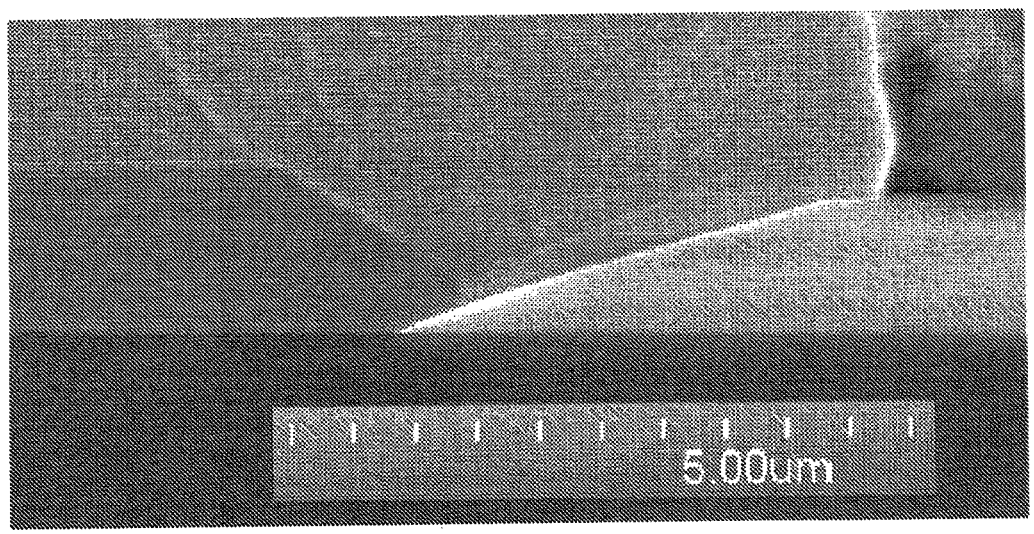
FIG. 50 is a scanning electron microscopic photograph showing crystals in cross-sectional view.
Figure 51:
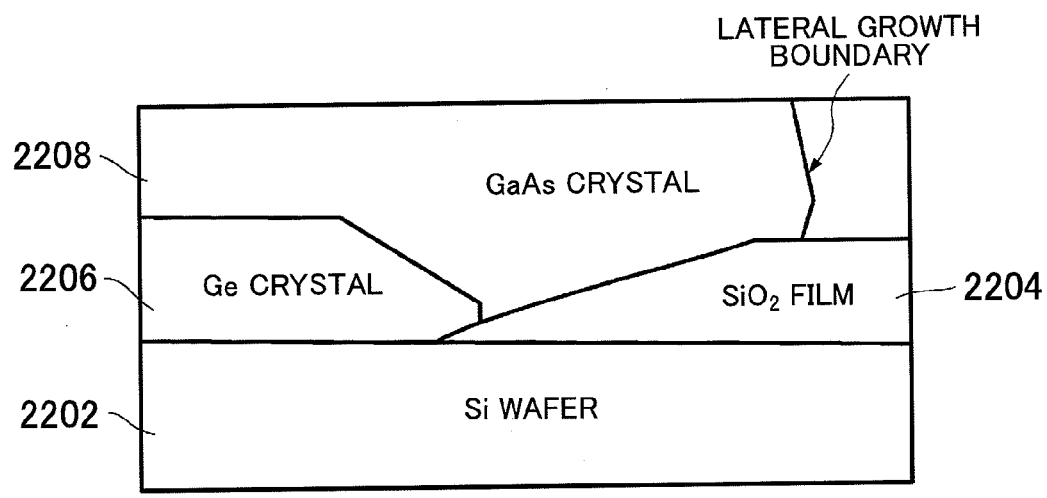
FIG. 51 is a simplified view of the photograph of FIG. 50 for ease of understanding.

FIG. 50 is a scanning electron microscopic photograph showing the grown crystals in cross-sectional view. FIG. 51 is a simplified view of the photograph of FIG. 50 for ease of understanding. It can be seen that the GaAs crystal 2208 has the lateral growth surface positioned on the $SiO_2$ film 2204 and that the GaAs crystal 2208 is laterally grown on the $SiO_2$ film 2204. The laterally grown portion is free from defects. Therefore, electronic devices formed on the laterally grown portion can accomplish excellent performance.

Exemplary Embodiment 15

A semiconductor wafer was fabricated by selectively growing the Ge crystal 2206 on the Si wafer 2202 in accordance with the same procedure as in Exemplary Embodiment 14. The fabricated semiconductor wafer was subjected to cycle annealing in which annealing at the temperature of 800° C. and annealing at the temperature of 680° C. were repeated at 10 times. The resulting semiconductor wafer (hereinafter, referred to as the sample A) was evaluated in terms of the Si element concentration and the Ge element concentration at the boundary between the Ge crystal 2206 and the Si wafer 2202 using an energy dispersive X-ray fluorescence spectrometer (hereinafter, may be referred to as EDX). Likewise, a semiconductor wafer that was manufactured by selectively growing a Ge crystal on the Si wafer 2202 but did not go through the cycle annealing (hereinafter, referred to as the sample B) was evaluated by the EDX in a similar manner.

Figure 52:
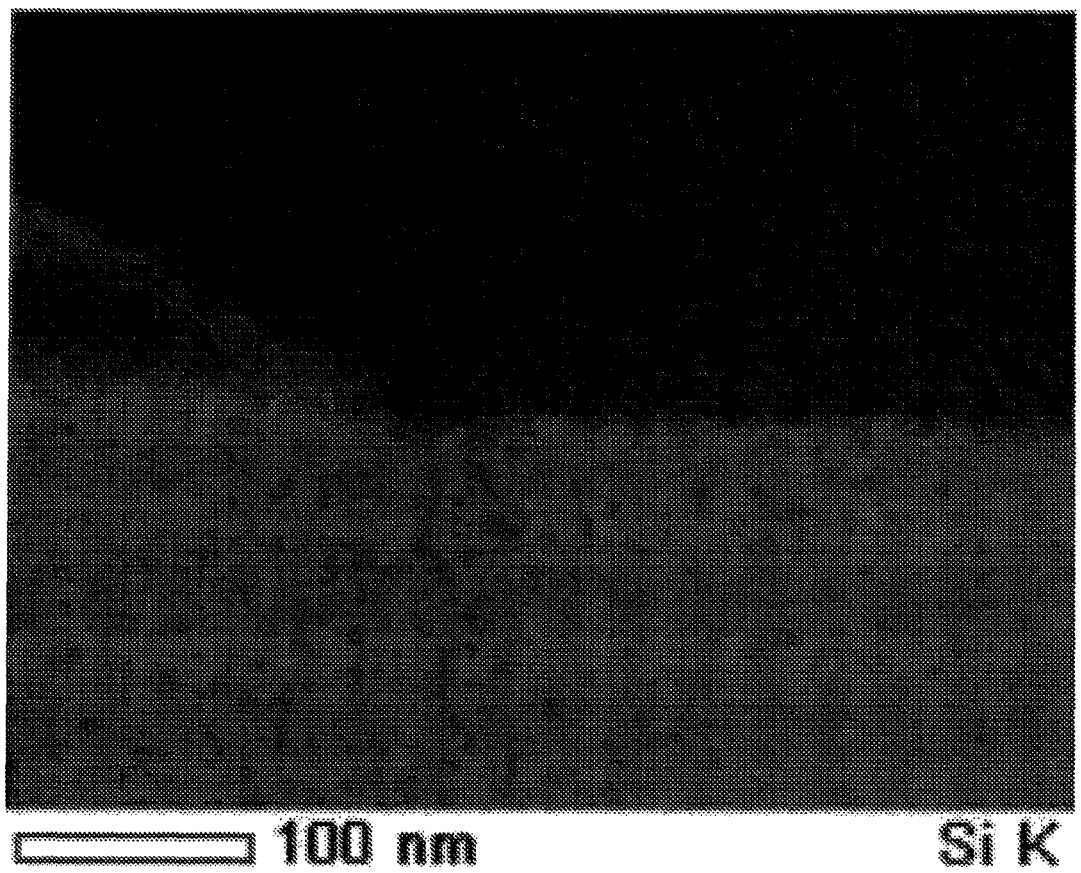
FIG. 52 shows the Si element profile in a sample A.
Figure 53:
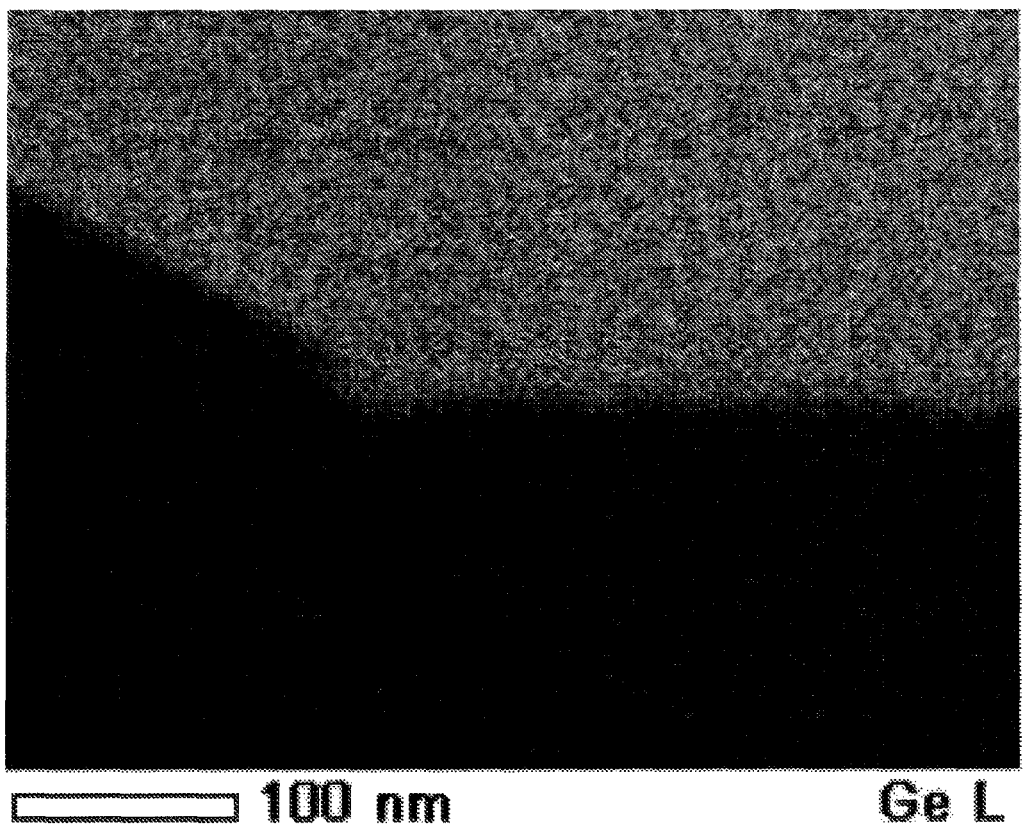
FIG. 53 shows the Ge element profile in the sample A.
Figure 55:
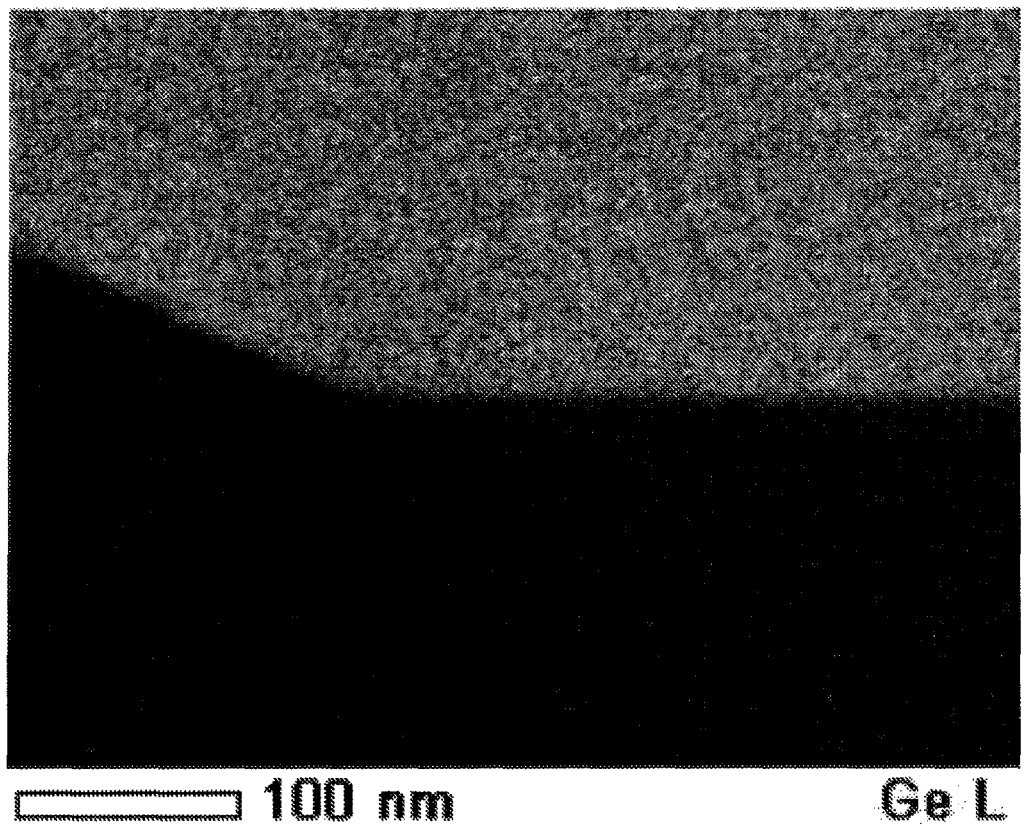
FIG. 55 shows the Ge element profile in the sample B.
Figure 56:
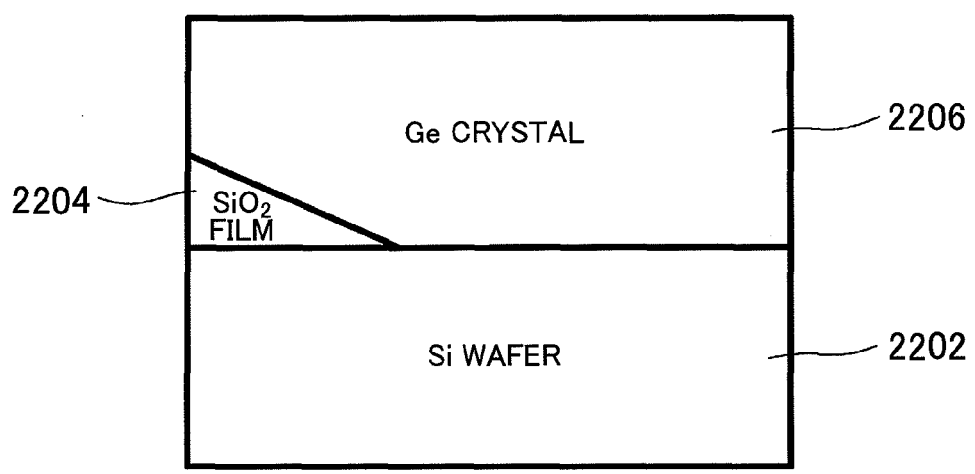
FIG. 56 is a simplified view provided for ease of understanding of FIGS. 52 to 55.

FIG. 52 shows the Si element profile in the sample A. FIG. 53 shows the Ge element profile in the sample A. FIG. 54 shows the Si element profile in the sample B. FIG. 55 shows the Ge element profile in the sample B. FIG. 56 is a simplified view provided for ease of understanding of FIGS. 52 to 55. In the sample B, a sharp boundary is formed between the Si wafer 2202 and the Ge crystal. In the sample A, on the other hand, a blurry boundary is formed, which indicates that Ge is diffused into the Si wafer 2202. The Si wafer 2202, the $SiO_2$ film 2204, and the Ge crystal 2206 are respectively equivalent to the Si wafer 2102, the inhibition layer 2104, and the Ge crystal layer 2106.

Figure 57:
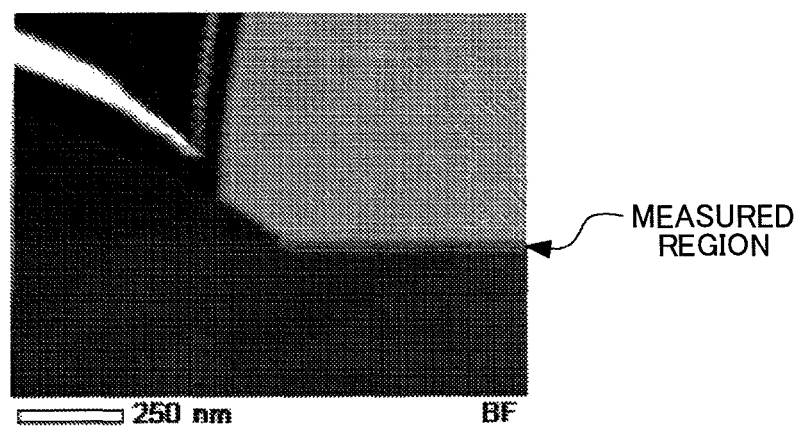
FIG. 57 is a SEM photograph showing the measured region in the sample A.

The Si element intensity integral value and the Ge element intensity integral value were measured in a limited measured region of the samples A and B. The measured region is defined as the boundary between the Si wafer 2202 and the Ge crystal 2206. FIG. 57 is a SEM photograph showing the measured region in the sample A. In FIG. 57 (the SEM photograph), the measured region, in which the element intensity integral values were measured, was positioned in the Si wafer 2202 and below the Ge crystal 2206 and extends between the distance of 10 nm and the distance of 15 nm from the boundary (the boundary observed in the SEM photograph) between the Si wafer 2202 and the Ge crystal 2206.

Figure 58:
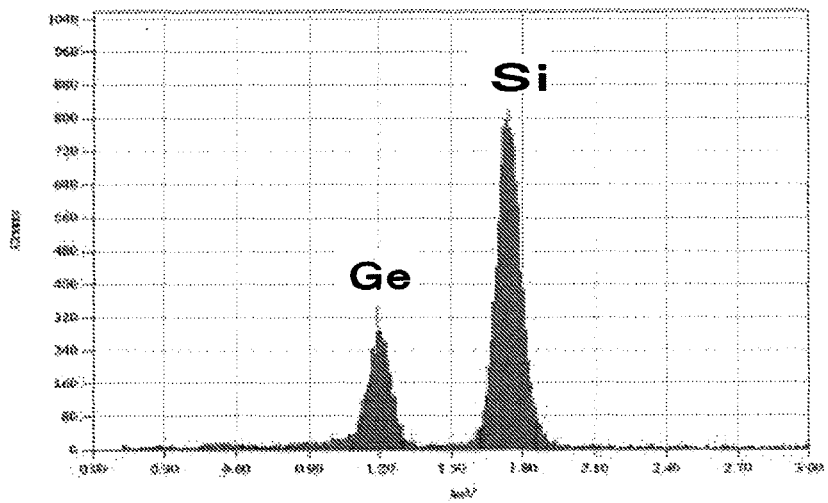
FIG. 58 shows the Si and Ge element intensity integral values in the measured region shown in FIG. 57.
Figure 59:
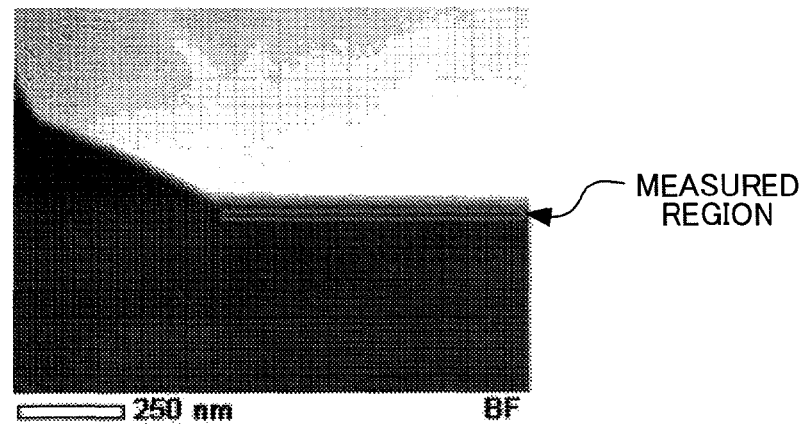
FIG. 59 is a SEM photograph showing the measured region in sample B.
Figure 60:
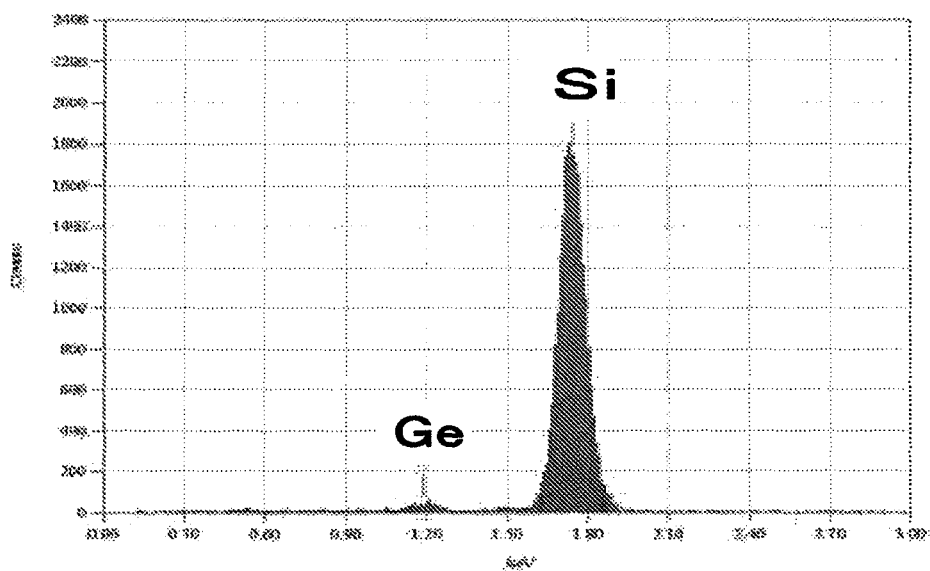
FIG. 60 shows the Si and Ge element intensity integral values in the measured region shown in FIG. 59.

FIG. 58 shows the Si and Ge element intensity integral values in the measured region shown in FIG. 57. FIG. 59 is a SEM photograph showing the measured region in the sample B. FIG. 60 shows the Si and Ge element intensity integral values in the measured region shown in FIG. 59. In the sample B, the Ge signal is rarely detected and the Si signal is dominant. In the sample A, on the other hand, the Ge signal is relatively greater. This proves that Ge is diffused into the Si wafer 2202 in the sample A.

In the region in which the Si wafer 2202 is in contact with the $SiO_2$ film 2204, the Si element profile in the depth direction is plotted. In this region, the boundary between the Si wafer 2202 and the Ge crystal is defined such that, at the boundary, the total of the Si intensity in the Si wafer 2202 and the Si intensity in the $SiO_2$ film 2204 reaches 50%. Then, in the region that is in the Si wafer 2202 and extends between the distance of 5 nm and the distance of 10 nm from the above-defined boundary, the Ge and Si element intensity ratios were respectively measured. Based on the measured element intensity ratios, the Ge element intensity integral value and the Si element intensity integral value were calculated in the depth direction and the ratio between the integral values (Ge/Si) was calculated.

The resulting ratio was 3.33 for the sample A and 1.10 for the sample B. Thus, the average Ge concentration within the region that is in the Si wafer 2202 and extends between the distance of 5 nm and the distance of 10 nm from the boundary between the Si wafer 2202 and the Ge crystal 2206 was 77% in the sample A and 52% in the sample B. The samples A and B were examined in terms of dislocations using a transmission electron microscope. The examination revealed that no dislocations reached the surface of the Ge crystal 2206 in the sample A. On the other hand, the examination found that the sample B included dislocations that reach the crystal surface with the density of approximately 1×109 cm-2. Consequently, it was confirmed that cycle annealing effectively reduced the dislocations in the Ge crystal 2206.

Exemplary Embodiment 16

A sample C was fabricated in such a manner that the GaAs crystal 2208 was grown by MOCVD on the Ge crystal 2206, which has been subjected to the cycle annealing similarly to the sample A of Exemplary Embodiment 15, and that a multilayer structure film constituted by a GaAs layer and an InGaP layer was stacked on the GaAs crystal 2208. Furthermore, a sample D was fabricated by forming the GaAs crystal 2208 and the multilayer structure film in the same manner as above except for that the Ge crystal 2206 did not go through the post annealing.

The samples C and D were evaluated using an EDX in the same manner as in Exemplary Embodiment 15. Specifically speaking, the Ge and Si element intensity ratios were measured in the region that is in the Si wafer 2202 and extends between the distance of 5 nm and the distance of 10 nm from the boundary between the Si wafer 2202 and the Ge crystal. Furthermore, the Ge element intensity integral value and the Si element intensity integral value were calculated in the depth direction and the ratio between the integral values (Ge/Si) was calculated. The resulting ratio was 2.28 for the sample C and 0.60 for the sample D. Thus, the average Ge concentration within the region that is in the Si wafer 2202 and extends between the distance of 5 nm and the distance of 10 nm from the boundary between the Si wafer 2202 and the Ge crystal was 70% in the sample C and 38% in the sample D.

The samples C and D were examined in terms of dislocations using a transmission electron microscope. The examination revealed that no dislocations reached the multilayer structure film constituted by the GaAs layer and the InGaP layer in the sample C. On the other hand, the examination found that the sample D included dislocations that reach the multilayer structure film constituted by the GaAs layer and the InGaP layer. As is apparent from the above, when the average Ge concentration is 60% or higher in the region that is in the Si wafer 2202 and extends between the distance of 5 nm and the distance of 10 nm from the boundary between the Si wafer 2202 and the Ge crystal, a compound semiconductor layer with a higher quality can be formed on the Ge crystal. The average Ge concentration is more preferably 70% or higher.

Exemplary Embodiment 17

Exemplary Embodiment 17 demonstrates that the growth rate of a device forming thin film may vary according to the width of an inhibition layer with reference to the experimental data provided by the named inventors. The device forming thin film indicates a thin film that is processed to constitute a part of a semiconductor device. For example, when a semiconductor device is formed by sequentially stacking a plurality of compound semiconductor thin films on a silicon crystal and processing the stacked compound semiconductor thin films, the device forming thin film includes the stacked compound semiconductor thin films. Furthermore, the device forming thin film also includes a buffer layer formed between the silicon crystal and the stacked compound semiconductor thin films and also includes a seed layer that serves as a nucleus of the crystal growth of the buffer layer or the compound semiconductor thin films.

The growth rate of the device forming thin film determines the characteristics of the device forming thin film such as flatness and crystallinity. The characteristics of the device forming thin film in turn strongly affect the capability of the semiconductor device to be formed in the device forming thin film. Therefore, the growth rate of the device forming thin film needs to be appropriately controlled to satisfy the characteristic requirements of the device forming thin film that are derived from the specification requirements of the semiconductor device. The following experimental data indicates that the growth rate of the device forming thin film varies according to the width of the inhibition layer and other parameters. By using the following experimental data the shape of the inhibition layer can be designed in a manner to achieve an appropriate growth rate of the device forming thin film that is derived from the specification requirements of the device forming thin film.

Figure 61:
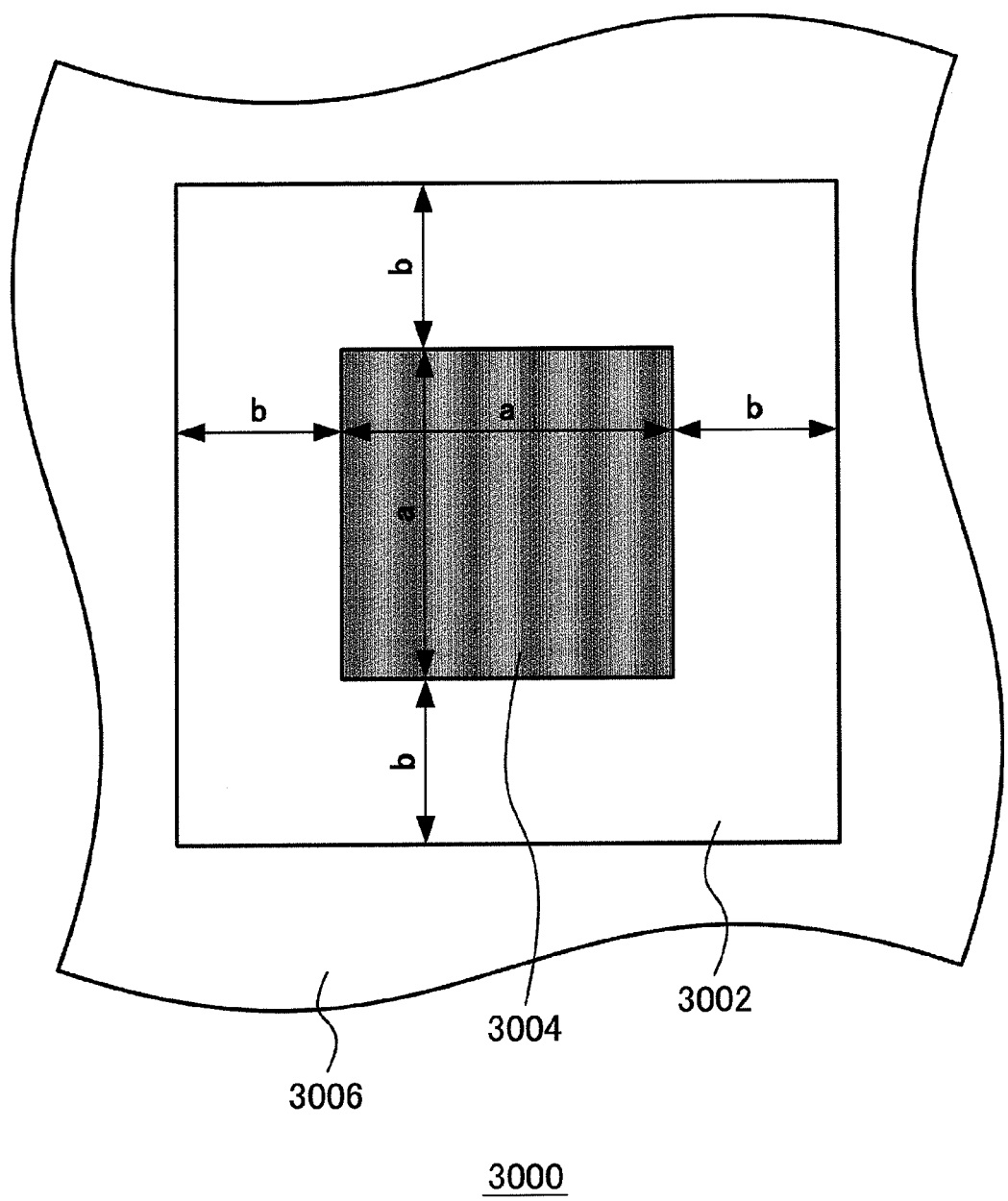
FIG. 61 illustrates a plan view illustrating a semiconductor device forming wafer 3000 manufactured in Exemplary Embodiment 2.

FIG. 61 illustrates a plan view illustrating a semiconductor device forming wafer 3000 manufactured in Exemplary Embodiment 17. The semiconductor device forming wafer 3000 has an inhibition layer 3002, a device forming thin film 3004, and a sacrificial growth portion 3006 on a base wafer. The inhibition layer 3002, the device forming thin film 3004, and the sacrificial growth portion 3006 were formed such that the inhibition layer 3002 surrounds the device forming thin film 3004 and the sacrificial growth portion 3006 surrounds the inhibition layer 3002.

The inhibition layer 3002 was formed so as to have a substantially square outline and have a substantially square opening at the center of the square. The length of the side a of the opening was set at 30 μm or 50 μm. The width b of the inhibition layer 3002, which is defined as the distance between the outer periphery of the inhibition layer 3002 and the inner periphery of the inhibition layer 3002 varied within the range of 5 μm to 20 μm. The inhibition layer 3002 was made of silicon dioxide ($SiO_2$). No crystals are epitaxially grown on the surface of the silicon dioxide layer when the epitaxial growth conditions were adapted to realize selective MOCVD. The inhibition layer 3002 was formed by, after forming a silicon dioxide film on a base wafer by dry thermal oxidization, patterning the silicon dioxide film by photolithography.

A compound semiconductor crystal was selectively epitaxially grown by MOCVD on a portion of the base wafer in which the inhibition layer 3002 was not formed. The compound semiconductor crystal that is epitaxially grown in the opening surrounded by the inhibition layer 3002 constitutes the device forming thin film 3004, and the compound semiconductor crystal that externally surrounds the inhibition layer 3002 constitutes the sacrificial growth portion 3006. The compound semiconductor crystal was a GaAs crystal, an InGaP crystal, or a p-type doped GaAs crystal (p$^-$GaAs crystal). The Ga source was trimethyl gallium ($Ga(CH_3)_3$) and the As source was arsine ($AsH_3$). The In source was trimethyl indium ($In(CH_3)_3$) and the P source was phosphine ($PH_3$). Doping with carbon (C), which served as p-type impurities, was controlled by adjusting the added amount of bromotrichloromethane ($CBrCl_3$), which served as dopants. The epitaxial growth was carried out at the temperature of 610° C.

FIG. 62 is a graph showing how the growth rate of the device forming thin film 3004 is dependent on the width of the inhibition layer 3002 when GaAs is epitaxially grown to form the device forming thin film 3004 and the sacrificial growth portion 3006. FIG. 63 is a graph showing how the growth rate of the device forming thin film 3004 is dependent on its area ratio when GaAs is epitaxially grown to form the device forming thin film 3004 and the sacrificial growth portion 3006. FIG. 64 is a graph showing how the growth rate of the device forming thin film 3004 is dependent on the width of the inhibition layer 3002 when InGaP is epitaxially grown to form the device forming thin film 3004 and the sacrificial growth portion 3006.

FIG. 65 is a graph showing how the growth rate of the device forming thin film 3004 is dependent on its area ratio when InGaP is epitaxially grown to form the device forming thin film 3004 and the sacrificial growth portion 3006. FIG. 66 is a graph showing how the growth rate of the device forming thin film 3004 is dependent on the width of the inhibition layer 3002 when p$^-$GaAs is epitaxially grown to form the device forming thin film 3004 and the sacrificial growth portion 3006. FIG. 67 is a graph showing how the growth rate of the device forming thin film 3004 is dependent on its area ratio when p$^-$GaAs is epitaxially grown to form the device forming thin film 3004 and the sacrificial growth portion 3006.

In FIGS. 62 to 67, the vertical axis represents the growth rate ratio of the compound semiconductor crystal. The growth rate ratio is defined in comparison with the growth rate of the compound semiconductor crystal on a plain plane that does not have the inhibition layer 3002, where the plain plane is assumed to have a growth rate of 1. The area ratio is defined as the ratio of the area of the region in which the device forming thin film 3004 to the total of the area of the region in which the device forming thin film 3004 is formed and the area of the region in which the inhibition layer 3002 is formed.

In FIGS. 62 to 67, the black square or diamond marks are actually measured values. The solid lines represent experimental lines. The experimental lines were each a quadratic function with one variable, and the coefficients of each polynomial were calculated by the least squares method. For the comparison purposes, the growth rate ratio calculated when the device forming thin film 3004 was grown without the sacrificial growth portion 3006 is indicated by the dotted lines. The dotted lines L1 correspond to the case where the area of the opening in the inhibition layer 3002 is 50 μm☐, and the dotted lines L2 correspond to the case where the area of the opening in the inhibition layer 3002 is 30 µm□. The case of "without the sacrificial growth portion 3006" is the case where the inhibition layer 3002 covers the region corresponding to the sacrificial growth portion 3006.

As seen from FIGS. 62 to 67, as the width of the inhibition layer 3002 increased, the growth rate increased, and as the area ratio decreased, the growth rate increased. In addition, the actually measured values agreed well with the experimental lines. Therefore, the quadratic-function experiment lines can be used to design the inhibition layer 3002 in a manner that a desired growth rate may be realized.

The above-described experimental results can be explained when the following crystal growth mechanism is taken into consideration. The Ga and As atoms, from which the deposited crystals are formed, are thought to be supplied by the molecules that fly from a space or move over a surface. The named inventors of the present invention think that the dominant supply source is the molecules that move over a surface in the case of the reaction environment in which selective epitaxial growth takes place based on MOCVD. Specifically speaking, the source molecules (precursors) that fly to the inhibition layer 3002, excluding some escaping from the surface, migrate along the surface of the inhibition layer 3002 to be supplied to the device forming thin film 3004 or the sacrificial growth portion 3006. Here, as the width of the inhibition layer 3002 increases, the absolute number of the source molecules supplied by the surface migration increases, thereby increasing the growth rate of the device forming thin film 3004. Also, as the ratio of the area of the device forming thin film 3004 to the total area decreases, the source molecules supplied from the inhibition layer 3002 to the device forming thin film 3004 relatively increases. This results in a higher growth rate of the device forming thin film 3004.

Bearing the above-described growth mechanism in mind, the function of the sacrificial growth portion 3006 can be understood as follows. If the sacrificial growth portion 3006 is not provided, the source molecules are excessively supplied to the device forming thin film 3004. This will disturb the surface of the device forming thin film 3004 and degrade the crystallinity of the device forming thin film 3004. In other words, the sacrificial growth portion 3006 serves to take in an appropriate portion of the source molecules that fly to the inhibition layer 3002, thereby appropriately controlling the amount of the source molecules supplied to the device forming thin film 3004. Stated differently, the sacrificial growth portion 3006 serves to prevent the source molecules from being excessively supplied to the device forming thin film 3004 by consuming some of the source molecules through sacrificial growth.

Figure 69:
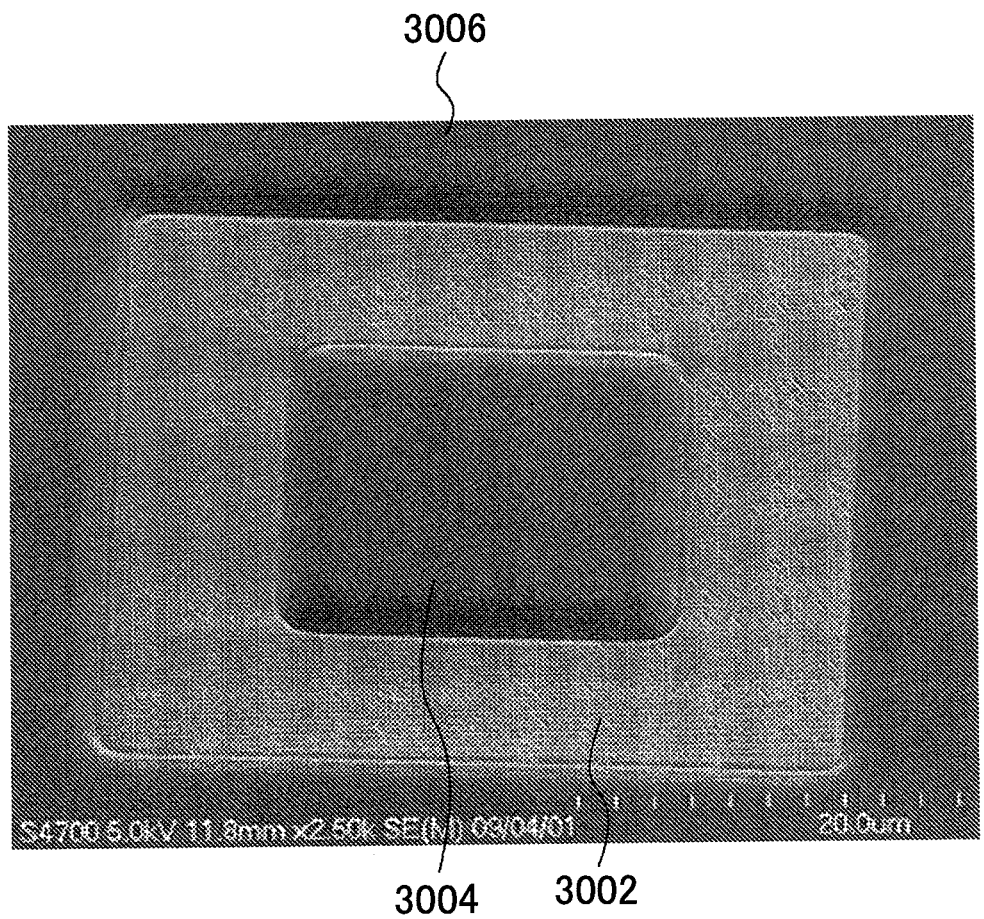
FIG. 69 is an electron microscopic photograph showing the surface of the semiconductor device forming wafer 3000 in which the base wafer has an off angle of 2°.

FIGS. 68 and 69 are electron microscopic photographs showing the surface of the semiconductor device forming wafer 3000 in which the base wafer has an off angle of 2°. FIG. 68 shows the state after epitaxial growth and FIG. 69 shows the state after annealing. FIGS. 70 and 71 are electron microscopic photographs showing the surface of the semiconductor device forming wafer 3000 in which the base wafer has an off angle of 6°. FIG. 70 shows the state after epitaxial growth and FIG. 71 shows the state after annealing. Here, the off angle is defined as the angle formed between the surface of the silicon constituting the base wafer and the crystallographically defined (100) plane.

As seen from FIGS. 68 and 70, the crystal surface was less rough when the off angle is 2° than when the off angle is 6°. Therefore, the off angle of 2° is preferable to the off angle of 6°. As seen from FIGS. 69 and 71, an excellent crystal surface was obtained after annealing whether the off angle was 2° or 6°. Therefore, it was proved that a crystal with good quality could be grown when the off angle falls in the range from 2° to 6°.

Exemplary Embodiment 18

Figure 72:
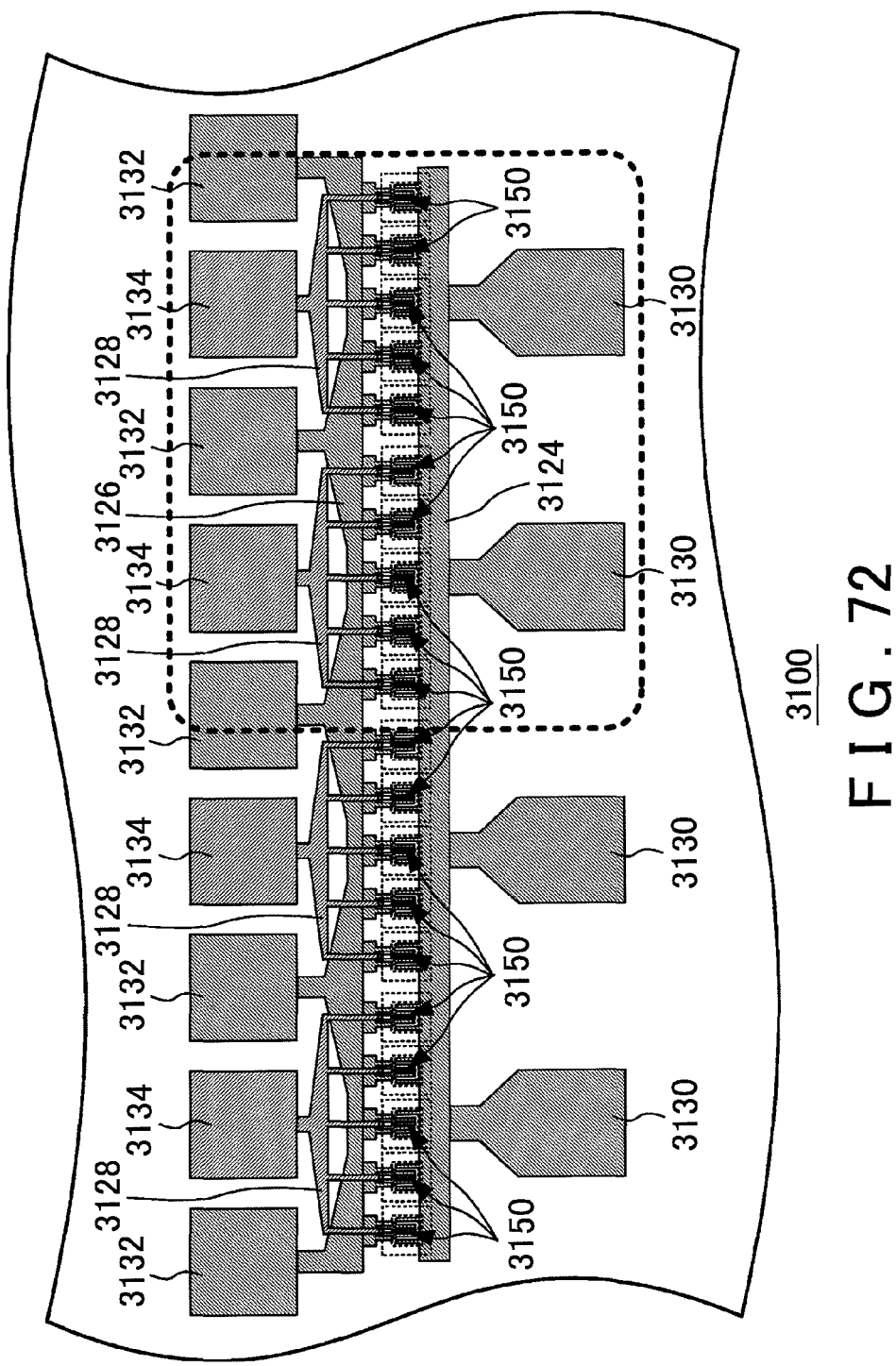
FIG. 72 is a plan view illustrating a hetero bipolar transistor (HBT) 3100.

FIG. 72 is a plan view illustrating a heterojunction bipolar transistor (HBT) 3100 manufactured by the named inventors of the present invention. The HBT 3100 is structured such that 20 HBT elements 3150 are connected in parallel. Note that FIG. 72 only shows a part of the base wafer in which one HBT 3100 is formed. The same base wafer has a test pattern and other semiconductor elements formed thereon, but they are not described here.

The collectors of the 20 HBT elements 3150 were connected in parallel by means of a collector interconnection 3124, the emitters were connected in parallel by means of an emitter interconnection 3126, and the bases were connected in parallel by means of base interconnections 3128. Note that the 20 bases were divided into four groups, so that five bases of each group were connected in parallel. The collector interconnection 3124 was connected to collector pads 3130, the emitter interconnection 3126 was connected to emitter pads 3132, and the base interconnections 3128 were connected to base pads 3134. The collector interconnection 3124, the collector pads 3130, the emitter interconnection 3126, and the emitter pads 3132 were formed in the same first interconnection layer, and the base interconnections 3128 and the base pads 3134 were formed in a second interconnection layer, which was above the first interconnection layer.

Figure 73:
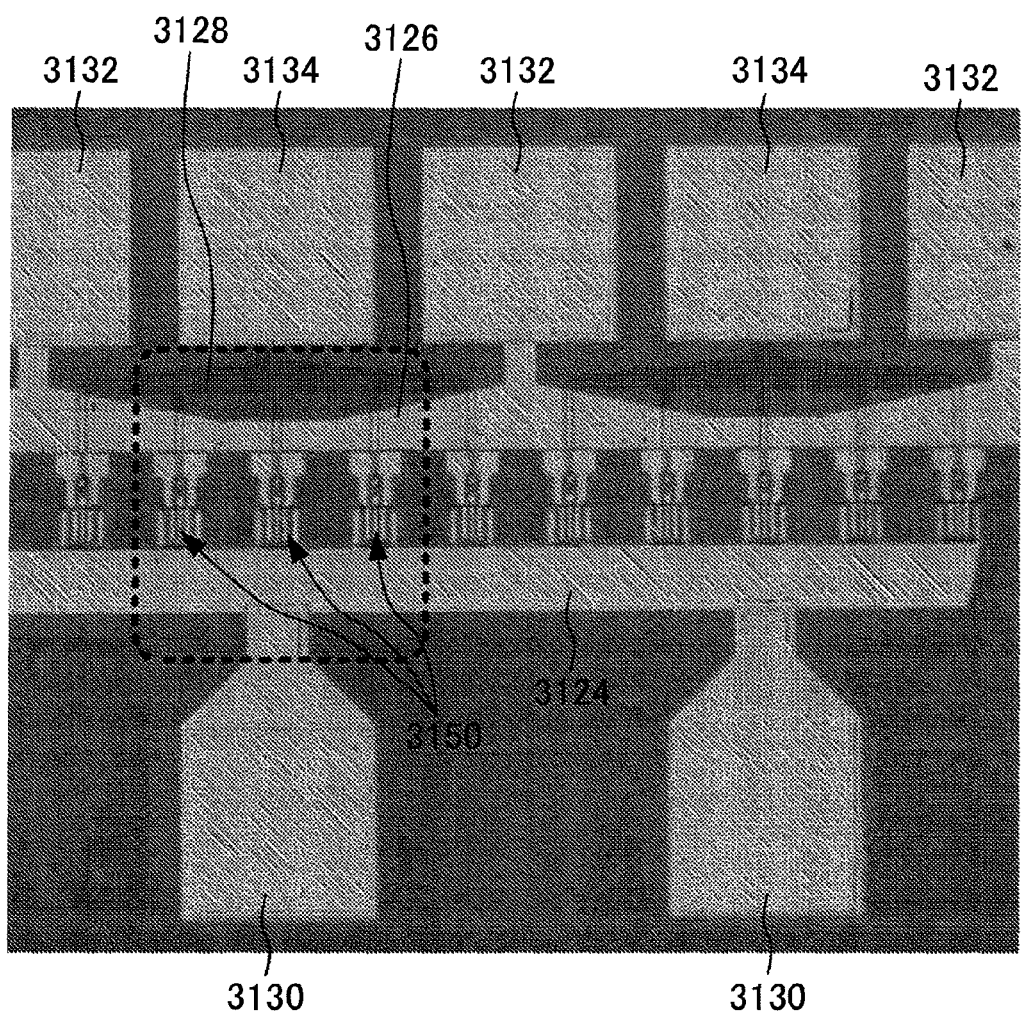
FIG. 73 is a microscopic photograph showing the portion enclosed by the dashed line in FIG. 20.
Figure 74:
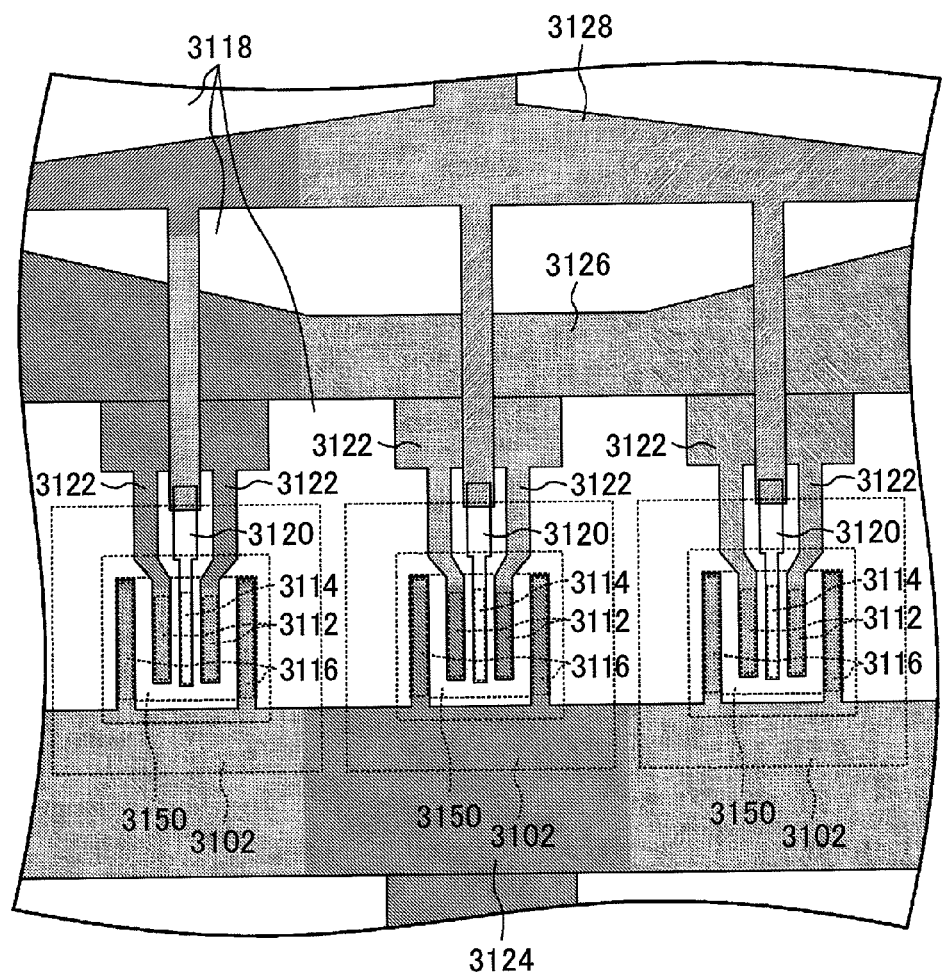
FIG. 74 is an enlarged plan view illustrating the three HBT elements 3150 enclosed by the dashed line in FIG. 21.
Figure 75:
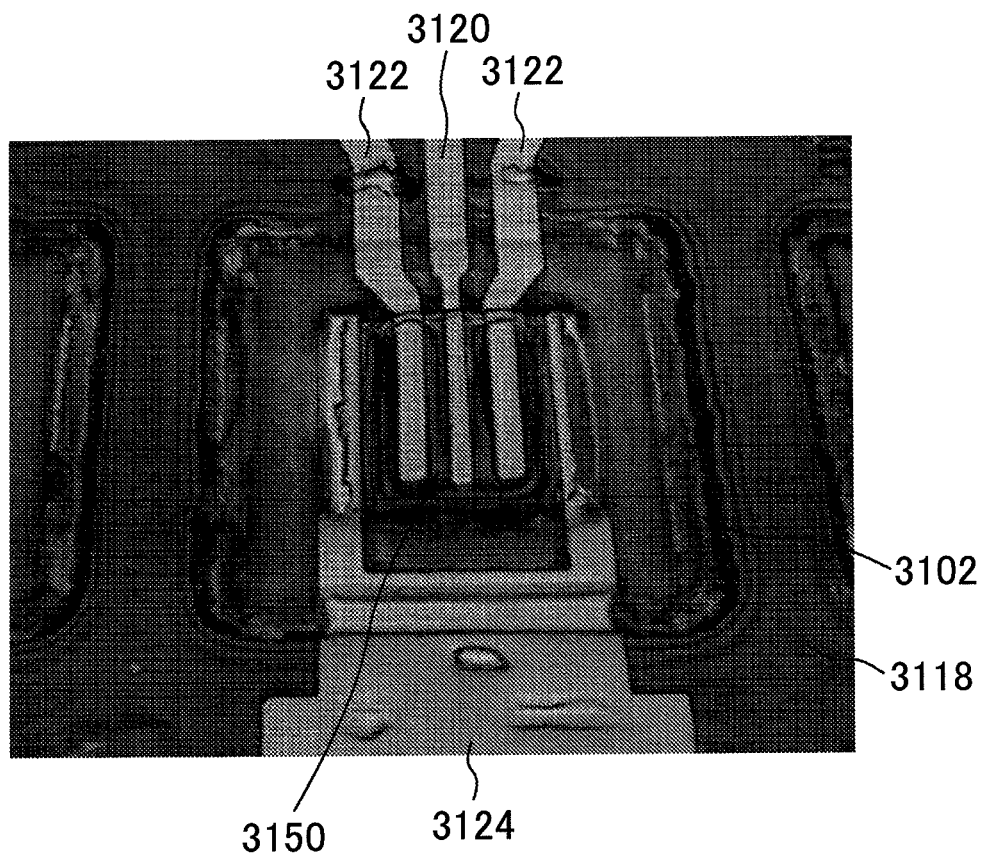
FIG. 75 is a laser microscopic photograph showing the region of a HBT element 3150.

FIG. 73 is a microscopic photograph showing the portion enclosed by the dashed line in FIG. 72. FIG. 74 is an enlarged plan view illustrating the three HBT elements 3150 enclosed by the dashed line in FIG. 73. The collector interconnection 3124 was connected to collector electrodes 3116, the emitter interconnection 3126 was connected to emitter electrodes 3112 via emitter extension interconnections 3122, and the base interconnections 3128 were connected to base electrodes 3114 via base extension interconnections 3120. Below the collector interconnection 3124, the emitter extension interconnections 3122, and the base extension interconnections 3120, a field insulating film 3118 was formed that insulated the HBT elements 3150 and the sacrificial growth portion from the collector interconnection 3124, the emitter extension interconnections 3122, and the base extension interconnections 3120. Below the field insulating film 3118, an inhibition layer 3102 was formed. Each HBT element 3150 was formed in a region surrounded by the inhibition layer 3102. FIG. 75 is a laser microscopic photograph showing the region of the HBT element 3150.

Figure 76:
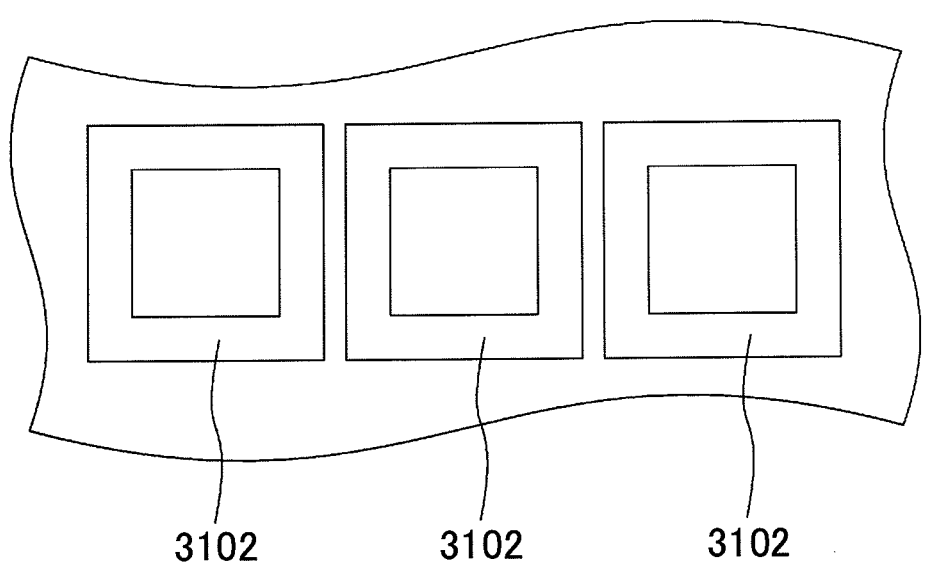
FIG. 76 is a plan view illustrating one of the steps of the manufacturing process of the HBT 3100.

FIGS. 76 to 80 are plan views illustrating the sequential steps of the manufacturing process of the HBT 3100. The base wafer was a silicon wafer. A silicon dioxide film was formed by dry thermal oxidization on the base wafer. After this, the silicon dioxide film was patterned by photolithography into the inhibition layers 3102 as shown in FIG. 76.

As shown in FIG. 77, selective epitaxial growth was used to form device forming thin films 3108 in the regions enclosed by the inhibition layers 3102 and sacrificial growth portions 3110 in the regions surrounding the inhibition layers 3102. The device forming thin films 3108 were each formed by sequentially stacking, on the silicon wafer that is provided as the base wafer, a Ge seed layer, a buffer layer, a sub-collector layer, a collector layer, a base layer, an emitter layer, and a sub-emitter layer. While the device forming thin films 3108 were being formed, the flow rate of arsine was reduced to zero after the emitter layers were grown and before the sub-emitter layers were grown and annealing was performed under a hydrogen gas atmosphere at the temperature of 670° C. for a duration of 3 minutes.

As shown in FIG. 78, the emitter electrodes 3112 were formed in the device forming thin films 3108 and used as masks to form emitter mesas in the device forming thin films 3108. In the step of forming the emitter mesas, the device forming thin films 3108 were etched to such a depth that the base layers were exposed. After this, collector mesas were formed in the region in which the collector electrodes 3116 were to be formed. In the step of forming the collector mesas, the device forming thin films 3108 were etched to such a depth that the sub-collector layers were exposed. Furthermore, the peripheral portions of the device forming thin films 3108 were etched to forming isolation mesas.

Figure 79:
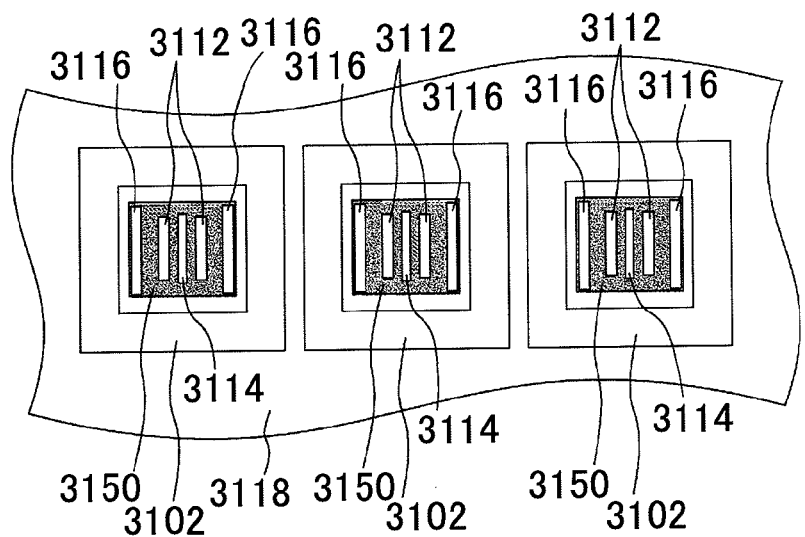
FIG. 79 is a plan view illustrating one of the steps of the manufacturing process of the HBT 3100.

As shown in FIG. 79, a silicon dioxide film was deposited on the entire plane to form the field insulating film 3118. In the field insulating film 3118, connection holes were bored to expose the base layers, so that the base electrodes 3114 were formed. Furthermore, connection holes were bored in the field insulating film 3118 to expose the sub-collector layers, so that the collector electrodes 3116 were formed. The emitter electrodes 3112, the base electrodes 3114, and the collector electrodes 3116 were constituted by multilayer films made of nickel (Ni) and gold (Au). The emitter electrodes 3112, the base electrodes 3114, and the collector electrodes 3116 were formed by the lift-off method. In the above-described manner, the HBT elements 3150 were formed.

Figure 80:
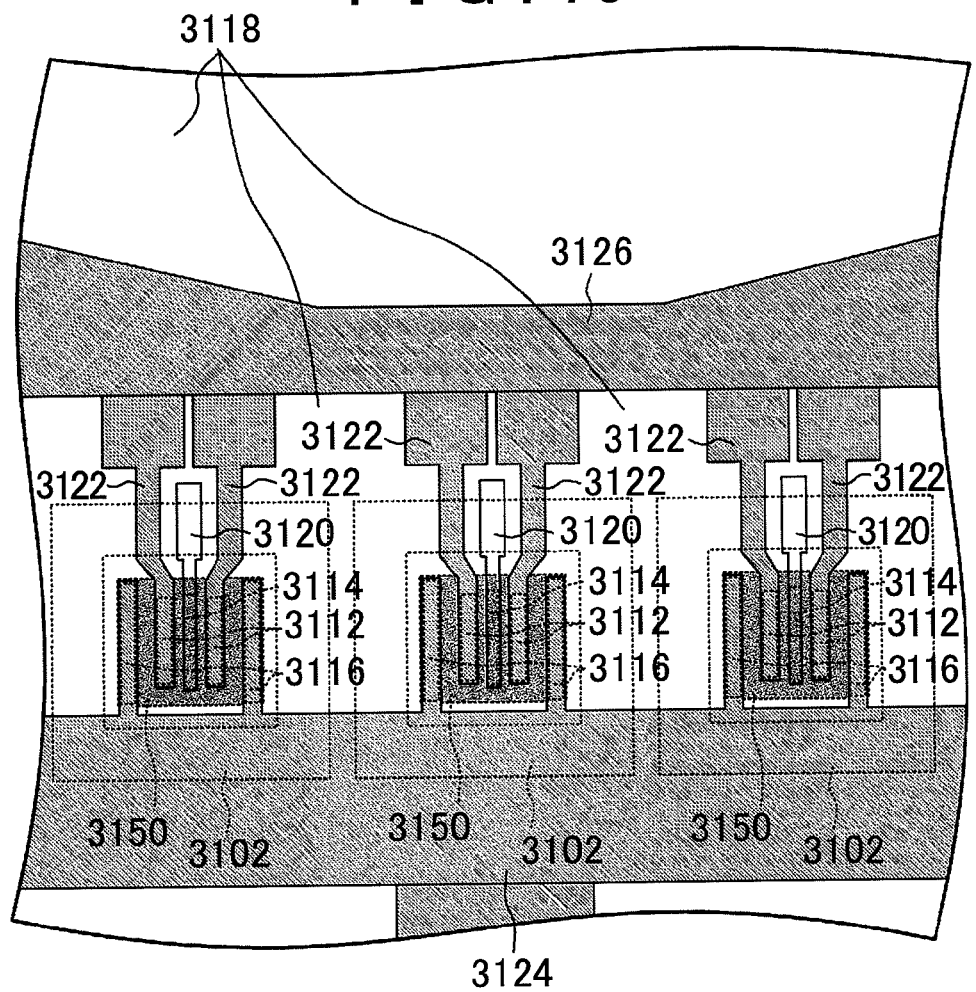
FIG. 80 is a plan view illustrating one of the steps of the manufacturing process of the HBT 3100.

As shown in FIG. 80, the emitter extension interconnections 3122 connected to the emitter electrodes 3112, the emitter interconnection 3126 connected to the emitter extension interconnections 3122, the base extension interconnections 3120 connected to the base electrodes 3114, and the collector interconnection 3124 connected to the collector electrodes 3116 were formed. The emitter extension interconnection 3122, the emitter interconnection 3126, the base extension interconnections 3120, and the collector interconnection 3124 were made of aluminum. Furthermore, a polyimide film was formed as an inter-layer insulating layer on the entire plane so as to cover the emitter extension interconnections 3122, the emitter interconnection 3126, the base extension interconnections 3120, and the collector interconnection 3124. On the inter-layer insulating layer, the base interconnections 3128 were formed so as to be connected to the base extension interconnections 3120 via the connection holes. In the above-described manner, the HBT 3100 shown in FIG. 74 was formed.

Figure 81:
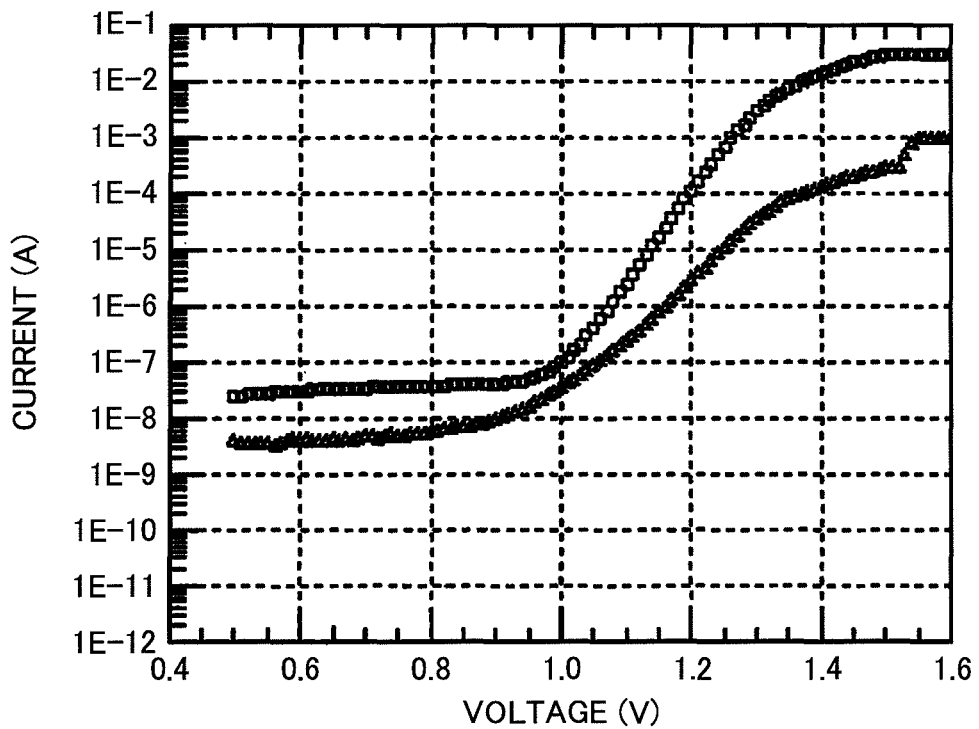
FIG. 81 is a graph showing the data obtained by measuring the various characteristics of the manufactured HBT 3100.
Figure 82:
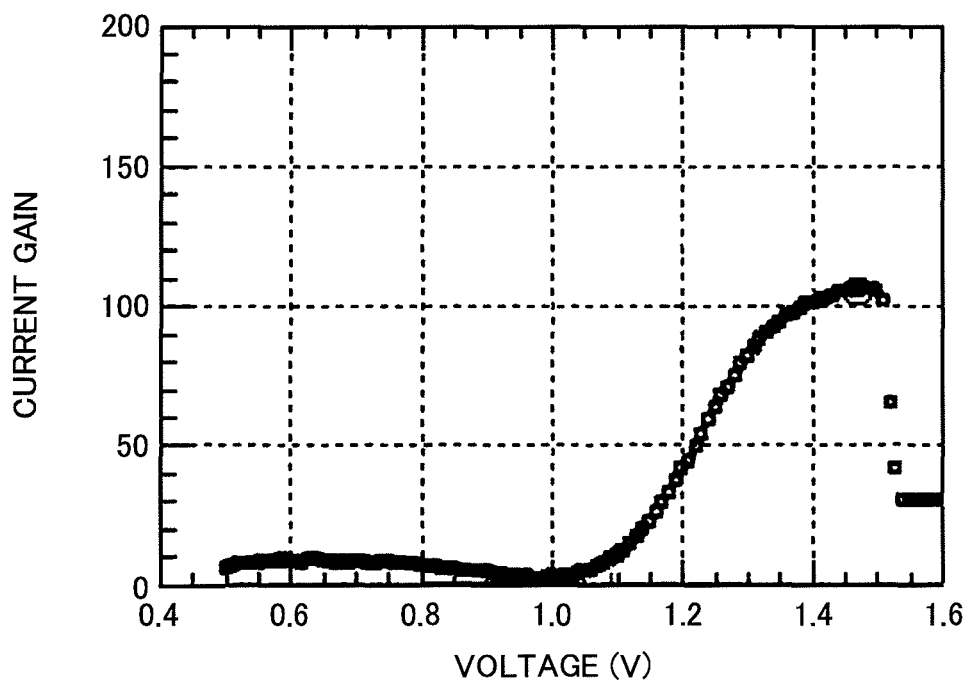
FIG. 82 is a graph showing the data obtained by measuring the various characteristics of the manufactured HBT 3100.

FIGS. 81 to 85 are graphs showing the data obtained by measuring the various characteristics of the manufactured HBT 3100. FIG. 81 shows how the collector current and the base current vary depending on the base-emitter voltage. The square marks show the collector current, and the triangular marks show the base current. FIG. 82 shows how the current gain varies depending on the base-emitter voltage. The current gain started increasing when the base-emitter voltage reached approximately 1.15 V, and took the maximum value of 106 when the base-emitter voltage reached 1.47 V. FIG. 83 shows how the collector current varies depending on the collector voltage. FIG. 83 shows four different data sequences obtained by setting the base voltage at various values. FIG. 83 indicates that the collector current remained stable within a broad range of the collector voltage. FIG. 84 shows experimental data used to calculate such a cutoff frequency that the current gain takes a value of 1. When the base-emitter voltage was 1.5 V, the cutoff frequency took a value of 15 GHz. FIG. 85 shows experimental data used to calculate such a maximum oscillation frequency that the current gain takes a value of 1. When the base-emitter voltage was 1.45 V, the maximum oscillation frequency took a value of 9 GHz.

Figure 86:
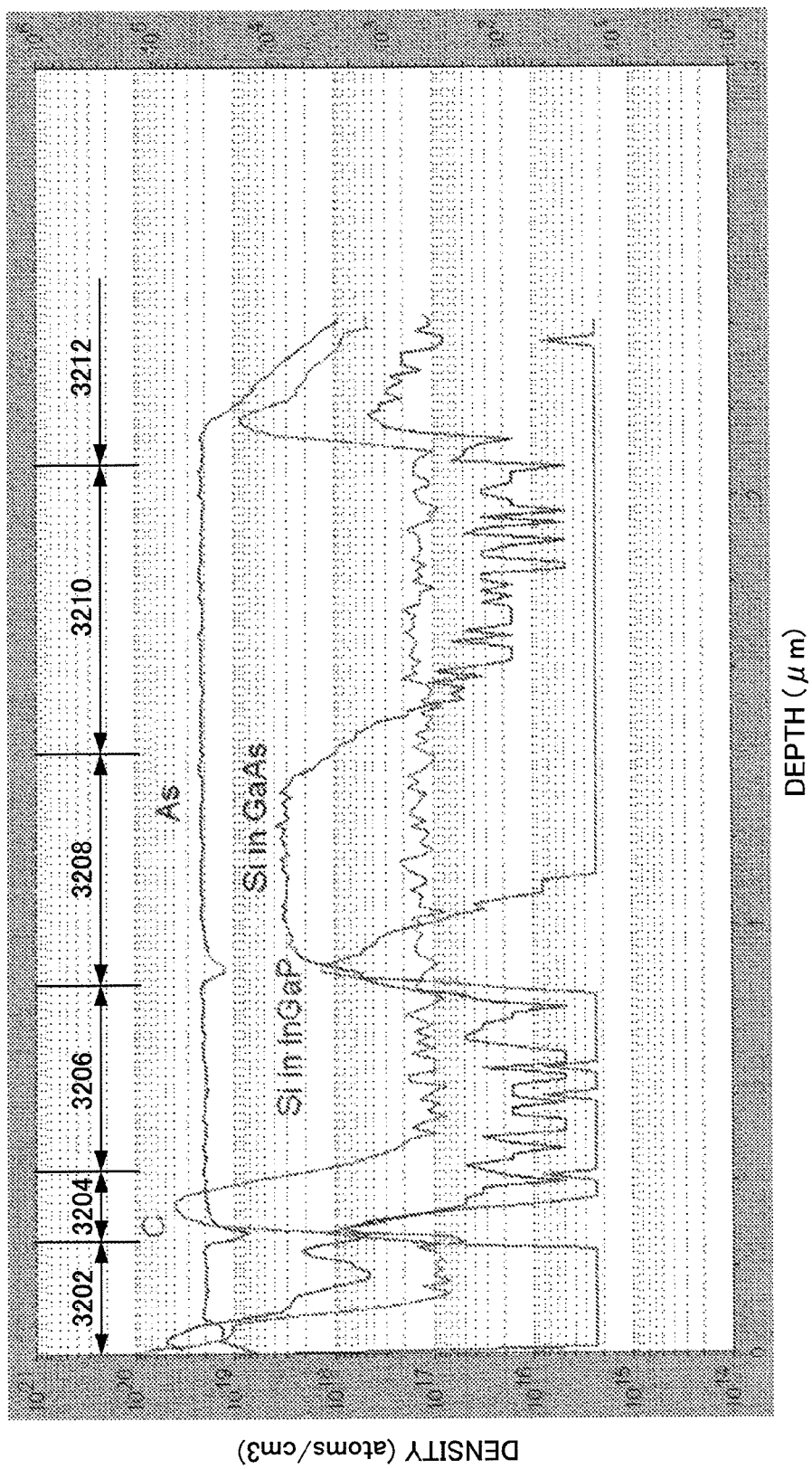
FIG. 86 shows the data obtained by measuring the depth profile based on secondary ion mass spectroscopy.

FIG. 86 shows the data obtained by measuring the depth profile based on secondary ion mass spectroscopy in the step of forming the device forming thin films 3108. The As atom concentration, the C atom concentration, the Si atom concentration within InGaAs, and the Si atom concentration within GaAs are shown in association with the depth. A range 3202 corresponds to GaAs and InGaP forming the sub-emitter layer and the emitter layer. A range 3204 corresponds to p⁻GaAs forming the base layer. A range 3206 corresponds to n⁻GaAs forming the collector layer. A range 3208 corresponds to n⁺GaAs forming the sub-collector layer and InGaP forming the etch stop layer. A range 3210 corresponds to GaAs and AlGaAs forming the buffer layer. A range 3212 corresponds to Ge forming the seed layer.

FIG. 87 is a TEM photograph showing the cross-section of a HBT concurrently manufactured with the HBT 3100. A Ge layer 3222, a buffer layer 3224, a sub-collector layer 3226, a collector layer 3228, a base layer 3230, a sub-emitter layer, and an emitter layer 3232 are sequentially formed on silicon 3220. A collector electrode 3234 is formed in contact with the sub-collector layer 3226, a base electrode 3236 is formed in contact with the base layer 3230, and an emitter electrode 3238 is formed in contact with the emitter layer 3232.

FIG. 88 is a TEM photograph provided for the comparison purposes, and shows an HBT manufactured by forming a device forming thin film on a plain wafer without an inhibition layer. A large number of crystal defects are present in a region 3240, and those defects reach the emitter-base-collector region, which constitutes the active region of the HBT. On the other hand, very few crystal defects are present in the HBT shown in FIG. 87. The HBT shown in FIG. 87 achieved a maximum current gain of 123, but the HBT shown in FIG. 88 only realized a maximum current gain of 30.

In the above description, a MISFET (metal-insulator-semiconductor filed-effect transistor) is taken as an example of the electronic device. The electronic device, however, is not limited to a MISFET, but also can be a MOSFET, HEMT (High Electron Mobility Transistor), or a pseudomorphic-HEMT, for example. Furthermore, the electronic device 100 can be, for example, a MESFET (Metal-Semiconductor Field Effect Transistor) or the like.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

The specification may describe that the respective components are sequentially stacked "on" each other or in the upward direction. However, the stacking direction of the electronic device 100 and the like is not limited to the direction from the downside to the upside that are defined in terms of the orientation of the electronic device 100 and the like during their actually usage. As used herein, when a first component is "formed on" a second component, the first component is formed on the second component in terms of the stacking direction. Furthermore, when a first component is "formed on" a second component, the first component may be in contact with the second component, or alternatively, the first component may be formed on the second component with one or more intervening layers formed therebetween.

DESCRIPTION OF REFERENCE NUMERALS 10 semiconductor wafer, 11 main plane, 12 base wafer, 13 insulating layer, 14 Si crystal layer, 15 inhibition layer, 16 seed crystal, 17 opening, 20 semiconductor wafer, 28 compound semiconductor, 100 electronic device, 102 SOI wafer, 104 inhibition layer, 105 opening, 106 Ge crystal layer, 108 seed compound semiconductor crystal, 110 first compound semiconductor crystal, 112 second compound semiconductor crystal, 114 gate insulator, 116 gate electrode, 118 source/drain electrode, 120 defect trap, 130 defect trap, 162 Si wafer, 164 insulating layer, 166 Si crystal layer, 172 main plane, 200 electronic device, 300 electronic device, 400 electronic device, 402 buffer layer, 500 electronic device, 502 source/drain electrode, 600 electronic device, 602 source/drain electrode, 700 electronic device, 702 lower gate insulator, 704 lower gate electrode, 801 semiconductor wafer, 802 SOI wafer, 803 region, 804 inhibition layer, 806 opening, 808 collector electrode, 810 emitter electrode, 812 base electrode, 820 Ge crystal layer, 822 buffer layer, 824 compound semiconductor functional layer, 862 Si wafer, 864 insulating layer, 866 Si crystal layer, 872 main plane, 880 MISFET, 882 well, 888 gate electrode, 2102 Si wafer, 2104 inhibition layer, 2106 Ge crystal layer, 2108 compound semiconductor, 2202 Si wafer, 2204 SiO$_2$ film, 2206 Ge crystal, 2208 GaAs crystal, 3000 semiconductor device forming wafer, 3002 inhibition layer, 3004 device forming thin film, 3006 sacrificial growth portion, 3100 HBT, 3102 inhibition layer, 3108 device forming thin film, 3110 sacrificial growth portion, 3112 emitter electrode, 3114 base electrode, 3116 collector electrode, 3118 field insulating film, 3120 interconnection, 3122 interconnection, 3124 collector interconnection, 3126 emitter interconnection, 3128 base interconnection, 3130 collector pad, 3132 emitter pad, 3134 base pad, 3150 HBT element, 3202 range, 3204 range, 3206 range, 3208 range, 3210 range, 3212 range, 3220 silicon 3224 buffer layer, 3226 sub-collector layer, 3230 base layer, 3232 emitter layer, 3234 collector electrode, 3236 base electrode, 3238 emitter electrode

The invention claimed is:

1. A semiconductor wafer having a base wafer, an insulating layer, and a Si crystal layer in the stated order, the semiconductor wafer comprising
an inhibition layer disposed on the Si crystal layer, the inhibition layer having an opening penetrating therethrough to reach the Si crystal layer and inhibiting crystal growth of a compound semiconductor;
a seed crystal disposed within the opening;
a compound semiconductor that has a lattice match or a pseudo lattice match with the seed crystal; and
a Si semiconductor device that is provided on a portion of the Si crystal layer, the portion being not covered by the seed crystal.

2. A semiconductor wafer having a base wafer, an insulating layer, and a Si crystal layer in the stated order, the semiconductor wafer comprising
an inhibition layer disposed on the Si crystal layer, the inhibition layer having an opening penetrating therethrough to reach the Si crystal layer and inhibiting crystal growth of a compound semiconductor;
a seed crystal disposed within the opening; and
a compound semiconductor that has a lattice match or a pseudo lattice match with the seed crystal; and wherein
the base wafer is made of single crystal Si, and
the semiconductor wafer further comprises a Si semiconductor device that is provided on a portion of the base wafer, the portion being not covered by the seed crystal.

3. A semiconductor wafer s having a base wafer, an insulating layer, and a Si crystal layer in the stated order, the semiconductor wafer comprising
an inhibition layer disposed on the Si crystal layer, the inhibition layer having an opening penetrating therethrough to reach the Si crystal layer and inhibiting crystal growth of a compound semiconductor;
a seed crystal disposed within the opening;
a compound semiconductor that has a lattice match or a pseudo lattice match with the seed crystal; wherein
the base wafer has a main plane that has an off angle with respect to the (100) plane or a plane crystallographically equivalent to the (100) plane,
the opening has a bottom shaped like a rectangle, and
one of the sides of the rectangle is substantially parallel to any one of the <010> direction, the <0-10> direction, the <001> direction, and the <00-1> direction of the base wafer.

4. The semiconductor wafer as set forth in claim 3, wherein the off angle is no less than 2° and no more than 6°.

5. A semiconductor wafer having a base wafer, an insulating layer, and a Si crystal layer in the stated order, the semiconductor wafer comprising
an inhibition layer disposed on the Si crystal layer, the inhibition layer having an opening penetrating therethrough to reach the Si crystal layer and inhibiting crystal growth of a compound semiconductor;
a seed crystal disposed within the opening; and
a compound semiconductor that has a lattice match or a pseudo lattice match with the seed crystal; wherein
the base wafer has a main plane that has an off angle with respect to the (111) plane or a plane crystallographically equivalent to the (111) plane,
the opening has a bottom shaped like a hexagon, and
one of the sides of the hexagon is substantially parallel to any one of the <1-10> direction, the <-110> direction, the <0-11> direction, the <01-1> direction, the <10$^{-1}$> direction, and the <-101> direction of the base wafer.

6. The semiconductor wafer as set forth in claim 5, wherein the off angle is no less than 2° and no more than 6°.

* * * * *